United States Patent
Yamazaki et al.

(10) Patent No.: US 11,031,506 B2
(45) Date of Patent: Jun. 8, 2021

(54) SEMICONDUCTOR DEVICE INCLUDING TRANSISTOR USING OXIDE SEMICONDUCTOR

(71) Applicant: SEMICONDUCTOR ENERGY LABORATORY CO., LTD., Atsugi (JP)

(72) Inventors: Shunpei Yamazaki, Tokyo (JP); Toshikazu Ohno, Kanagawa (JP); Daisuke Yamaguchi, Kanagawa (JP); Tomonori Nakayama, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 1 day.

(21) Appl. No.: 16/553,287

(22) Filed: Aug. 28, 2019

(65) Prior Publication Data
US 2020/0075769 A1    Mar. 5, 2020

(30) Foreign Application Priority Data

Aug. 31, 2018  (JP) .............................. JP2018-163324
Sep. 20, 2018  (JP) .............................. JP2018-176181

(51) Int. Cl.
*H01L 29/786* (2006.01)
*H01L 21/02* (2006.01)
(Continued)

(52) U.S. Cl.
CPC ...... *H01L 29/7869* (2013.01); *H01L 21/0214* (2013.01); *H01L 21/0228* (2013.01); *H01L 21/02164* (2013.01); *H01L 21/02175* (2013.01); *H01L 27/156* (2013.01); *H01L 29/66742* (2013.01)

(58) Field of Classification Search
CPC ....... H01L 21/02; H01L 29/786; H01L 29/66; H01L 27/15
See application file for complete search history.

(56) References Cited

U.S. PATENT DOCUMENTS 5,821,159 A    10/1998   Ukita
6,107,668 A     8/2000   Ukita
(Continued)

FOREIGN PATENT DOCUMENTS

JP     2011-249691 A    12/2011

OTHER PUBLICATIONS

Yamazaki.S et al., "Research, Development, and Application of Crystalline Oxide Semiconductor", SID Digest '12 : SID International Symposium Digest of Technical Papers, Jun. 5, 2012, vol. 43, No. 1, pp. 183-186.

(Continued)

*Primary Examiner* — Sheng-Bai Zhu
(74) *Attorney, Agent, or Firm* — Fish & Richardson P.C.

(57) ABSTRACT

A highly reliable semiconductor device is provided. The semiconductor device includes a first oxide; a second oxide, a first layer, and a second layer over the first oxide; an insulator over the second oxide; a first conductor over the insulator; a second conductor over the first layer; and a third conductor over the second layer. Each of the first and second layers includes a region with a thickness ranging from 0.5 nm to 3 nm. Each of the second and third conductors contains a conductive material having the physical property of extracting hydrogen.

5 Claims, 20 Drawing Sheets

(51) Int. Cl.
*H01L 27/15* (2006.01)
*H01L 29/66* (2006.01)

(56) References Cited

U.S. PATENT DOCUMENTS

| | | | |
|---|---|---|---|
| 8,049,208 | B2 | 11/2011 | Imahayashi et al. |
| 8,183,099 | B2 | 5/2012 | Sakata |
| 8,441,010 | B2 | 5/2013 | Ichijo et al. |
| 8,643,010 | B2 | 2/2014 | Matsukizono |
| 8,687,416 | B2 | 4/2014 | Kurokawa |
| 8,692,252 | B2 | 4/2014 | Takata et al. |
| 8,803,149 | B2 | 8/2014 | Sakata |
| 8,841,661 | B2 | 9/2014 | Akimoto et al. |
| 8,878,173 | B2 | 11/2014 | Yamazaki |
| 8,981,375 | B2 | 3/2015 | Ushikura et al. |
| 9,093,136 | B2 | 7/2015 | Kurokawa |
| 9,214,496 | B2 | 12/2015 | Ushikura et al. |
| 9,449,991 | B2 | 9/2016 | Yamazaki |
| 9,601,601 | B2 | 3/2017 | Sakata |
| 9,966,474 | B2 | 5/2018 | Yamazaki |
| 2006/0022270 | A1* | 2/2006 | Boyd ............... H01L 29/66772 257/351 |
| 2009/0140648 | A1 | 6/2009 | Tohyama et al. |
| 2010/0072474 | A1 | 3/2010 | Abe et al. |
| 2010/0224878 | A1 | 9/2010 | Kimura |
| 2010/0314618 | A1 | 12/2010 | Tanaka et al. |
| 2011/0079777 | A1 | 4/2011 | Akimoto |
| 2011/0114914 | A1 | 5/2011 | Numata et al. |
| 2012/0001168 | A1 | 1/2012 | Ichijo et al. |
| 2012/0058598 | A1 | 3/2012 | Yamazaki |
| 2013/0087833 | A1* | 4/2013 | Wang ................ H01L 29/66522 257/192 |
| 2013/0140554 | A1 | 6/2013 | Yamazaki et al. |
| 2013/0161605 | A1 | 6/2013 | Sasagawa et al. |
| 2013/0161621 | A1 | 6/2013 | Isobe et al. |
| 2013/0187151 | A1 | 7/2013 | Yamazaki |
| 2013/0187161 | A1 | 7/2013 | Yamazaki |
| 2014/0084287 | A1 | 3/2014 | Yamazaki |
| 2014/0103346 | A1 | 4/2014 | Yamazaki |
| 2014/0106504 | A1 | 4/2014 | Yamazaki et al. |
| 2014/0121787 | A1 | 5/2014 | Yamazaki et al. |
| 2014/0138675 | A1 | 5/2014 | Yamazaki |
| 2014/0339538 | A1 | 11/2014 | Yamazaki et al. |
| 2017/0005168 | A1* | 1/2017 | Doornbos ........... H01L 29/7827 |
| 2017/0155003 | A1* | 6/2017 | Tokunaga ......... H01L 21/02488 |
| 2017/0194465 | A1 | 7/2017 | Sakata |
| 2017/0294541 | A1* | 10/2017 | Yamazaki ............... C23C 14/08 |
| 2017/0309721 | A1 | 10/2017 | Yamazaki et al. |
| 2017/0323975 | A1 | 11/2017 | Yamazaki |
| 2018/0301559 | A1* | 10/2018 | Liaw ................ H01L 21/76831 |

OTHER PUBLICATIONS

Yamazaki.S et al., "Properties of crystalline In—Ga—Zn-oxide semiconductor and its transistor characteristics", Jpn. J. Appl. Phys. (Japanese Journal of Applied Physics), Mar. 31, 2014, vol. 53, No. 4S, pp. 04ED18-1-04ED18-10.

* cited by examiner

1471

1472

1473

1474

1475

1476

1477

1478

SEMICONDUCTOR DEVICE INCLUDING TRANSISTOR USING OXIDE SEMICONDUCTOR

BACKGROUND OF THE INVENTION

1. Field of the Invention

One embodiment of the present invention relates to a semiconductor device and a method for manufacturing the semiconductor device. Another embodiment of the present invention relates to a semiconductor wafer, a module, and an electronic device.

In this specification and the like, a semiconductor device generally means a device that can function by utilizing semiconductor characteristics. A semiconductor element such as a transistor, a semiconductor circuit, an arithmetic device, and a memory device are each an embodiment of a semiconductor device. A display device (e.g., a liquid crystal display device and a light-emitting display device), a projection device, a lighting device, an electro-optical device, a power storage device, a memory device, a semiconductor circuit, an imaging device, an electronic device, and the like are sometimes regarded as including a semiconductor device.

Note that one embodiment of the present invention is not limited to the above technical field. One embodiment of the invention disclosed in this specification and the like relates to an object, a method, or a manufacturing method. In addition, one embodiment of the present invention relates to a process, a machine, manufacture, or a composition of matter.

2. Description of the Related Art

A technique by which a transistor is formed using a semiconductor thin film formed over a substrate having an insulating surface has been attracting attention. The transistor is used in a wide range of electronic devices such as integrated circuits (ICs) and image display devices (also simply referred to as display devices). Silicon-based semiconductor materials are widely known as materials for semiconductor thin films that can be used in transistors. As other materials, oxide semiconductors have been attracting attention.

For oxide semiconductors, a c-axis-aligned crystalline (CAAC) structure and a nanocrystalline (nc) structure, which are neither a single crystal structure nor an amorphous structure, have been discovered (see Non-Patent Documents 1 and 2).

Non-Patent Documents 1 and 2 disclose a technique for forming a transistor with the use of an oxide semiconductor having the CAAC structure.

REFERENCE

Non-Patent Document

[Non-Patent Document 1] S. Yamazaki et al., SID Symposium Digest of Technical Papers, 2012, Volume 43, Issue 1, pp. 183-186.

[Non-Patent Document 2] S. Yamazaki et al., Japanese Journal of Applied Physics, 2014, Volume 53, Number 4S, pp. 04ED18-1-04ED18-10.

SUMMARY OF THE INVENTION

An object of one embodiment of the present invention is to provide a highly reliable semiconductor device. Another object of one embodiment of the present invention is to provide a semiconductor device with favorable electrical characteristics. Another object of one embodiment of the present invention is to provide a semiconductor device with a high on-state current. Another object of one embodiment of the present invention is to provide a miniaturized or highly integrated semiconductor device. Another object of one embodiment of the present invention is to provide a semiconductor device with low power consumption.

Note that the description of these objects does not preclude the existence of other objects. One embodiment of the present invention does not have to achieve all the objects. Other objects will be apparent from and can be derived from the description of the specification, the drawings, the claims, and the like.

One embodiment of the present invention is a semiconductor device including a first oxide; a second oxide, a first layer, and a second layer over the first oxide; an insulator over the second oxide; a first conductor over the insulator; a second conductor over the first layer; and a third conductor over the second layer. Each of the first layer and the second layer includes a region with a thickness greater than or equal to 0.5 nm and less than or equal to 3 nm. Each of the second conductor and the third conductor contains a conductive material capable of extracting hydrogen.

Preferably, in the above semiconductor device, the first oxide contains indium, an element M (M is aluminum, gallium, yttrium, or tin), and zinc; each of the second conductor and the third conductor contains tantalum and nitrogen; and each of the first layer and the second layer contains tantalum and oxygen.

It is preferred that the above semiconductor device further include a third layer and a fourth layer; each of the third layer and the fourth layer include a region with a thickness greater than or equal to 0.5 nm and less than or equal to 3 nm; and the second oxide include a first region facing a side surface of the second conductor with the third layer positioned therebetween, and a second region facing a side surface of the third conductor with the fourth layer positioned therebetween.

Preferably, in the above semiconductor device, the first oxide contains indium, an element M (M is aluminum, gallium, yttrium, or tin), and zinc; each of the second conductor and the third conductor contains tantalum and nitrogen; and each of the first to fourth layers comprises tantalum and oxygen.

Another embodiment of the present invention is a semiconductor device including a first oxide; a second oxide, a third oxide, and a fourth oxide over the first oxide; an insulator over the second oxide; a first conductor over the insulator; a second conductor over the third oxide; and a third conductor over the fourth oxide. Each of the second conductor and the third conductor contains a conductive material resistant to oxidation and capable of extracting hydrogen.

In the above semiconductor device, it is preferred that each of the first oxide, the third oxide, and the fourth oxide contain indium, an element M (M is aluminum, gallium, yttrium, or tin), and zinc; the atomic ratio of the element M to indium in the third oxide be higher than that in the first oxide; the atomic ratio of the element M to indium in the fourth oxide be higher than that in the first oxide; and each of the third oxide and the fourth oxide include a region with a thickness greater than or equal to 1 nm and less than or equal to 2 nm.

In the above semiconductor device, each of the second conductor and the third conductor preferably contains tantalum and nitrogen.

One embodiment of the present invention can provide a highly reliable semiconductor device. One embodiment of the present invention can provide a semiconductor device with favorable electrical characteristics. One embodiment of the present invention can provide a semiconductor device with a high on-state current. One embodiment of the present invention can provide a miniaturized or highly integrated semiconductor device. One embodiment of the present invention can provide a semiconductor device with low power consumption.

Note that the description of these effects does not preclude the existence of other effects. One embodiment of the present invention does not necessarily achieve all the effects. Other effects will be apparent from and can be derived from the description of the specification, the drawings, the claims, and the like.

DETAILED DESCRIPTION OF THE INVENTION

Figure 1A:
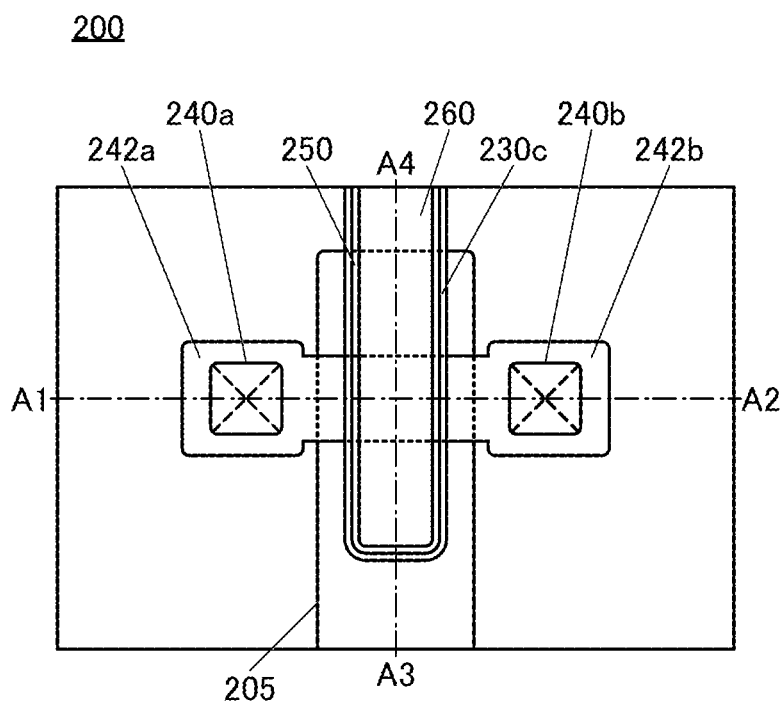
FIG. 1A is a top view of a semiconductor device of one embodiment of the present invention.

Embodiments will be hereinafter described with reference to the drawings. Note that the embodiments can be implemented with various modes, and it will be readily appreciated by those skilled in the art that modes and details can be changed in various ways without departing from the spirit and scope of the present invention. Thus, the present invention should not be interpreted as being limited to the following description of the embodiments.

In the drawings, the size, the layer thickness, or the region is sometimes exaggerated for clarity. Therefore, the size, the layer thickness, or the region is not limited to the illustrated scale. Note that the drawings are schematic views showing ideal examples, and embodiments of the present invention are not limited to shapes or values shown in the drawings. For example, in the actual manufacturing process, a layer, a resist mask, or the like might be unintentionally reduced in size by treatment such as etching, which is not illustrated in some cases for easy understanding. In the drawings, the same portions or portions having similar functions are denoted by the same reference numerals in different drawings, and explanation thereof will not be repeated in some cases. The same hatching pattern is applied to portions having similar functions, and the portions are not denoted by specific reference numerals in some cases.

Especially in a top view (also referred to as a plan view), a perspective view, or the like, some components might not be illustrated for easy understanding of the invention. In addition, some hidden lines and the like might not be shown.

The ordinal numbers such as "first" and "second" in this specification and the like are used for convenience and do not denote the order of steps or the stacking order of layers. Therefore, for example, description can be made even when "first" is replaced with "second", "third", or the like as appropriate. In addition, the ordinal numbers in this specification and the like are not necessarily the same as those used to specify one embodiment of the present invention.

In this specification and the like, terms for describing arrangement, such as "over", "above", "under", and "below", are used for convenience to describe a positional relation between components with reference to drawings. Furthermore, the positional relation between components is changed as appropriate in accordance with the direction in which each component is described. Thus, the positional relation is not limited to that described with a term used in this specification and can be explained with other terms as appropriate depending on the situation.

For example, when this specification and the like explicitly state that X and Y are connected, the case where X and Y are electrically connected, the case where X and Y are functionally connected, and the case where X and Y are directly connected are regarded as being disclosed in this specification and the like. Accordingly, without limitation to a predetermined connection relation, for example, a connection relation shown in drawings or text, another connection relation is regarded as being disclosed in the drawings or the text. Here, X and Y each denote an object (e.g., a device, an element, a circuit, a wiring, an electrode, a terminal, a conductive film, or a layer).

In this specification and the like, a transistor is an element having at least three terminals of a gate, a drain, and a source. The transistor includes a region where a channel is formed (hereinafter also referred to as a channel formation region) between the drain (a drain terminal, a drain region, or a drain electrode) and the source (a source terminal, a source region, or a source electrode), and current can flow between the source and the drain through the channel formation region. Note that in this specification and the like, a channel formation region refers to a region through which current mainly flows.

Furthermore, functions of a source and a drain might be switched when a transistor of opposite polarity is employed or when a direction of current flow is changed in circuit operation, for example. Therefore, the terms "source" and "drain" can be interchanged in some cases in this specification and the like.

Note that the channel length refers to, for example, a distance between a source (source region or source electrode) and a drain (drain region or drain electrode) in a region where a semiconductor (or a portion where a current flows in a semiconductor when a transistor is on) and a gate electrode overlap each other or in a channel formation region in a top view of the transistor. In one transistor, channel lengths in all regions are not necessarily the same. In other words, the channel length of one transistor is not fixed to one value in some cases. Therefore, in this specification, the channel length is any one of values, the maximum values, the minimum value, or the average value in a channel formation region.

The channel width refers to, for example, the length of a channel formation region perpendicular to a channel length direction in a region where a semiconductor (or a portion where a current flows in a semiconductor when a transistor is on) and a gate electrode overlap each other or in the channel formation region in a top view of the transistor. In one transistor, channel widths in all regions are not necessarily the same. In other words, the channel width of one transistor is not fixed to one value in some cases. Therefore, in this specification, the channel width is any one of values, the maximum value, the minimum value, or the average value in a channel formation region.

Note that in this specification and the like, depending on the transistor structure, a channel width in a region where a channel is actually formed (hereinafter also referred to as an effective channel width) is different from a channel width shown in a top view of a transistor (hereinafter also referred to as an apparent channel width) in some cases. For example, in a transistor having a gate electrode covering the side surface of a semiconductor, the effective channel width is larger than the apparent channel width, and its influence cannot be ignored in some cases. As another example, in a miniaturized transistor having a gate electrode covering the side surface of a semiconductor, the proportion of a channel formation region formed on the side surface of the semiconductor is sometimes increased. In that case, the effective channel width is larger than the apparent channel width.

In such cases, an effective channel width is sometimes difficult to estimate by measuring. For example, to estimate an effective channel width from a design value, it is necessary to assume that the shape of a semiconductor is known. Accordingly, in the case where the shape of a semiconductor is not known exactly, it is difficult to measure an effective channel width accurately.

In this specification, the simple term "channel width" denotes an apparent channel width in some cases. In other cases, the simple term "channel width" denotes an effective channel width. Note that the values of a channel length, a channel width, an effective channel width, an apparent channel width, and the like can be determined by analyzing a cross-sectional TEM image and the like.

Note that an impurity in a semiconductor refers to, for example, elements other than the main components of the semiconductor. For example, an element with a concentration lower than 0.1 atomic % is regarded as an impurity. When a semiconductor contains an impurity, the increase in density of defect states or the reduction in crystallinity of the semiconductor may occur, for example. In the case where the semiconductor is an oxide semiconductor, examples of an impurity that changes the characteristics of the semiconductor include Group 1 elements, Group 2 elements, Group 13 elements, Group 14 elements, Group 15 elements, and transition metals other than the main components of the oxide semiconductor. Specific examples include hydrogen, lithium, sodium, silicon, boron, phosphorus, carbon, and nitrogen. Note that water also serves as an impurity in some cases. Entry of an impurity may cause oxygen vacancies in an oxide semiconductor, for example.

In this specification and the like, silicon oxynitride refers to a substance that contains more oxygen than nitrogen, and silicon nitride oxide refers to a substance that contains more nitrogen than oxygen.

In this specification and the like, the term "insulator" can be replaced with an insulating film or an insulating layer. The term "conductor" can be replaced with a conductive film or a conductive layer. The term "semiconductor" can be replaced with a semiconductor film or a semiconductor layer.

In this specification and the like, the term "parallel" indicates that the angle formed between two straight lines is greater than or equal to −10° and less than or equal to 10°. Thus, the case where the angle is greater than or equal to −5° and less than or equal to 5° is also included. The term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°. Thus, the case where the angle is greater than or equal to 85° and less than or equal to 95° is also included. The term "substantially perpendicular" indicates that the angle formed between two straight lines is greater than or equal to 60° and less than or equal to 120°.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in a semiconductor layer of a transistor is referred to as an oxide semiconductor in some cases. That is, an OS transistor is a transistor including a metal oxide or an oxide semiconductor.

In this specification and the like, the term "normally off" means that the drain current per micrometer of channel width that flows through a transistor when no potential or a ground potential is supplied to its gate is lower than or equal to $1\times10^{-20}$ A at room temperature, lower than or equal to $1\times10^{-18}$ A at 85° C., or lower than or equal to $1\times10^{-16}$ A at 125° C.

Embodiment 1

In this embodiment, an example of a semiconductor device including a transistor 200 of one embodiment of the present invention will be described.

<Structure Example of Semiconductor Device>

Figure 1C:
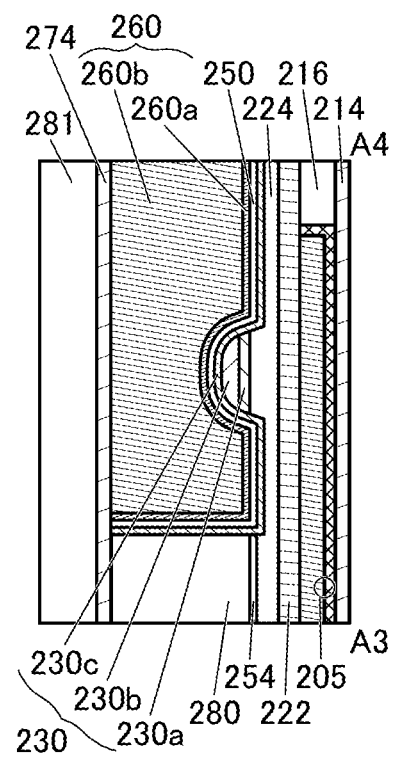
FIGS. 1B and 1C are cross-sectional views of the semiconductor device of one embodiment of the present invention.
Figure 1B:
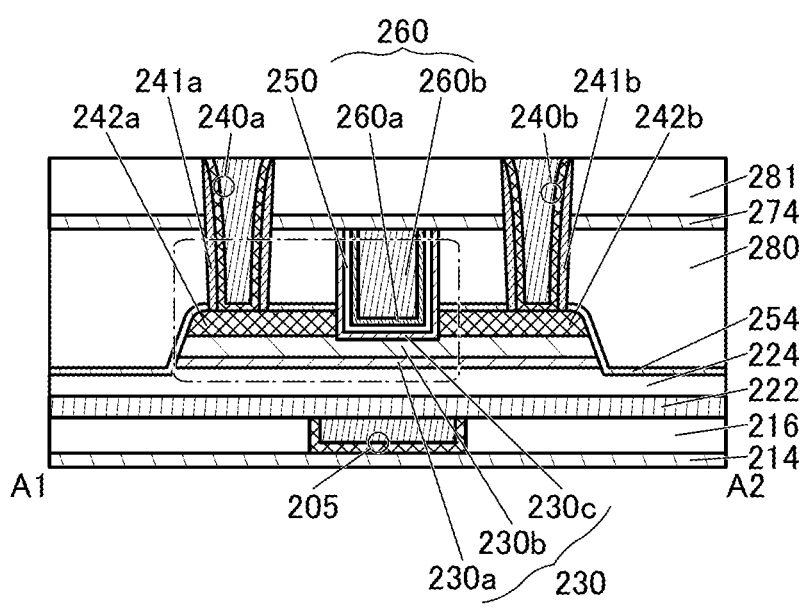

FIGS. 1A to 1C are a top view and cross-sectional views of a semiconductor device including the transistor 200 of one embodiment of the present invention. FIG. 1A is a top view of the semiconductor device. FIGS. 1B and 1C are cross-sectional views of the semiconductor device. FIG. 1B is a cross-sectional view taken along the dashed-dotted line A1-A2 in FIG. 1A and shows a cross section of the transistor 200 in the channel length direction. FIG. 1C is a cross-sectional view taken along the dashed-dotted line A3-A4 in FIG. 1A and shows a cross section of the transistor 200 in the channel width direction. Note that for simplification, some components are not illustrated in the top view in FIG. 1A.

The semiconductor device of one embodiment of the present invention includes the transistor 200 and insulators 214, 216, 280, 274, and 281 that serve as interlayer films.

The semiconductor device also includes a conductor 240 (a conductor 240a and a conductor 240b) that is electrically connected to the transistor 200 and functions as a plug. An insulator 241 (an insulator 241a and an insulator 241b) is provided in contact with a side surface of the conductor 240 functioning as a plug.

[Transistor 200]

As illustrated in FIGS. 1A to 1C, the transistor 200 includes a conductor 205 placed over a substrate (not shown) to be embedded in the insulator 216; an insulator 222 over the insulator 216 and the conductor 205; an insulator 224 over the insulator 222; an oxide 230 (an oxide 230a, an oxide 230b, and an oxide 230c) over the insulator 224; an insulator 250 over the oxide 230c; a conductor 260 (a conductor 260a and a conductor 260b) over the insulator 250; a conductor 242a and a conductor 242b in contact with part of a top surface of the oxide 230b; and an insulator 254 in contact with part of a top surface of the insulator 224, a side surface of the oxide 230a, a side surface of the oxide 230b, a side surface and a top surface of the conductor 242a, and a side surface and a top surface of the conductor 242b.

The oxide 230 preferably includes the oxide 230a over the insulator 224, the oxide 230b over the oxide 230a, and the oxide 230c that is over the oxide 230b and is at least partly in contact with the top surface of the oxide 230b. When the oxide 230a is provided below the oxide 230b, it is possible to inhibit diffusion of impurities into the oxide 230b from the components formed below the oxide 230a. When the oxide 230c is provided over the oxide 230b, it is possible to inhibit diffusion of impurities into the oxide 230b from the components formed above the oxide 230c.

Although the transistor 200 includes the oxide 230 with a three-layer structure in which the oxide 230a, the oxide 230b, and the oxide 230c are stacked, the present invention is not limited thereto. For example, the oxide 230 may be a single layer of the oxide 230b or has a two-layer structure of the oxide 230a and the oxide 230b, a two-layer structure of the oxide 230b and the oxide 230c, or a stacked-layer structure including four or more layers. Alternatively, each of the oxides 230a, 230b, and 230c may have a stacked-layer structure.

A conductor 242 (the conductor 242a and the conductor 242b) is provided over the oxide 230b. The thickness of the conductor 242 ranges, for example, from 1 nm to 50 nm, preferably from 2 nm to 25 nm.

The conductor 260 functions as a first gate (also referred to as top gate) electrode of the transistor 200, and the conductors 242a and 242b function as a source electrode and a drain electrode of the transistor 200.

Figure 2A:
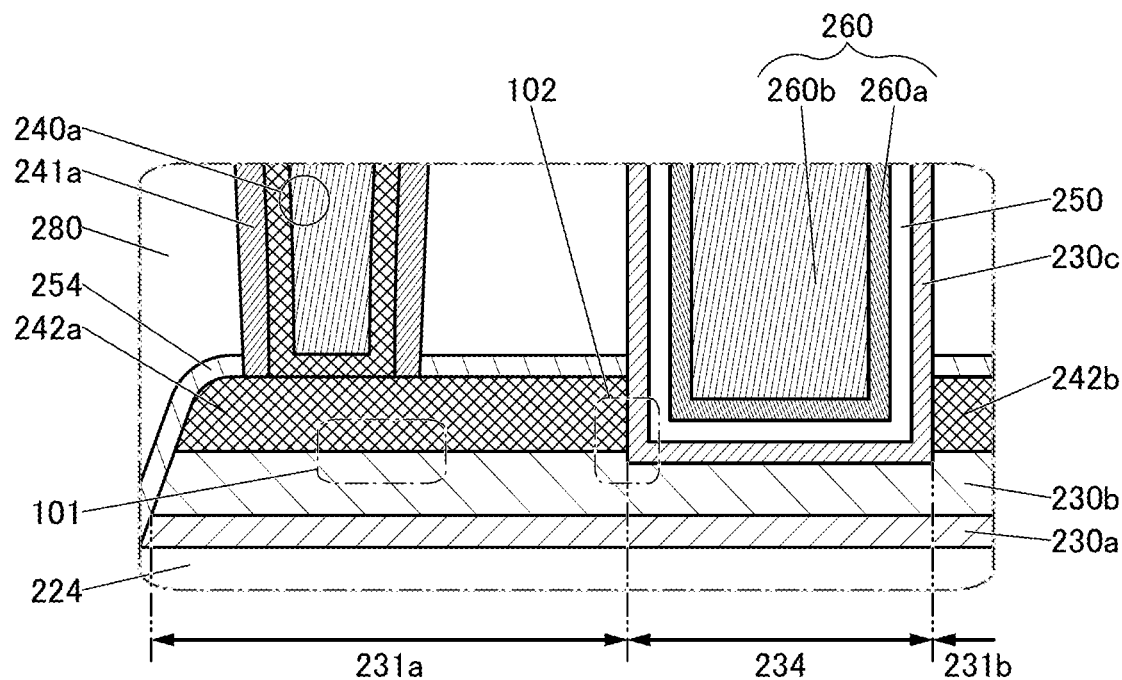
FIGS. 2A and 2B are cross-sectional views of a semiconductor device of one embodiment of the present invention.
Figure 2B:
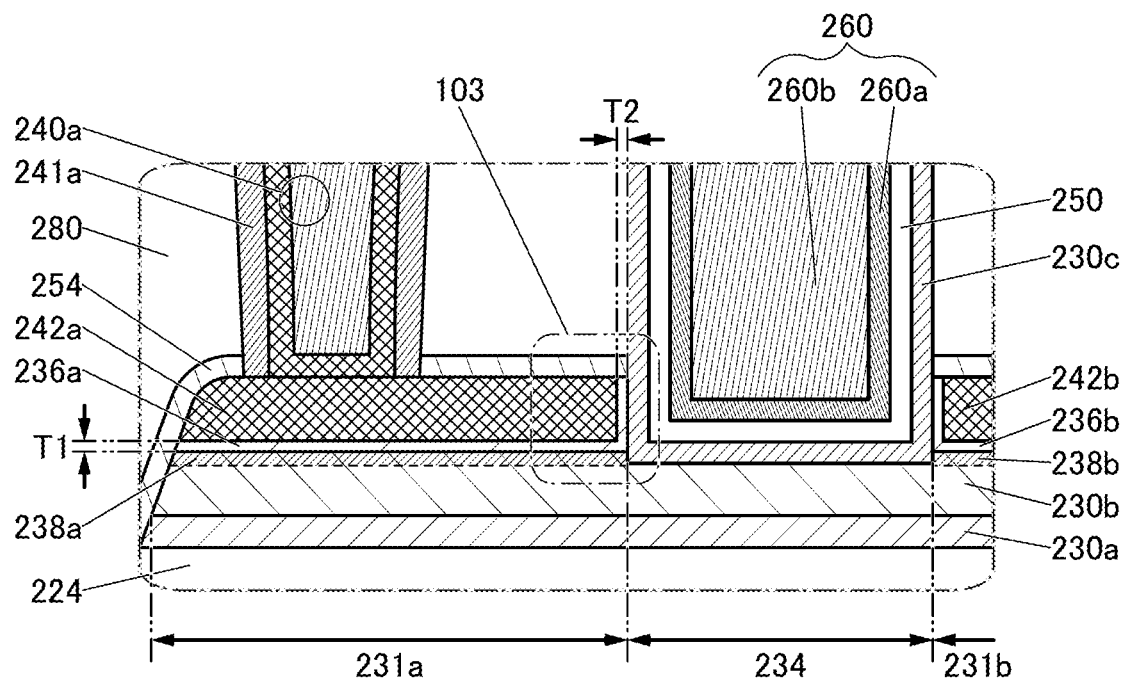

FIGS. 2A and 2B are enlarged views of a region surrounded by the dashed-dotted line in FIG. 1B. As illustrated in FIGS. 2A and 2B, the oxide 230 includes a region 234 functioning as a channel formation region of the transistor 200, and regions 231 (a region 231a and a region 231b) functioning as a source region and a drain region.

Although the regions 231 and 234 are formed in the oxide 230b in FIGS. 2A and 2B, this embodiment is not limited to this structure, and for example, the region 231 or the region 234 may be formed in the oxides 230a and 230b, in the oxides 230b and 230c, or in the oxides 230a, 230b, and 230c.

Although the boundary between the regions 231 and 234 is substantially perpendicular to the top surface of the oxide 230b in FIGS. 2A and 2B, this embodiment is not limited thereto. For example, in some cases, the region 234 extends toward the conductor 240 around the top surface of the oxide 230b and is narrowed around the bottom surface of the oxide 230b.

In the transistor 200, a metal oxide functioning as a semiconductor (hereinafter such a metal oxide is also referred to as an oxide semiconductor) is preferably used for the oxide 230 including a channel formation region. When an oxide semiconductor is used for a channel formation region of a transistor, the transistor can have high field-effect mobility. In addition, the transistor can have high reliability.

The band gap of the metal oxide is preferably greater than or equal to 2.0 eV, further preferably greater than or equal to 2.5 eV. The use of a metal oxide having a wide band gap for the oxide 230 can reduce the off-state current of the transistor. With the use of such a transistor, a semiconductor device with low power consumption can be provided.

The transistor 200 including an oxide semiconductor in its channel formation region has an extremely low leakage current in the off state; thus, a semiconductor device with low power consumption can be provided. An oxide semiconductor can be deposited by a sputtering method or the like and thus can be used in the transistor 200 included in a highly integrated semiconductor device.

For example, as the oxide 230, a metal oxide such as an In-M-Zn oxide containing indium (In), an element M, and zinc (Zn) is used; the element M is one or more selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like. In particular, aluminum, gallium, yttrium, or tin is preferably used as the element M Alternatively, an In-M oxide, an In—Zn oxide, or an M-Zn oxide may be used as the oxide 230.

A metal oxide with a low carrier density is preferably used for the transistor. In order to reduce the carrier density of the metal oxide, the concentration of impurities in the metal oxide is reduced so that the density of defect states can be reduced. In this specification and the like, a state with a low impurity concentration and a low density of defect states is referred to as a highly purified intrinsic or substantially highly purified intrinsic state. Examples of impurities contained in a metal oxide include hydrogen, nitrogen, alkali metal, alkaline earth metal, iron, nickel, and silicon.

Specifically, hydrogen contained in a metal oxide reacts with oxygen bonded to a metal atom to be water, and thus sometimes causes an oxygen vacancy in the metal oxide. If the channel formation region in the metal oxide includes oxygen vacancies, the transistor sometimes has normally-on characteristics. In some cases, a defect that is an oxygen vacancy into which hydrogen enters functions as a donor and generates an electron serving as a carrier. In other cases, bonding of part of hydrogen to oxygen bonded to a metal atom generates an electron serving as a carrier. Thus, a transistor including a metal oxide that contains a large amount of hydrogen is likely to have normally-on characteristics.

Therefore, when a metal oxide is used as the oxide 230, hydrogen in the metal oxide is preferably reduced as much as possible. Specifically, the hydrogen concentration of the metal oxide, which is measured by secondary ion mass spectrometry (SIMS), is lower than $1 \times 10^{20}$ atoms/cm$^3$, preferably lower than $1 \times 10^{19}$ atoms/cm$^3$, further preferably lower than $5 \times 10^{18}$ atoms/cm$^3$, still further preferably lower than $1 \times 10^{18}$ atoms/cm$^3$. When a metal oxide with a sufficiently low concentration of impurities such as hydrogen is used for a channel formation region of a transistor, the transistor can have stable electrical characteristics.

When a metal oxide is used as the oxide 230, contact between the conductor 242 (the conductor 242a and the conductor 242b) and the oxide 230 may make oxygen in the oxide 230 diffuse into the conductor 242, resulting in oxidation of the conductor 242. It is highly probable that oxidation of the conductor 242 lowers the conductivity of the conductor 242. Note that the expression "oxygen in the oxide 230 diffuses into the conductor 242" can be replaced with the expression "the conductor 242 absorbs oxygen in the oxide 230".

By diffusion of oxygen in the oxide 230 into the conductor 242 (the conductor 242a and the conductor 242b), a layer 236a may be formed between the conductor 242a and the oxides 230b and 230c, and a layer 236b may be formed between the conductor 242b and the oxides 230b and 230c, as illustrated in FIG. 2B.

A layer 236 (the layer 236a and the layer 236b) contains a larger amount of oxygen than the conductor 242 and is therefore assumed to have an insulating property. In this case, a three-layer structure of the conductor 242, the layer 236, and the oxide 230b or the oxide 230c can be regarded as a three-layer structure of a metal, an insulator, and a semiconductor and is sometimes referred to as a metal-insulator-semiconductor (MIS) structure.

Here, T1 shown in FIG. 2B represents the thickness of the layer 236a in a region between the oxide 230b and the conductor 242a, and also represents the thickness of the layer 236b in a region between the oxide 230b and the conductor 242b. For example, T1 represents a difference in position between the interface between the layer 236a (or the layer 236b) and the oxide 230b and the interface between the bottom surface of the conductor 242a (or the conductor 242b) and the layer 236a (or the layer 236b). In addition, T2 shown in FIG. 2B represents the thickness of the layer 236a in a region between the oxide 230c and the conductor 242a, and also represents the thickness of the layer 236b in a region between the oxide 230c and the conductor 242b. For example, T2 represents a difference in position between the interface between the layer 236a (or the layer 236b) and the oxide 230c and the interface between the side surface of the conductor 242a (or the conductor 242b) and the layer 236a (or the layer 236b).

Note that the values of T1 and T2 are different from each other in some cases. For example, when the oxide 230b and the oxide 230c have different compositions, the ease of oxygen diffusion into the conductor 242 may vary between the oxide 230b and the oxide 230c, resulting in different values of T1 and T2. Even when the oxide 230b and the oxide 230c have the same composition, the values of T1 and T2 may be different from each other owing to the difference in formation step between the oxide 230b and the oxide 230c.

Note that the thickness of the layer 236 can sometimes be measured by observing a cross-sectional shape of the layer 236 and its vicinity with a transmission electron microscope (TEM) or the like.

Furthermore, the thickness of the layer 236 can sometimes be calculated by composition line analysis of the layer 236 and its vicinity with energy dispersive X-ray spectroscopy (EDX).

To calculate T1, first, the layer 236 and its vicinity are subjected to EDX line analysis, with the direction perpendicular to the substrate surface as the depth direction. Next, in the profile of quantitative values of elements in the depth direction, which is obtained from the analysis, the depth (position) of the interface between the layer 236a (or the layer 236b) and the oxide 230b is regarded as a depth at which the quantitative value of a metal that is the main component of the oxide 230b but is not the main component of the conductor 242a (or the conductor 242b) becomes half. Moreover, the depth (position) of the interface between the bottom surface of the conductor 242a (or the conductor 242b) and the layer 236a (or the layer 236b) is regarded as a depth at which the quantitative value of oxygen of the oxide 230b becomes half. In this manner, T1 can be calculated.

To calculate T2, first, the layer 236 and its vicinity are subjected to EDX line analysis, with the channel length direction as the depth direction. Next, in the profile of quantitative values of elements in the depth direction, which is obtained from the analysis, the depth (position) of the interface between the layer 236a (or the layer 236b) and the oxide 230c is regarded as a depth at which the quantitative value of a metal that is the main component of the oxide 230c but is not the main component of the conductor 242a (or the conductor 242b) becomes half. Moreover, the depth (position) of the interface between the side surface of the conductor 242a (or the conductor 242b) and the layer 236a (or the layer 236b) is regarded as a depth at which the quantitative value of oxygen of the oxide 230c becomes half. In this manner, T2 can be calculated.

Although FIG. 2B illustrates an example in which the layer 236 is formed between the conductor 242 and the region 231 of the oxide 230b and between the conductor 242 and the oxide 230c, this embodiment is not limited thereto. Alternatively, the layer 236 may be formed only between the conductor 242 and the region 231 of the oxide 230b or only between the conductor 242 and the oxide 230c, for example.

As illustrated in FIG. 2B, a region 238a may be formed between the layer 236a and the oxide 230b or in the vicinity of the surface of the oxide 230b, and a region 238b may be formed between the layer 236b and the oxide 230b or in the vicinity of the surface of the oxide 230b. A region 238 (the region 238a and the region 238b) is an oxygen-deficient region in the oxide 230b and contains a large amount of oxygen vacancies. With such a structure, a low-resistance region may be formed in part of the region 238 because an impurity (e.g., hydrogen) entering an oxygen vacancy serves as a donor and thus the carrier density increases in the region 238.

Note that the region 231a includes at least part of the region 238a, and the region 231b includes at least part of the region 238b. Accordingly, the region 231 has a high carrier density and a low resistance. The region 234 has a lower carrier density than the region 231.

If the conductor 242 is formed using a conductive material that is easily oxidized, it is highly probable that the thickness of the layer 236 having an insulating property is large and carrier transfer between the conductor 242 and the oxide 230 is inhibited. Since the layer 236 is formed by extraction of oxygen in the oxide 230 by the conductor 242, the region 238 is enlarged as the thickness of the layer 236 increases. Therefore, the use of a conductive material that is easily oxidized is highly likely to cause variations in electrical characteristics of transistors and a reduction in reliability of transistors, for example. In contrast, when the conductor 242 is formed using a conductive material that is not easily oxidized, the thickness of the layer 236 is small, so that the conductor 242 and the oxide 230 are not in contact with each other. Thus, deterioration of the interface between the conductor 242 and the oxide 230 by heat treatment can be inhibited in some cases. That is, it is necessary to control the formation or the thickness of the layer 236.

In view of the above, the conductor 242 (the conductor 242a and the conductor 242b) is preferably formed using a conductive material with which hydrogen in the oxide 230 easily diffuses into the conductor 242 and oxygen in the oxide 230 does not easily diffuse into the conductor 242. Thus, with hydrogen in the oxide 230 diffusing into the conductor 242, the hydrogen concentration of the oxide 230 is reduced, and the transistor 200 can have stable electrical characteristics. Note that in this specification and the like, ease of diffusion of hydrogen in an oxide into a conductor is sometimes expressed by a phrase "the conductor is likely to extract (absorb) hydrogen in the oxide". Moreover, hardness of diffusion of oxygen in an oxide into a conductor is sometimes expressed by phrases "the conductor is not easily oxidized" and "the oxide is resistant to oxidation", for example.

An example of a conductor used as the conductive material includes a conductor containing tantalum (Ta), titanium (Ti), or the like. In particular, a conductor containing tantalum is preferably used for the conductor 242. A conductor containing tantalum may contain nitrogen and/or oxygen. Accordingly, the composition formula of a conductor containing tantalum preferably satisfies TaNxOy (x is a real number greater than 0 and less than or equal to 1.67 and y is a real number greater than or equal to 0 and less than or equal to 1.0). Examples of the conductor containing tantalum include tantalum, tantalum oxide, tantalum nitride, tantalum nitride oxide, and tantalum oxynitride. For that reason, in this specification and the like, the conductor containing tantalum is sometimes referred to as TaNxOy.

In TaNxOy, the proportion of tantalum is preferably high. Alternatively, the proportions of nitrogen and oxygen are preferably low; i.e., x and y are preferably small. A high proportion of tantalum lowers the resistance of TaNxOy, and the transistor 200 in which TaNxOy is used for the conductor 242 can have favorable electrical characteristics.

Alternatively, the proportion of nitrogen in TaNxOy is preferably high; i.e., x is preferably large. The use of TaNxOy with a high proportion of nitrogen for the conductor 242 can inhibit oxidation of the conductor 242 and reduce the thickness of the layer 236 formed between the conductor 242 and the oxide 230.

Note that TaNxOy is a conductive material into which hydrogen diffuses easily and oxygen is less likely to diffuse, and thus is suitable for the conductor 242. With the use of TaNxOy for the conductor 242, hydrogen in the oxide 230 can be diffused into the conductor 242 by heat treatment after the step of forming a conductive film to be the conductor 242, whereby the hydrogen concentration in the oxide 230 can be reduced. Furthermore, the layer 236 can be prevented from being formed between the conductor 242 and the oxide 230 or can be prevented from having a large thickness. Moreover, oxygen can be prevented from being extracted from the oxide 230b even when heat treatment is performed; hence, the transistor 200 is stable against high temperatures in the manufacturing process (what is called thermal budget).

Note that hydrogen diffused into the conductor 242 sometimes remains in the conductor 242. That is, hydrogen in the oxide 230 is absorbed by the conductor 242 in some cases. In other cases, hydrogen in the oxide 230 passes through the conductor 242 and is released to a component around the conductor 242 or the outside of the transistor 200.

When the layer 236 is not formed between the conductor 242 and the oxide 230, in a region 101 illustrated in FIG. 2A, hydrogen in the oxide 230 diffuses from the region 231 of the oxide 230, which is in contact with the conductor 242, into the conductor 242; hence, the hydrogen concentration of the region 231 is reduced. The reduction in hydrogen concentration of the region 231 makes hydrogen in the region 234 diffusing into the region 231. Thus, the hydrogen concentration of the region 234 can be reduced.

In addition, in a region 102 illustrated in FIG. 2A, hydrogen in the region 234 may diffuse into the conductor 242 through the oxide 230c. Thus, the hydrogen concentration of the region 234 can be reduced.

It is preferred that the conductor 242 be formed using a conductive material with which hydrogen in the oxide 230 easily diffuses into the conductor 242, and that the layer 236 be formed between the conductor 242 and the oxide 230. An example of such a conductive material is TaNxOy.

The use of TaNxOy for the conductor 242 allows formation of the layer 236 with a small thickness. Specifically, the thickness of the layer 236 can be greater than or equal to 0.1 nm and less than or equal to 4 nm, preferably greater than or equal to 0.5 nm and less than or equal to 3 nm. Consequently, hydrogen in the oxide 230 can be diffused into the conductor 242 through the layer 236, so that the hydrogen concentration of the region 234 can be reduced.

The layer 236 sometimes has an insulating property because it contains tantalum and oxygen. In that case, an MIS structure is configured with the conductor 242, the layer 236, and the oxide 230. Such a structure prevents the conductor 242 and the oxide 230 from being in contact with each other and thus can inhibit deterioration of the interface between the conductor 242 and the oxide 230 by heat treatment. Moreover, the small thickness of the layer 236 makes current to flow easily between the conductor 242 and the oxide 230, so that the reliability of the transistor can be improved.

When the layer 236 has low hydrogen permeability, in a region 103 illustrated in FIG. 2B, for example, hydrogen in the region 234 may diffuse into the conductor 242 through the oxide 230c and the insulator 254 or through the oxide 230c, the insulator 280, and the insulator 254. That is, the above conductive material forming the conductor 242 preferably has the physical property of extracting hydrogen from at least one of the components provided around the conductor 242, in addition to the physical property of extracting hydrogen in the oxide 230. Thus, the hydrogen concentration of the region 234 can be reduced in some cases.

The region 238 in FIG. 2B is in an oxygen-deficient state and includes a large amount of oxygen vacancies. In the oxide 230 containing a metal oxide, hydrogen in an oxygen vacancy is less likely to diffuse than hydrogen bonded to an oxygen atom or interstitial hydrogen. Accordingly, the region 231 including the region 238 contains a larger amount of hydrogen that is not easily diffused than the region 234. That is, hydrogen in the region 234 is more likely to diffuse into the conductor 242 than hydrogen in the region 231. Hence, the hydrogen concentration of the region 234 is lower than that of the region 231 in some cases.

In order to reduce the hydrogen concentration of the oxide 230 and to prevent formation of a layer between the conductor 242 and the oxide 230, it is preferred that the conductor 242 be formed using a conductive material with which oxygen in the oxide 230 diffuses easily into the conductor 242, and that a layer having a function of inhibiting oxidation of the conductor 242 be provided between the conductor 242 and the oxide 230. By providing the layer, the conductor 242 and the oxide 230 are not in contact with each other, so that the conductor 242 can be prevented from absorbing oxygen from the oxide 230.

Figure 3A:
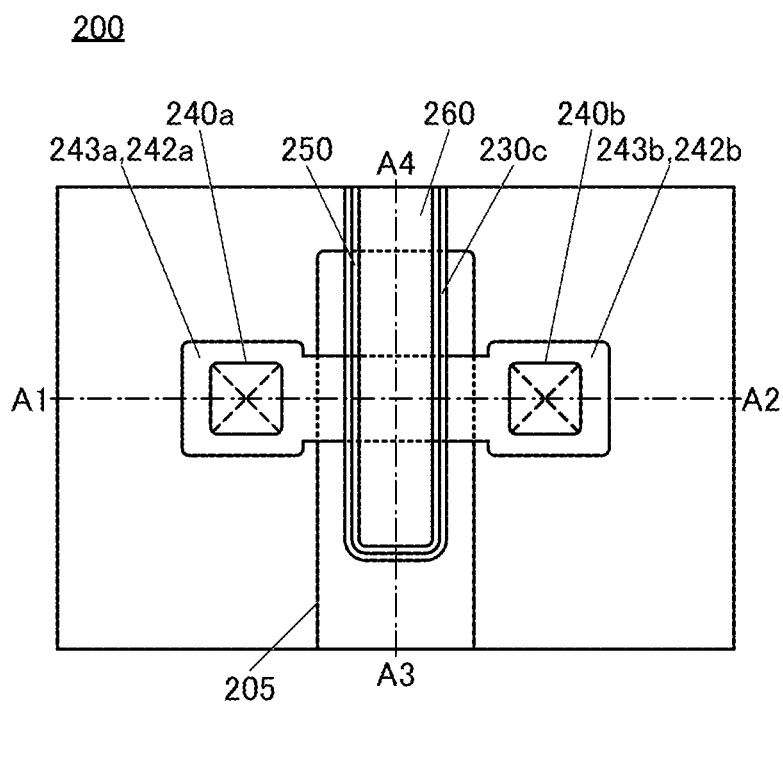
FIG. 3A is a top view of a semiconductor device of one embodiment of the present invention.
Figure 3C:
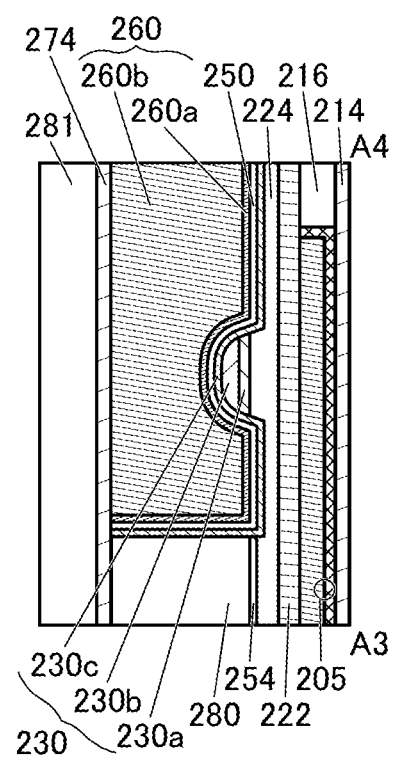
FIGS. 3B and 3C are cross-sectional views of the semiconductor device of one embodiment of the present invention.
Figure 3B:
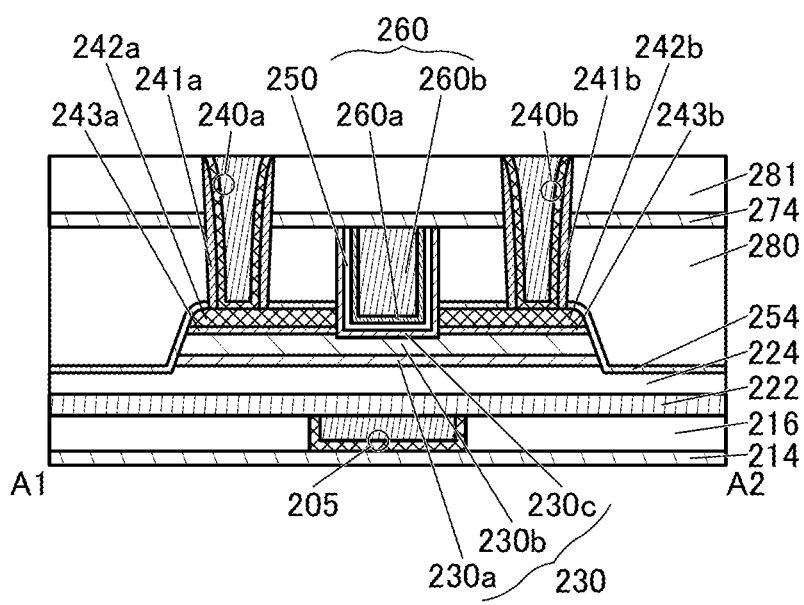

For example, as illustrated in FIGS. 3A to 3C, the transistor 200 preferably includes an oxide 243 (an oxide 243a and an oxide 243b) having a function of inhibiting oxygen transmission, between the conductor 242 (the conductors 242a and 242b) and the oxide 230. By providing the oxide 243 having a function of inhibiting oxygen transmission between the conductors 242, which serve as the source electrode and the drain electrode, and the oxide 230b, the electrical resistance between the conductor 242 and the oxide 230b can be reduced. Such a structure improves the electrical characteristics and reliability of the transistor 200.

A metal oxide including an element M may be used for the oxide 243. Specifically, the element M is preferably aluminum, gallium, yttrium, or tin. The concentration of the element M in the oxide 243 is preferably higher than that in the oxide 230b. Alternatively, gallium oxide may be used for the oxide 243. Further alternatively, a metal oxide such as In-M-Zn oxide may be used for the oxide 243. Specifically, the atomic ratio of the element M to In in the metal oxide used for the oxide 243 is preferably higher than that in the metal oxide used for the oxide 230b. The thickness of the oxide 243 ranges preferably from 0.5 nm to 5 nm, further preferably from 1 nm to 3 nm, still further preferably from 1 nm to 2 nm. The oxide 243 preferably has crystallinity. With the oxide 243 having crystallinity, release of oxygen in the oxide 230 can be favorably inhibited. When the oxide 243 has a hexagonal crystal structure, for example, release of oxygen in the oxide 230 can sometimes be inhibited.

With the above structure, the hydrogen concentration of the oxide 230 can be reduced. Accordingly, the transistor 200 can have favorable electrical characteristics and reliability.

According to the above, it is possible to provide a highly reliable semiconductor device, a semiconductor device having favorable electrical characteristics, a miniaturized or highly integrated semiconductor, or a semiconductor device with low power consumption.

<Specific Structure of Semiconductor Device>

The structure of the semiconductor device including the transistor 200 of one embodiment of the present invention will be described in detail below.

The insulator 214 preferably functions as an insulating barrier film for inhibiting diffusion of impurities such as water and hydrogen into the transistor 200 from the substrate side. Accordingly, the insulator 214 is preferably formed using an insulating material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom. Alternatively, the insulator 214 is preferably formed using an insulating material having a function of inhibiting diffusion of oxygen (e.g., at least one of oxygen atoms, oxygen molecules, and the like).

Note that in this specification, a function of inhibiting diffusion of impurities or oxygen means a function of inhibiting diffusion of any one or all of the above impurities and the above oxygen. A film having a function of inhibiting diffusion of hydrogen or oxygen may be referred to as a film through which hydrogen or oxygen does not pass easily, a film having low permeability of hydrogen or oxygen, a film having a barrier property against hydrogen or oxygen, or a barrier film against hydrogen or oxygen, for example. A barrier film having conductivity is sometimes referred to as a conductive barrier film.

For example, aluminum oxide or silicon nitride is preferably used for the insulator 214. Accordingly, it is possible to inhibit diffusion of impurities such as water and hydrogen into the transistor 200 from the substrate side through the insulator 214. It is also possible to inhibit diffusion of oxygen contained in the insulator 224 and the like toward the substrate through the insulator 214. Note that the insulator 214 may have a stacked-layer structure of two or more layers. In that case, the stacked layers are not necessarily formed of the same material and may be formed of different materials. For example, the insulator 214 may have a stacked-layer structure of aluminum oxide and silicon nitride.

As another example, silicon nitride deposited by a sputtering method is preferably used for the insulator 214, in which case the hydrogen concentration in the insulator 214 can be reduced, and impurities such as water and hydrogen can be further prevented from diffusing into the transistor 200 side from the substrate side through the insulator 214.

The dielectric constant of the insulator 216 functioning as an interlayer film is preferably lower than that of the insulator 214. The use of a material having a low dielectric constant for the interlayer film can reduce the parasitic capacitance between wirings. For example, for the insulator 216, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like can be used as appropriate.

The insulator 216 preferably includes a region that has a low hydrogen concentration and contains oxygen in excess of that in the stoichiometric composition (hereinafter also referred to as an excess-oxygen region), or preferably contains oxygen that is released by heating (hereinafter also referred to as excess oxygen). For example, silicon oxide deposited by a sputtering method is preferably used for the insulator 216, in which case entry of hydrogen into the oxide 230 can be inhibited and oxygen vacancies in the oxide 230 can be reduced by supply of oxygen to the oxide 230. Thus, the transistor can have high reliability and stable electrical characteristics with a small variation.

The insulator 216 may have a stacked-layer structure. For example, the insulator 216 may include an insulator similar to the insulator 214 at least in a region that is in contact with a side surface of the conductor 205. Such a structure can inhibit oxidation of the conductor 205 that would be caused by oxygen contained in the insulator 216, and prevent the amount of oxygen contained in the insulator 216 from being reduced by the conductor 205.

The conductor 205 functions as a second gate (also referred to as bottom gate) electrode in some cases. In that case, by changing a potential applied to the conductor 205 independently of a potential applied to the conductor 260, the threshold voltage (Vth) of the transistor 200 can be controlled. In particular, by applying a negative potential to the conductor 205, Vth of the transistor 200 can be higher, and its off-state current can be reduced. Thus, a drain current at the time when a potential applied to the conductor 260 is 0 V can be smaller in the case where a negative potential is applied to the conductor 205 than in the case where the negative potential is not applied to the conductor 205.

The conductor 205 is positioned to be overlapped by the oxide 230 and the conductor 260. The conductor 205 is preferably provided to be embedded in the insulator 214 or the insulator 216.

As illustrated in FIG. 1B, the conductor 205 is preferably larger than the channel formation region in the oxide 230. It is particularly preferred that the conductor 205 extend beyond an end portion of the oxide 230 that intersects with the channel width direction, as illustrated in FIG. 1C. That is, the conductor 205 and the conductor 260 preferably overlap each other with the insulator positioned therebetween, in a region beyond the side surface of the oxide 230 in the channel width direction. With this structure, the channel formation region of the oxide 230 can be electrically surrounded by electric fields of the conductor 260 functioning as the first gate electrode and electric fields of the conductor 205 functioning as the second gate electrode.

As illustrated in FIG. 1C, the conductor 205 is extended to have a function of a wiring. However, without limitation to this structure, a conductor functioning as a wiring may be provided under the conductor 205. In addition, the conductor 205 is not necessarily provided in each transistor. For example, the conductor 205 may be shared by a plurality of transistors.

Although the first conductor and the second conductor of the conductor 205 are stacked in the transistor 200, one embodiment of the present invention is not limited to this structure. For example, the conductor 205 may have a single-layer structure or a stacked-layer structure of three or more layers. In the case where a stacked-layer structure is employed, the layers may be distinguished by numbers corresponding to the formation order.

The first conductor of the conductor 205 is preferably formed using a conductive material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom. Alternatively, the first conductor of the conductor 205 is preferably formed using a conductive material having a function of inhibiting diffusion of oxygen (e.g., at least one of oxygen atoms, oxygen molecules, and the like).

When the first conductor of the conductor 205 is formed using a conductive material having a function of inhibiting diffusion of oxygen, the reduction in conductivity due to oxidation can be inhibited in the second conductor of the conductor 205. As a conductive material having a function of inhibiting oxygen diffusion, tantalum, tantalum nitride, ruthenium, or ruthenium oxide is preferably used, for example. The first conductor of the conductor 205 can therefore be a single layer or a stack of the above conductive materials. For example, the first conductor of the conductor 205 may be a stack of tantalum, tantalum nitride, ruthenium, or ruthenium oxide and titanium or titanium nitride.

The second conductor of the conductor 205 is preferably formed using a conductive material containing tungsten, copper, or aluminum as its main component. Note that the second conductor of the conductor 205 is shown as a single layer but may have a stacked-layer structure, for example, a stack of titanium or titanium nitride and the above conductive material.

The insulators 222 and 224 function as a gate insulator.

The insulator 222 preferably has a function of inhibiting diffusion of hydrogen (e.g., at least one of hydrogen atoms, hydrogen molecules, and the like). Moreover, the insulator 222 preferably has a function of inhibiting diffusion of oxygen (e.g., at least one of oxygen atoms, oxygen molecules, and the like). For example, the insulator 222 preferably has a function of inhibiting diffusion of much hydrogen and/or oxygen compared to the insulator 224.

As the insulator 222, an insulator containing an oxide of aluminum and/or hafnium, which is an insulating material, is preferably used. As the insulator, aluminum oxide, hafnium oxide, an oxide containing aluminum and hafnium (hafnium aluminate), or the like is preferably used. The insulator 222 formed of such a material functions as a layer that inhibits release of oxygen from the oxide 230 to the substrate side and diffusion of impurities such as hydrogen from the periphery of the transistor 200 into the oxide 230. Thus, providing the insulator 222 can inhibit diffusion of impurities such as hydrogen into the transistor 200 and inhibit generation of oxygen vacancies in the oxide 230. Moreover, the conductor 205 can be prevented from reacting with oxygen in the insulator 224 or the oxide 230.

Alternatively, aluminum oxide, bismuth oxide, germanium oxide, niobium oxide, silicon oxide, titanium oxide, tungsten oxide, yttrium oxide, or zirconium oxide may be added to the above insulator, for example. Alternatively, the insulator may be subjected to nitriding treatment. The insulator 222 may have a stacked-layer structure including silicon oxide, silicon oxynitride, or silicon nitride over any of these insulators.

The insulator 222 may have a single-layer structure or a stacked-layer structure using an insulator containing a high-k material, such as aluminum oxide, hafnium oxide, tantalum oxide, zirconium oxide, lead zirconate titanate (PZT), strontium titanate ($SrTiO_3$), or $(Ba,Sr)TiO_3$ (BST). As miniaturization and high integration of transistors progress, a problem such as leakage current may arise because of a thinner gate insulator. When a high-k material is used for an insulator functioning as the gate insulator, a gate potential at the time when the transistor operates can be reduced while the physical thickness of the gate insulator is maintained.

The insulator 224 in contact with the oxide 230 preferably releases oxygen by heating. For example, silicon oxide or silicon oxynitride can be used as appropriate for the insulator 224. When such an insulator containing oxygen is provided in contact with the oxide 230, oxygen vacancies in the oxide 230 can be reduced, leading to an improvement in reliability of the transistor 200.

Specifically, an oxide material that releases part of oxygen by heating is preferably used for the insulator 224. An oxide film that releases oxygen by heating is an oxide film in which the amount of released oxygen molecules is greater than or equal to $1.0\times10^{18}$ molecules/$cm^3$, preferably greater than or equal to $1.0\times10^{19}$ molecules/$cm^3$, further preferably greater than or equal to $2.0\times10^{19}$ molecules/$cm^3$ or greater than or equal to $3.0\times10^{20}$ molecules/$cm^3$ in thermal desorption spectroscopy (TDS) analysis.

Note that the temperature of the film surface in the TDS analysis is preferably higher than or equal to 100° C. and lower than or equal to 700° C., or higher than or equal to 100° C. and lower than or equal to 400° C.

The insulator 224 preferably has a low hydrogen concentration and includes an excess-oxygen region or excess oxygen, and may be formed using a material similar to that used for the insulator 216, for example.

Note that the insulators 222 and 224 may each have a stacked-layer structure of two or more layers. In such cases, the stacked layers are not necessarily formed of the same material and may be formed of different materials.

The oxide 230 preferably has a stacked-layer structure using oxides with different chemical compositions. Specifically, the atomic ratio of the element M to a metal element that is the main component in the metal oxide used as the oxide 230a is preferably higher than that in the metal oxide used as the oxide 230b. The atomic ratio of the element M to In in the metal oxide used as the oxide 230a is preferably higher than that in the metal oxide used as the oxide 230b. The atomic ratio of In to the element M in the metal oxide used as the oxide 230b is preferably higher than that in the metal oxide used as the oxide 230a. The oxide 230c can be formed using a metal oxide that can be used as the oxide 230a or the oxide 230b.

The oxide 230b and the oxide 230c preferably have crystallinity. For example, it is preferable to use a c-axis-aligned crystalline oxide semiconductor (CAAC-OS) described later. An oxide having crystallinity, such as a CAAC-OS, has a dense structure with small amounts of impurities and defects (e.g., oxygen vacancies) and high crystallinity. Accordingly, extraction of oxygen from the oxide 230b by the source electrode or the drain electrode can be suppressed. This inhibits extraction of oxygen from the oxide 230b even when heat treatment is performed; hence, the transistor 200 is stable against high temperatures in the manufacturing process (i.e., thermal budget).

A CAAC-OS is preferably used as the oxide 230c; i.e., the c-axes of crystals included in the oxide 230c are preferably aligned in a direction substantially perpendicular to the formation surface or the top surface of the oxide 230c. The CAAC-OS facilitates oxygen transfer in the direction perpendicular to the c-axis. Accordingly, oxygen contained in the oxide 230c can be efficiently supplied to the oxide 230b.

The conduction band minimum of each of the oxides 230a and 230c is preferably closer to the vacuum level than that of the oxide 230b. In other words, the electron affinity of each of the oxides 230a and 230c is preferably smaller than that of the oxide 230b. In that case, the oxide 230c is preferably formed using a metal oxide that can be used as the oxide 230a. At this time, the oxide 230b serves as a main carrier path.

Here, the conduction band minimum is gradually varied at a junction portion of each of the oxides 230a, 230b, and 230c. In other words, the conduction band minimum at the junction portion of each of the oxides 230a, 230b, and 230c is continuously varied or continuously connected. To achieve this, the density of defect states in a mixed layer formed at the interface between the oxides 230a and 230b and the interface between the oxides 230b and 230c is decreased.

Specifically, when the oxides 230a and 230b or the oxides 230b and 230c contain the same element as a main component in addition to oxygen, a mixed layer with a low density of defect states can be formed. For example, in the case where the oxide 230b is an In—Ga—Zn oxide, an In—Ga—Zn oxide, a Ga—Zn oxide, gallium oxide, or the like may be used as each of the oxides 230a and 230c.

Specifically, as the oxide 230a, a metal oxide having an atomic ratio of In:Ga:Zn=1:3:4 or In:Ga:Zn=1:1:0.5 can be used. As the oxide 230b, a metal oxide having an atomic ratio of In:Ga:Zn=1:1:1 or In:Ga:Zn=4:2:3 can be used. As the oxide 230c, a metal oxide having an atomic ratio of In:Ga:Zn=1:3:4, In:Ga:Zn=4:2:3, Ga:Zn=2:1, or Ga:Zn=2:5 can be used.

When the metal oxide is deposited by a sputtering method, the aforementioned atomic ratio is not limited to the atomic ratio of the deposited metal oxide and may be the atomic ratio of a sputtering target used for depositing the metal oxide.

When the oxides 230a and 230c have the above compositions, the density of defect states at the interface between the oxides 230a and 230b and the interface between the oxides 230b and 230c can be made low. Thus, the influence of interface scattering on carrier conduction is small, and the transistor 200 can have a high on-state current and high frequency characteristics.

The oxide 230c may have a stacked-layer structure including two or more layers. For example, the oxide 230c may include a first oxide and a second oxide over the first oxide.

The first oxide of the oxide 230c preferably contains at least one of the metal elements contained in the metal oxide used as the oxide 230b, further preferably contains all of these metal elements. For example, an In—Ga—Zn oxide is preferably used as the first oxide of the oxide 230c, and an In—Ga—Zn oxide, a Ga—Zn oxide, or gallium oxide is preferably used as the second oxide of the oxide 230c. Accordingly, the density of defect states at the interface of the oxide 230b and the first oxide of the oxide 230c can be reduced. The second oxide of the oxide 230c is preferably a metal oxide that inhibits diffusion or transmission of much oxygen compared to the first oxide of the oxide 230c.

When the second oxide of the oxide 230c is provided between the insulator 250 and the first oxide of the oxide 230c, diffusion of oxygen contained in the insulator 280 into the insulator 250 can be inhibited. Therefore, the oxygen is more likely to be supplied to the oxide 230b through the first oxide of the oxide 230c.

The conduction band minimum of the oxide 230a and the second oxide of the oxide 230c is preferably closer to the vacuum level than the conduction band minimum of the oxide 230b and the first oxide of the oxide 230c. In other words, the electron affinity of the oxide 230a and the second oxide of the oxide 230c is preferably smaller than that of the oxide 230b and the first oxide of the oxide 230c. In that case, it is preferred that the second oxide of the oxide 230c be formed using a metal oxide that can be used as the oxide 230a, and the first oxide of the oxide 230c be formed using a metal oxide that can be used as the oxide 230b. At this time, not only the oxide 230b but also the first oxide of the oxide 230c serves as a main carrier path in some cases.

Specifically, a metal oxide having an atomic ratio of In:Ga:Zn=4:2:3 is used as the first oxide of the oxide 230c, and a metal oxide having an atomic ratio of In:Ga:Zn=1:3:4, Ga:Zn=2:1, or Ga:Zn=2:5 or gallium oxide is used as the second oxide of the oxide 230c. Accordingly, the density of defect states at the interface between the first oxide and the second oxide of the oxide 230c can be reduced.

When the atomic ratio of In to the metal element that is the main component in the metal oxide used as the second oxide of the oxide 230c is lower than that in the metal oxide used as the first oxide of the oxide 230c, diffusion of In toward the insulator 250 can be inhibited. Since the insulator 250 functions as a gate insulator, the transistor shows poor characteristics when In enters the insulator 250 and the like. Thus, the oxide 230c having a stacked-layer structure allows the semiconductor device to have high reliability.

For the conductor 242, TaNxOy described above is preferably used. Note that TaNxOy may contain aluminum. As another example, titanium nitride, nitride containing titanium and aluminum, ruthenium oxide, oxide containing strontium and ruthenium, or oxide containing lanthanum and nickel may be used. These materials are preferable because they are a conductive material that is not easily oxidized or a material that maintains the conductivity even when absorbing oxygen.

As illustrated in FIG. 1B, the insulator 254 is preferably partly in contact with the top and side surfaces of the conductor 242a, the top and side surfaces of the conductor 242b, the side surface of the oxide 230a, the side surface of the oxide 230b, and the top surface of the insulator 224. With this structure, the insulator 280 is isolated from the insulator 224, the oxide 230a, and the oxide 230b by the insulator 254.

Like the insulator 222, the insulator 254 preferably has a function of inhibiting diffusion of hydrogen and/or oxygen. For example, the insulator 254 preferably has a function of inhibiting diffusion of much hydrogen and/or oxygen compared to the insulator 224 and the insulator 280. Thus, diffusion of hydrogen contained in the insulator 280 into the oxide 230a and the oxide 230b can be inhibited. Furthermore, the insulators 222 and 254 surround the insulator 224, the oxide 230, and the like, thereby inhibiting diffusion of impurities such as water and hydrogen into the insulator 224 and the oxide 230 from the outside. Consequently, the transistor 200 can have favorable electrical characteristics and reliability.

The insulator 254 is preferably formed by a sputtering method. When the insulator 254 is formed by a sputtering method in an oxygen-containing atmosphere, oxygen can be added to a region of the insulator 224 in contact with the insulator 254 and its vicinity. Thus, oxygen can be supplied from the region to the oxide 230 through the insulator 224. Here, with the insulator 254 having a function of inhibiting upward oxygen diffusion, oxygen can be prevented from diffusing from the oxide 230 into the insulator 280. Moreover, with the insulator 222 having a function of inhibiting downward oxygen diffusion, oxygen can be prevented from diffusing from the oxide 230 toward the substrate. In the above manner, oxygen is supplied to the channel formation region of the oxide 230. Accordingly, oxygen vacancies in the oxide 230 can be reduced, so that the transistor can be prevented from having normally-on characteristics.

As the insulator 254, an insulator containing an oxide of aluminum and/or hafnium is formed, for example. In that case, the insulator 254 is preferably formed by an atomic layer deposition (ALD) method. An ALD method, which achieves favorable coverage, can prevent disconnection or the like that would be caused by unevenness of the insulator 254.

Alternatively, an insulator containing aluminum nitride may be used as the insulator 254, for example. In that case, the insulator 254 can have an excellent insulating property and high thermal conductivity; thus, the dissipation of heat generated when the transistor 200 is driven can be increased. Silicon nitride, silicon nitride oxide, or the like can also be used.

Alternatively, an oxide containing gallium may be used as the insulator 254, for example. An oxide containing gallium is preferable because it sometimes has a function of inhibiting diffusion of at least one of hydrogen and oxygen. Note that gallium oxide, gallium zinc oxide, indium gallium zinc oxide, or the like can be used as an oxide containing gallium. When indium gallium zinc oxide is used for the insulator 254, the atomic ratio of gallium to indium is preferably high, in which case the insulating property of the oxide can be increased.

The insulator 254 can have a multilayer structure including two or more layers. When the insulator 254 has a stacked-layer structure of two layers, the lower layer and the upper layer of the insulator 254 can be formed by any of the above methods; the lower layer and the upper layer of the insulator 254 may be formed by the same method or different methods. For example, the insulator 254 may be formed in such a manner that the lower layer is formed by a sputtering method in an oxygen-containing atmosphere and then the upper layer is formed by an ALD method. An ALD method, which achieves favorable coverage, can prevent disconnection or the like that would be caused by unevenness of the lower layer.

The lower layer and the upper layer of the insulator 254 can be formed using any of the above materials; the lower layer and the upper layer of the insulator 254 may be formed using the same material or different materials. For example, the insulator 254 may have a stacked-layer structure of silicon oxide, silicon oxynitride, silicon nitride oxide, or silicon nitride and an insulator having a function of inhibiting transmission of oxygen and impurities such as hydrogen. As the insulator having a function of inhibiting transmission of oxygen and impurities such as hydrogen, an insulator containing an oxide of one or both of aluminum and hafnium can be used, for example.

The insulator 250 functions as a gate insulator. The insulator 250 is preferably in contact with at least part of the oxide 230c. The insulator 250 can be formed using silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like. Silicon oxide and silicon oxynitride, which have thermal stability, are particularly preferable.

Like the insulator 224, the insulator 250 is preferably formed using an insulator from which oxygen is released by heating. When the insulator from which oxygen is released by heating is provided as the insulator 250 to be in contact with at least part of the oxide 230c, oxygen can be effectively supplied to the channel formation region of the oxide 230b and oxygen vacancies in the channel formation region of the oxide 230b can be reduced. Thus, the transistor can have high reliability and stable electrical characteristics with a small variation. Furthermore, as in the insulator 224, the concentration of impurities such as water and hydrogen in the insulator 250 is preferably lowered. The thickness of the insulator 250 is preferably greater than or equal to 1 nm and less than or equal to 20 nm.

A metal oxide may be provided between the insulator 250 and the conductor 260.

The metal oxide preferably prevents oxygen diffusion from the insulator 250 into the conductor 260. Providing the metal oxide that inhibits oxygen diffusion inhibits diffusion of oxygen from the insulator 250 to the conductor 260. That is, the reduction in the amount of oxygen supplied to the oxide 230 can be inhibited. Moreover, oxidation of the conductor 260 due to oxygen in the insulator 250 can be inhibited.

Note that the metal oxide functions as part of the gate insulator in some cases. For that reason, when silicon oxide, silicon oxynitride, or the like is used for the insulator 250, the metal oxide is preferably a high-k material with a high dielectric constant. The gate insulator having a stacked-layer structure of the insulator 250 and the metal oxide can be thermally stable and have a high dielectric constant. Accordingly, a gate potential applied during operation of the transistor can be lowered while the physical thickness of the gate insulator is maintained. In addition, the equivalent oxide thickness (EOT) of the insulator functioning as the gate insulator can be reduced.

Specifically, a metal oxide containing one or more of hafnium, aluminum, gallium, yttrium, zirconium, tungsten, titanium, tantalum, nickel, germanium, magnesium, and the like can be used. In particular, an insulator containing an oxide of one or both of aluminum and hafnium is preferably used.

The metal oxide may function as part of the first gate electrode. For example, an oxide semiconductor that can be used as the oxide 230 can be used as the metal oxide. In that case, when the conductor 260 is formed by a sputtering method, the metal oxide can have a reduced electrical resistance and become a conductor.

With the metal oxide, the on-state current of the transistor 200 can be increased without a reduction in the influence of the electric field applied from the conductor 260. Since the distance between the conductor 260 and the oxide 230 is kept by the physical thicknesses of the insulator 250 and the metal oxide, leakage current between the conductor 260 and the oxide 230 can be reduced. Moreover, with the stacked-layer structure of the insulator 250 and the metal oxide, the physical distance between the conductor 260 and the oxide 230 and the intensity of electric fields applied from the conductor 260 to the oxide 230 can be easily adjusted as appropriate.

The conductor 260 preferably includes the conductor 260a and the conductor 260b over the conductor 260a. For example, the conductor 260a is preferably positioned so as to cover the bottom and side surfaces of the conductor 260b.

The conductor 260a is preferably formed using a conductive material having a function of inhibiting diffusion of impurities such as a hydrogen atom, a hydrogen molecule, a water molecule, a nitrogen atom, a nitrogen molecule, a nitrogen oxide molecule, and a copper atom. Alternatively, the conductor 260a is preferably formed using a conductive material having a function of inhibiting diffusion of oxygen (e.g., at least one of oxygen atoms, oxygen molecules, and the like).

When the conductor 260a has a function of inhibiting diffusion of oxygen, the conductivity of the conductor 260b can be prevented from being lowered because of oxidization of the conductor 260b due to oxygen in the insulator 250. As a conductive material having a function of inhibiting oxygen diffusion, tantalum, tantalum nitride, ruthenium, or ruthenium oxide is preferably used, for example.

The conductor 260 also functions as a wiring and thus is preferably a conductor having high conductivity. For example, a conductive material containing tungsten, copper, or aluminum as its main component can be used as the conductor 260b. The conductor 260b may have a stacked-layer structure, for example, a stacked-layer structure of titanium or titanium nitride and the above conductive material.

Although FIGS. 1B and 1C show that the conductor 260 has a two-layer structure of the conductor 260a and the conductor 260b, the conductor 260 may have a single-layer structure or a stacked-layer structure of three or more layers.

In the transistor 200, the conductor 260 is formed in a self-aligned manner so as to fill an opening formed in the insulator 280 and the like. In this manner, the conductor 260 can surely be provided in a region between the conductor 242a and the conductor 242b without alignment.

As illustrated in FIG. 1B, the top surface of the conductor 260 is substantially aligned with the top surface of the insulator 250 and the top surface of the oxide 230c.

As illustrated in FIG. 1C, in the channel width direction of the transistor 200, the bottom surface of the conductor 260 in a region that does not overlap the oxide 230b is preferably lower in level than the bottom surface of the oxide 230b. When the conductor 260 functioning as the gate electrode covers the side and top surfaces of the channel formation region of the oxide 230b with the insulator 250 and the like therebetween, the electric field of the conductor 260 is likely to affect the entire channel formation region of the oxide 230b. Accordingly, the transistor 200 can have a higher on-state current and higher frequency characteristics. Given that H1 denotes a difference in level between the bottom surface of the conductor 260 in a region that does not overlap the oxide 230a and the oxide 230b and the bottom surface of the oxide 230b, with the level of the bottom surface of the insulator 222 as a reference, H1 ranges from 0 nm to 100 nm, preferably from 3 nm to 50 nm, further preferably from 5 nm to 20 nm.

The insulator 280 is provided over the insulator 224, the oxide 230a, the oxide 230b, and the conductor 242 with the insulator 254 placed therebetween. The top surface of the insulator 280 may be planarized.

The insulator 280 functioning as the interlayer film preferably has a low dielectric constant. The use of a material having a low dielectric constant for the interlayer film can reduce the parasitic capacitance between wirings. The insulator 280 is preferably formed using a material similar to that used for the insulator 216, for example. In particular, silicon oxide and silicon oxynitride, which have thermal stability, are preferable. Silicon oxide, silicon oxynitride, and porous silicon oxide are particularly preferably used, in which case a region including oxygen that is released by heating can be easily formed.

The concentration of impurities such as water and hydrogen in the insulator 280 is preferably reduced. Moreover, the insulator 280 preferably has a low hydrogen concentration and includes an excess-oxygen region or excess oxygen, and may be formed using a material similar to that used for the insulator 216, for example. Note that the insulator 280 may have a stacked-layer structure of two or more layers.

The insulator 274, like the insulator 214 or the like, preferably functions as an insulating barrier film that inhibits diffusion of impurities such as water and hydrogen from the above into the insulator 280. In addition, the insulator 274, like the insulator 214 or the like, preferably has a low hydrogen concentration and has a function of inhibiting diffusion of hydrogen.

As illustrated in FIG. 1B, the insulator 274 is preferably in contact with the top surfaces of the conductor 260, the insulator 250, and the oxide 230c. Thus, entry of impurities such as hydrogen contained in the insulator 281 or the like can be prevented from entering the insulator 250, resulting in a reduction in adverse effects on the electrical characteristics and reliability of the transistor.

The insulator 281 functioning as the interlayer film is preferably provided over the insulator 274. Like the insulator 216 or the like, the insulator 281 preferably has a low dielectric constant. As in the insulator 224 or the like, the concentration of impurities such as water and hydrogen in the insulator 281 is preferably reduced.

The conductor 240a and the conductor 240b are provided in openings formed in the insulators 281, 274, 280, and 254. The conductors 240a and 240b are positioned to face each other with the conductor 260 positioned therebetween. Note that the top surfaces of the conductors 240a and 240b may be level with the top surface of the insulator 281.

The insulator 241a is provided in contact with a sidewall of the opening in the insulators 281, 274, 280, and 254, and the conductor 240a is formed in contact with the side surface of the insulator 241a. The conductor 242a is positioned on at least part of the bottom of the opening, and thus the conductor 240a is in contact with the conductor 242a. Similarly, the insulator 241b is provided in contact with a sidewall of the other opening in the insulators 281, 274, 280, and 254, and the conductor 240b is formed in contact with the side surface of the insulator 241b. The conductor 242b is positioned on at least part of the bottom of the opening, and thus the conductor 240b is in contact with the conductor 242b.

The conductors 240a and 240b are preferably formed using a conductive material containing tungsten, copper, or aluminum as its main component.

The conductors 240a and 240b may each have a stacked-layer structure. Although the transistor 200 is shown to include the conductor 240a and the conductor 240b each having a two-layer structure, the present invention is not limited to this. For example, the conductor 240 may have a single-layer structure or a stacked-layer structure of three or more layers.

When the conductors 240a and 240b each have a stacked-layer structure, the conductor that is in contact with the conductor 242 and is in contact with the insulators 254, 280, 274, and 281 through the insulator 241 is preferably formed using a conductive material having a function of inhibiting transmission of impurities such as water and hydrogen. For example, tantalum, tantalum nitride, titanium, titanium nitride, ruthenium, or ruthenium oxide is preferably used. The conductive material having a function of inhibiting transmission of impurities such as water and hydrogen can be used as a single layer or stacked layers. The use of the conductive material can prevent oxygen added to the insulator 280 from being absorbed by the conductors 240a and 240b. Furthermore, impurities such as water and hydrogen contained in the components above the insulator 281 can be prevented from diffusing into the oxide 230 through the conductors 240a and 240b.

The insulators 241a and 241b are formed using any of the insulators that can be used for the insulator 214 and the insulator 254, for example. Since the insulator 241a and the insulator 241b are provided in contact with the insulator 254, impurities such as water and hydrogen contained in the insulator 280 or the like can be prevented from diffusing into the oxide 230 through the conductors 240a and 240b. Moreover, oxygen contained in the insulator 280 can be prevented from being absorbed by the conductors 240a and 240b.

Although not illustrated, a conductor functioning as a wiring may be provided in contact with the top surfaces of the conductors 240a and 240b. The conductor functioning as a wiring is preferably formed using a conductive material containing tungsten, copper, or aluminum as its main component. The conductor may have a stacked-layer structure, for example, a stack of titanium or titanium nitride and the above conductive material. Note that the conductor may be formed to be embedded in an opening provided in an insulator.

Although not illustrated, an insulator having a resistivity higher than or equal to $1.0 \times 10^{13}$ Ωcm and less than or equal to $1.0 \times 10^{15}$ Ωcm, preferably higher than or equal to $5.0 \times 10^{13}$ Ωcm and less than or equal to $5.0 \times 10^{14}$ Ωcm is preferably provided so as to cover the conductor. It is preferred that an insulator having a resistivity in the above range be provided over the conductor, in which case the insulator can disperse electric charge accumulated in the transistor 200 or between wirings such as the conductor and prevent defective characteristics and electrostatic discharge of the transistor and an electronic device including the transistor due to the electric charge, while maintaining the insulating property.

<Materials for Semiconductor Device>

Materials that can be used for the semiconductor device are described below.

<<Substrate>>

As a substrate where the transistor 200 is formed, an insulator substrate, a semiconductor substrate, or a conductor substrate can be used, for example. Examples of the insulator substrate include a glass substrate, a quartz substrate, a sapphire substrate, a stabilized zirconia substrate (e.g., an yttria-stabilized zirconia substrate), and a resin substrate. Example of the semiconductor substrate include a semiconductor substrate of silicon or germanium and a compound semiconductor substrate of silicon carbide, silicon germanium, gallium arsenide, indium phosphide, zinc oxide, or gallium oxide. Other examples include a semiconductor substrate in which an insulator region is provided in the above semiconductor substrate, e.g., a silicon on insulator (SOI) substrate. Examples of the conductor substrate include a graphite substrate, a metal substrate, an alloy substrate, and a conductive resin substrate. A substrate containing a nitride of a metal, a substrate including an oxide of a metal, or the like can also be used. An insulator substrate provided with a conductor or a semiconductor, a semiconductor substrate provided with a conductor or an insulator, a conductor substrate provided with a semiconductor or an insulator, or the like may be used. Alternatively, any of these substrates provided with an element may be used. Examples of the element provided over the substrate include a capacitor, a resistor, a switching element, a light-emitting element, and a memory element.

<<Insulator>>

Examples of an insulator include an insulating oxide, an insulating nitride, an insulating oxynitride, an insulating nitride oxide, an insulating metal oxide, an insulating metal oxynitride, and an insulating metal nitride oxide.

With miniaturization and high integration of a transistor, for example, a problem such as generation of leakage current may arise because of a thin gate insulator. When a high-k material is used for an insulator functioning as a gate insulator, the driving voltage of the transistor can be reduced while keeping the physical thickness of the gate insulator. On the other hand, when a material having a low dielectric constant is used for an insulator functioning as an interlayer film, the parasitic capacitance between wirings can be reduced. Accordingly, a material is preferably selected depending on the function of an insulator.

Examples of the insulator having a high dielectric constant include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of the insulator having a low dielectric constant include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

When a transistor including an oxide semiconductor is surrounded by an insulator having a function of inhibiting transmission of oxygen and impurities such as hydrogen (e.g., the insulators 214, 222, 254, and 274), the electrical characteristics of the transistor can be stable. The insulator with a function of inhibiting transmission of oxygen and impurities such as hydrogen can have, for example, a single-layer structure or a stacked-layer structure of an insulator including boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. Specifically, as the insulator having a function of inhibiting transmission of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide or a metal nitride such as aluminum nitride, silicon nitride oxide, or silicon nitride can be used.

The insulator functioning as a gate insulator preferably includes a region containing oxygen that is released by heating. For example, when silicon oxide or silicon oxynitride that includes a region containing oxygen released by heating is in contact with the oxide 230, oxygen vacancies in the oxide 230 can be compensated.

<<Conductor>>

For the conductor, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like; an alloy containing any of the above metal elements; an alloy containing a combination of the above metal elements; or the like. For example, it is preferable to use tantalum nitride, titanium nitride, tungsten nitride, a nitride containing titanium and aluminum, a nitride containing tantalum and aluminum, ruthenium oxide, ruthenium nitride, an oxide containing strontium and ruthenium, or an oxide containing lanthanum and nickel because they are oxidation-resistant conductive materials or materials that maintain their conductivity even after absorbing oxygen. Alternatively, a semiconductor having high electric conductivity, typified by polycrystalline silicon containing an impurity element such as phosphorus, or silicide such as nickel silicide may be used.

Conductive layers formed using any of the above materials may be stacked. For example, a stacked-layer structure combining a material containing any of the above metal elements and a conductive material containing oxygen may be used. Alternatively, a stacked-layer structure combining a material containing any of the above metal elements and a conductive material containing nitrogen may be used. Further alternatively, a stacked-layer structure combining a material containing any of the above metal elements, a conductive material containing oxygen, and a conductive material containing nitrogen may be used.

When an oxide is used for the channel formation region of the transistor, the conductor functioning as the gate electrode preferably employs a stacked-layer structure using a material containing any of the above metal elements and a conductive material containing oxygen. In this case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate electrode, a conductive material containing oxygen and a metal element contained in a metal oxide in which the channel is formed. A conductive material containing any of the above metal elements and nitrogen may also be used. For example, a conductive material containing nitrogen, such as titanium nitride or tantalum nitride, may be used. Indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Indium gallium zinc oxide containing nitrogen may be used. With the use of such a material, hydrogen contained in the metal oxide in which the channel is formed can be captured in some cases. Alternatively, hydrogen entering from a surrounding insulator or the like can be captured in some cases.

<<Metal Oxide>>

As the oxide 230, a metal oxide functioning as an oxide semiconductor is preferably used. A metal oxide that can be used as the oxide 230 according to the present invention is described below.

The metal oxide contains preferably at least indium or zinc and particularly preferably indium and zinc. In addition, aluminum, gallium, yttrium, tin, or the like is preferably contained. Furthermore, one or more elements selected from boron, titanium, iron, nickel, germanium, zirconium, molybdenum, lanthanum, cerium, neodymium, hafnium, tantalum, tungsten, magnesium, and the like may be contained.

Here, the case where the metal oxide is In-M-Zn oxide that contains indium, an element M, and zinc is considered.

The element M is aluminum, gallium, yttrium, or tin. Other elements that can be used as the element M include boron, titanium, iron, nickel, germanium, zirconium, molybdenum, lanthanum, cerium, neodymium, hafnium, tantalum, tungsten, and magnesium. Note that two or more of the above elements may be used in combination as the element M.

Note that in this specification and the like, a metal oxide containing nitrogen is also referred to as a metal oxide in some cases. Moreover, a metal oxide containing nitrogen may be referred to as a metal oxynitride.

[Structure of Metal Oxide]

An oxide semiconductor (metal oxide) is classified into a single crystal oxide semiconductor and a non-single-crystal oxide semiconductor. Examples of a non-single-crystal oxide semiconductor include a CAAC-OS, a polycrystalline oxide semiconductor, a nanocrystalline oxide semiconductor (nc-OS), an amorphous-like oxide semiconductor (a-like OS), and an amorphous oxide semiconductor.

The CAAC-OS has c-axis alignment, its nanocrystals are connected in the a-b plane direction, and its crystal structure has distortion. Note that distortion refers to a portion where the direction of a lattice arrangement changes between a region with a uniform lattice arrangement and another region with a uniform lattice arrangement in a region where the nanocrystals are connected.

The shape of the nanocrystal is basically a hexagon but is not always a regular hexagon and is a non-regular hexagon in some cases. A pentagonal lattice arrangement, a heptagonal lattice arrangement, and the like are included in the distortion in some cases. Note that it is difficult to observe a clear grain boundary even in the vicinity of distortion in the CAAC-OS. That is, a lattice arrangement is distorted and thus formation of a grain boundary is inhibited. This is because the CAAC-OS can tolerate distortion owing to a low density of oxygen atom arrangement in the a-b plane direction, a change in interatomic bond distance by substitution of a metal element, and the like.

The CAAC-OS tends to have a layered crystal structure (also referred to as a stacked-layer structure) in which a layer containing indium and oxygen (hereinafter an In layer) and a layer containing the element M, zinc, and oxygen (hereinafter an (M, Zn) layer) are stacked. Note that indium and the element M can be replaced with each other, and when the element M of the (M, Zn) layer is replaced with indium, the layer can be referred to as an (In, M, Zn) layer. When indium of the In layer is replaced with the element M, the layer can be referred to as an (In, M) layer.

The CAAC-OS is a metal oxide with high crystallinity. By contrast, in the CAAC-OS, a reduction in electron mobility due to a grain boundary is less likely to occur because it is difficult to observe a clear grain boundary. Entry of impurities, formation of defects, or the like might decrease the crystallinity of a metal oxide. This means that the CAAC-OS is a metal oxide having small amounts of impurities and defects (e.g., oxygen vacancies). Thus, a metal oxide including the CAAC-OS is physically stable.

Accordingly, the metal oxide including the CAAC-OS is resistant to heat and has high reliability.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different nanocrystals in the nc-OS. Thus, the orientation in the whole film is not observed. Accordingly, in some cases, the nc-OS cannot be distinguished from an a-like OS or an amorphous oxide semiconductor, depending on an analysis method.

Note that an In—Ga—Zn oxide (hereinafter IGZO) that is a metal oxide containing indium, gallium, and zinc has a stable structure in some cases by being formed of the above-described nanocrystals. In particular, IGZO crystals tend not to grow in the air and thus, a stable structure is obtained when IGZO is formed of smaller crystals (e.g., the above-described nanocrystals) rather than larger crystals (here, crystals with a size of several millimeters or several centimeters).

The a-like OS is a metal oxide having a structure between those of the nc-OS and the amorphous oxide semiconductor. The a-like OS has a void or a low-density region. That is, the a-like OS has low crystallinity as compared with the nc-OS and the CAAC-OS.

An oxide semiconductor (metal oxide) can have any of various structures that show various different properties. Two or more of the amorphous oxide semiconductor, the polycrystalline oxide semiconductor, the a-like OS, the nc-OS, and the CAAC-OS may be included in an oxide semiconductor of one embodiment of the present invention.

[Impurities]

Here, the influence of impurities in the metal oxide is described.

Entry of impurities into the oxide semiconductor forms defect states or oxygen vacancies in some cases. Thus, when impurities enter a channel formation region of the oxide semiconductor, the electrical characteristics of a transistor using the oxide semiconductor tend to vary and its reliability is degraded in some cases. Moreover, if the channel formation region includes oxygen vacancies, the transistor tends to have normally-on characteristics.

The above-described defect states may include a trap state. Charge trapped by a trap state in the metal oxide takes a long time to be released and may behave like fixed charge. Thus, a transistor including the metal oxide having a high density of trap states in the channel formation region has unstable electrical characteristics in some cases.

If impurities exist in the channel formation region of the oxide semiconductor, the crystallinity of the channel formation region may decrease, and the crystallinity of an oxide in contact with the channel formation region may decrease. Low crystallinity of the channel formation region tends to result in deterioration in stability or reliability of the transistor. Moreover, if the crystallinity of the oxide in contact with the channel formation region is low, an interface state may be formed and the stability or reliability of the transistor may deteriorate.

Therefore, the reduction in concentration of impurities in and around the channel formation region of the oxide semiconductor is effective in improving the stability or reliability of the transistor. Examples of impurities include hydrogen, nitrogen, alkali metal, alkaline earth metal, iron, nickel, and silicon.

Specifically, the concentration of the above impurities obtained by SIMS is lower than or equal to $1 \times 10^{18}$ atoms/cm$^3$, preferably lower than or equal to $2 \times 10^{16}$ atoms/cm$^3$ in and around the channel formation region of the oxide semiconductor. Alternatively, the concentration of the above impurities obtained by element analysis using EDX is lower than or equal to 1.0 at. % in and around the channel formation region of the oxide semiconductor. When an oxide containing the element M is used as the oxide semiconductor, the concentration ratio of the impurities to the element M is lower than 0.10, preferably lower than 0.05 in and around the channel formation region of the oxide semiconductor. Here, the concentration of the element M used in the calculation of the concentration ratio may be a concentration in a region whose concertation of the impurities is calculated or may be a concentration in the oxide semiconductor.

A metal oxide with a low impurity concentration has a low density of defect states and thus has a low density of trap states in some cases.

<Method for Manufacturing Semiconductor Device>

Next, a method for manufacturing a semiconductor device including the transistor 200 of one embodiment of the present invention, which is shown in FIGS. 1A to 1C, will be described with reference to FIGS. 4A to 11C.

FIGS. 4A, 5A, 6A, 7A, 8A, 9A, 10A, and 11A are top views. FIGS. 4B, 5B, 6B, 7B, 8B, 9B, 10B, and 11B are cross-sectional views of a portion along the dashed-dotted line A1-A2 in FIGS. 4A, 5A, 6A, 7A, 8A, 9A, 10A, and 11A and show a cross section of the transistor 200 in the channel length direction. FIGS. 4C, 5C, 6C, 7C, 8C, 9C, 10C, and 11C are cross-sectional views of a portion along the dashed-dotted line A3-A4 in FIGS. 4A, 5A, 6A, 7A, 8A, 9A, 10A, and 11A and show a cross section of the transistor 200 in the channel width direction. Note that for simplification, some components are not illustrated in the top views in FIGS. 4A, 5A, 6A, 7A, 8A, 9A, 10A, and 11A.

First, a substrate (not illustrated) is prepared, and the insulator 214 is formed over the substrate. The insulator 214 can be formed by a sputtering method, a chemical vapor deposition (CVD) method, a molecular beam epitaxy (MBE) method, a pulsed laser deposition (PLD) method, an ALD method, or the like.

Note that CVD methods can be classified into a plasma enhanced CVD (PECVD) method using plasma, a thermal CVD (TCVD) method using heat, a photo CVD method using light, and the like. Moreover, CVD methods can be classified into a metal CVD (MCVD) method and a metal organic CVD (MOCVD) method according to a source gas.

A PECVD method enables a high-quality film to be obtained at a relatively low temperature. A thermal CVD method does not use plasma and thus causes no plasma damage to an object. For example, a wiring, an electrode, an element (e.g., a transistor or a capacitor), or the like included in a semiconductor device might be charged up by receiving charge from plasma. In that case, accumulated charge might break the wiring, electrode, element, or the like included in the semiconductor device. By contrast, when a thermal CVD method not using plasma is employed, such plasma damage is not caused and the yield of the semiconductor device can be increased. Furthermore, a film with few defects can be obtained by a thermal CVD method because plasma damage during film formation is not caused.

In an ALD method, one atomic layer can be deposited at a time using self-controllability of atoms. Hence, an ALD method has various advantages such as deposition of an extremely thin film, deposition on a component with a large aspect ratio, deposition of a film with a small number of detects such as pinholes, deposition with excellent coverage, and low-temperature deposition. An ALD method includes a plasma-enhanced ALD (PEALD) method using plasma. The use of plasma is sometimes preferable because deposition at a lower temperature is possible. Note that a precursor used in an ALD method sometimes contains impurities such as carbon. Thus, a film formed by an ALD method may contain impurities such as carbon in a larger amount than a film formed by another deposition method. Note that impurities can be quantified by X-ray photoelectron spectroscopy (XPS).

Unlike in the film formation method in which particles ejected from a target or the like are deposited, a film is formed by reaction at a surface of an object in a CVD method and an ALD method. Thus, a CVD method and an ALD method can provide good step coverage, almost regardless of the shape of an object. In particular, an ALD method enables excellent step coverage and excellent thickness uniformity and can be suitably used to cover a surface of an opening portion with a high aspect ratio, for example. Note that an ALD method has a relatively low deposition rate; hence, in some cases, an ALD method is preferably combined with another film formation method with a high deposition rate, such as a CVD method.

When a CVD method or an ALD method is employed, the composition of a film to be formed can be controlled with the flow rate ratio of the source gases. For example, in a CVD method or an ALD method, a film with a certain composition can be formed by adjusting the flow rate ratio of the source gases. Moreover, in a CVD method or an ALD method, by changing the flow rate ratio of the source gases during the film formation, a film whose composition is continuously changed can be formed. In the case where a film is formed while the flow rate ratio of the source gases is changed, as compared to the case where a film is formed using a plurality of deposition chambers, the time taken for the deposition can be shortened because the time taken for transfer and pressure adjustment is omitted. Consequently, semiconductor devices can be manufactured with high productivity in some cases.

In this embodiment, aluminum oxide is deposited as the insulator 214 by a sputtering method. The insulator 214 may have a multilayer structure.

Next, the insulator 216 is formed over the insulator 214. The insulator 216 can be formed by a sputtering method, a CVD method, an MBE method, a PLD method, an ALD method, or the like. In this embodiment, silicon oxynitride is deposited as the insulator 216 by a CVD method.

Then, an opening reaching the insulator 214 is formed in the insulator 216. Examples of the opening include a groove and a slit. A region where an opening is formed may be referred to as an opening portion. The opening may be formed by wet etching; however, dry etching is preferable for microfabrication. The insulator 214 is preferably an insulator that functions as an etching stopper film when a groove is formed by etching of the insulator 216. For example, in the case where silicon oxynitride is used as the insulator 216 in which the groove is to be formed, the insulator 214 is preferably formed using silicon nitride, aluminum oxide, or hafnium oxide.

As a dry etching apparatus, a capacitively coupled plasma (CCP) etching apparatus including parallel plate electrodes can be used. The capacitively coupled plasma etching apparatus including parallel plate electrodes may have a structure in which a high-frequency voltage is applied to one of the parallel plate electrodes. Alternatively, different high-frequency voltages may be applied to one of the parallel plate electrodes. Further alternatively, high-frequency voltages with the same frequency may be applied to the parallel plate electrodes. Still further alternatively, high-frequency voltages with different frequencies may be applied to the parallel plate electrodes. Alternatively, a dry etching apparatus including a high-density plasma source can be used. As the dry etching apparatus including a high-density plasma source, an inductively coupled plasma (ICP) etching apparatus can be used, for example.

After the formation of the opening, a conductive film to be the first conductor of the conductor 205 is formed. The conductive film preferably contains a conductor that has a function of inhibiting the passage of oxygen. For example, tantalum nitride, tungsten nitride, or titanium nitride can be used. Alternatively, the conductive film can be a stack using the conductor with a function of inhibiting the passage of oxygen and tantalum, tungsten, titanium, molybdenum, aluminum, copper, or a molybdenum-tungsten alloy. The conductive film can be formed by a sputtering method, a CVD method, an MBE method, a PLD method, an ALD method, or the like.

In this embodiment, as the conductive film to be the first conductor of the conductor 205, a tantalum nitride film or a stack including tantalum nitride and titanium nitride thereover is formed by a sputtering method. Even when a metal that is easily diffused, such as copper, is used for the second conductor of the conductor 205 to be described later, the use of such a metal nitride as the first conductor of the conductor 205 can prevent diffusion of the metal from the first conductor of the conductor 205 to the outside.

Next, a conductive film to be the second conductor of the conductor 205 is formed over the conductive film to be the first conductor of the conductor 205. This conductive film can be formed by a plating method, a sputtering method, a CVD method, an MBE method, a PLD method, an ALD method, or the like. In this embodiment, tungsten is deposited as the conductive film.

Subsequently, by chemical mechanical polishing (CMP) treatment, the conductive film to be the first conductor of the conductor 205 and the conductive film to be the second conductor of the conductor 205 are partly removed so that the insulator 216 is exposed. As a result, the conductive film to be the first conductor of the conductor 205 and the conductive film to be the second conductor of the conductor 205 remain only in the opening portion. Thus, the conductor 205 that includes the first and second conductors and has a flat top surface can be formed (see FIGS. 4A to 4C).

Note that after the conductor 205 is formed, the following steps may be performed: part of the second conductor of the conductor 205 is removed to form a groove in the second conductor of the conductor 205, a conductive film is formed over the conductor 205 and the insulator 216 so as to fill the groove, and then CMP treatment is performed. By the CMP treatment, part of the conductive film is removed to expose the insulator 216. Note that part of the second conductor of the conductor 205 is preferably removed by a dry etching method or the like.

Through the above steps, the conductor 205 that has a flat top surface and includes the above conductive film can be formed. High planarity of the top surfaces of the insulator 216 and the conductor 205 results in improved crystallinity of the oxides 230a, 230b, and 230c. Note that the conductive film is preferably formed using a material similar to that for the first conductor or the second conductor of the conductor 205.

Here, a method for forming the conductor 205 that is different from the above is described below.

A conductive film to be the conductor 205 is formed over the insulator 214. The conductive film can be formed by a sputtering method, a CVD method, an MBE method, a PLD method, an ALD method, or the like. The conductive film can be a multilayer film. For example, tungsten is deposited as the conductive film.

Next, the conductive film to be the conductor 205 is processed by a lithography method, so that the conductor 205 is formed.

In the lithography method, first, a resist is exposed to light through a mask. Next, a region exposed to light is removed or left using a developing solution, so that a resist mask is formed. Then, etching is conducted with the resist mask, whereby a conductor, a semiconductor, an insulator, or the like can be processed into a desired shape. The resist mask is formed, for example, by exposing the resist to KrF excimer laser light, ArF excimer laser light, or extreme ultraviolet (EUV) light. A liquid immersion technique may be employed in which a portion between a substrate and a projection lens is filled with a liquid (e.g., water) to perform light exposure. An electron beam or an ion beam may be used instead of the above-mentioned light. Note that a mask is not necessary in the case of using an electron beam or an ion beam. To remove the resist mask, dry etching treatment such as ashing or wet etching treatment can be used. Alternatively, wet etching treatment can be performed after dry etching treatment, or dry etching treatment can be performed after wet etching treatment.

A hard mask formed of an insulator or a conductor may be used instead of the resist mask. In the case of using a hard mask, a hard mask with a desired shape can be formed in the following manner: an insulating film or a conductive film that is the material of the hard mask is formed over the conductive film to be the conductor 205, a resist mask is formed thereover, and then the hard mask material is etched. The etching of the conductive film to be the conductor 205 may be performed after or without removal of the resist mask. In the latter case, the resist mask sometimes disappears during the etching. The hard mask may be removed by etching after the etching of the conductive film to be the conductor 205. The hard mask does not need to be removed when the hard mask material does not affect the following process or can be utilized in the following process.

Next, an insulating film to be the insulator 216 is formed over the insulator 214 and the conductor 205. The insulating film is formed to be in contact with the top and side surfaces of the conductor 205. The insulating film can be formed by a sputtering method, a CVD method, an MBE method, a PLD method, an ALD method, or the like.

Here, the thickness of the insulating film to be the insulator 216 is preferably larger than or equal to the thickness of the conductor 205. For example, given that the thickness of the conductor 205 is 1, the thickness of the insulating film ranges from 1 to 3.

Then, the insulating film to be the insulator 216 is subjected to CMP treatment, whereby part of the insulating film is removed so that the surface of the conductor 205 is exposed. Thus, the conductor 205 and the insulator 216 that have a flat top surface can be formed. The above is the different method for forming the conductor 205.

Next, the insulator 222 is formed over the insulator 216 and the conductor 205. The insulator 222 can be formed by a sputtering method, a CVD method, an MBE method, a PLD method, an ALD method, or the like. In this embodiment, hafnium oxide or aluminum oxide is formed as the insulator 222 by an ALD method.

Subsequently, heat treatment is preferably performed. The heat treatment is performed at a temperature higher than or equal to 250° C. and lower than or equal to 650° C., preferably higher than or equal to 300° C. and lower than or equal to 500° C., further preferably higher than or equal to 320° C. and lower than or equal to 450° C. The heat treatment is performed in an atmosphere of a nitrogen gas or an inert gas, or an atmosphere containing an oxidizing gas at 10 ppm or more, 1% or more, or 10% or more.

The heat treatment may be performed under a reduced pressure. Alternatively, the heat treatment may be performed in such a manner that heat treatment is performed in an atmosphere of a nitrogen gas or an inert gas, and then another heat treatment is performed in an atmosphere containing an oxidizing gas at 10 ppm or more, 1% or more, or 10% or more in order to compensate for released oxygen.

In this embodiment, the heat treatment is performed in such a manner that treatment at 400° C. in a nitrogen atmosphere is performed for one hour after the insulator 222 is formed and then treatment at 400° C. in an oxygen atmosphere is successively performed for one hour. By the heat treatment, impurities such as water and hydrogen included in the insulator 222 can be removed, for example. The heat treatment can also be performed after the formation of the insulator 224, or the like.

Then, the insulator 224 is formed over the insulator 222. The insulator 224 can be formed by a sputtering method, a CVD method, an MBE method, a PLD method, an ALD method, or the like. In this embodiment, a silicon oxynitride film is formed as the insulator 224 by a CVD method.

Here, in order to form an excess-oxygen region in the insulator 224, plasma treatment using oxygen may be performed under a reduced pressure. The plasma treatment using oxygen is preferably performed with an apparatus including a power source for generating high-density plasma using microwaves, for example. Alternatively, the apparatus may include a power source for applying a radio frequency (RF) to the substrate side. The use of high-density plasma enables high-density oxygen radicals to be generated, and application of the RF to the substrate side allows oxygen radicals generated by the high-density plasma to be efficiently introduced into the insulator 224. Furthermore, after plasma treatment using an inert gas with the apparatus, plasma treatment using oxygen may be performed in order to compensate for released oxygen. Note that impurities such as water and hydrogen contained in the insulator 224 can be removed by selecting the conditions of the plasma treatment appropriately. In that case, the heat treatment is not always necessary.

Here, aluminum oxide may be deposited over the insulator 224 by a sputtering method, for example, and then subjected to CMP treatment until the insulator 224 is exposed. The CMP treatment can planarize and smooth the surface of the insulator 224. When the CMP treatment is performed while the aluminum oxide is placed over the insulator 224, it is easy to detect the endpoint of the CMP treatment. Part of the insulator 224 may be polished by the CMP treatment so that the thickness of the insulator 224 may be reduced; the thickness of the insulator 224 is adjusted at the time of the formation of the insulator 224. Planarizing and smoothing the surface of the insulator 224 can sometimes prevent deterioration of the coverage with an oxide deposited later and a decrease in yield of the semiconductor device. Moreover, it is preferable to deposit aluminum oxide over the insulator 224 by a sputtering method, in which case oxygen can be added to the insulator 224.

Figure 4A:
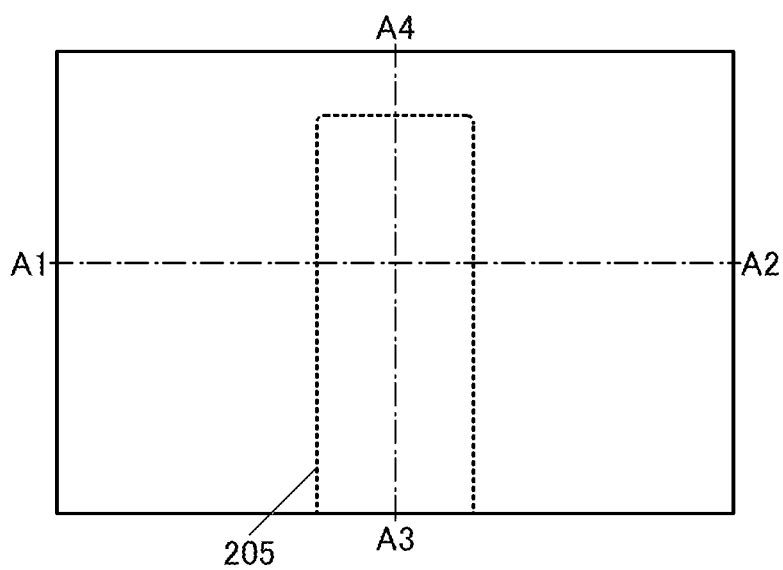
FIG. 4A is a top view illustrating a method for manufacturing a semiconductor device according to one embodiment of the present invention.
Figure 4C:
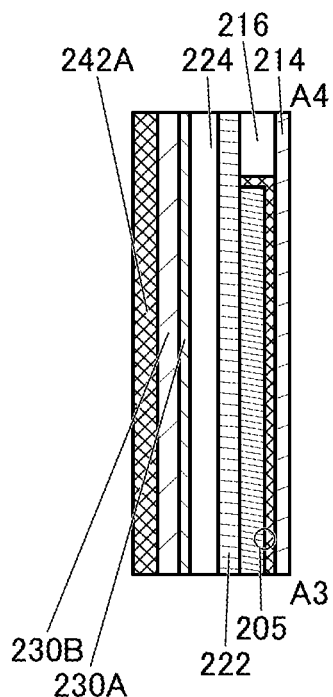
FIGS. 4B and 4C are cross-sectional views illustrating the method for manufacturing a semiconductor device according to one embodiment of the present invention.
Figure 4B:
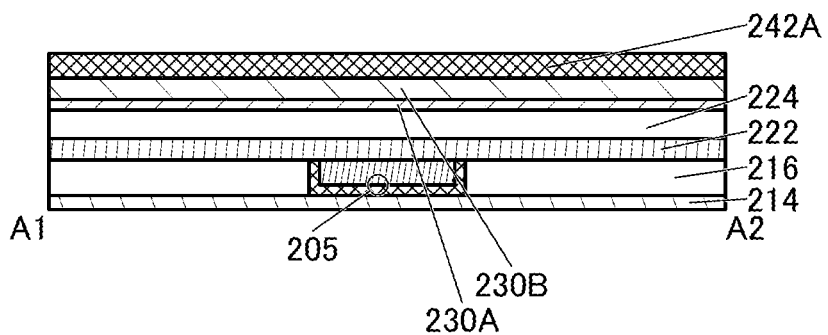
Figure 5A:
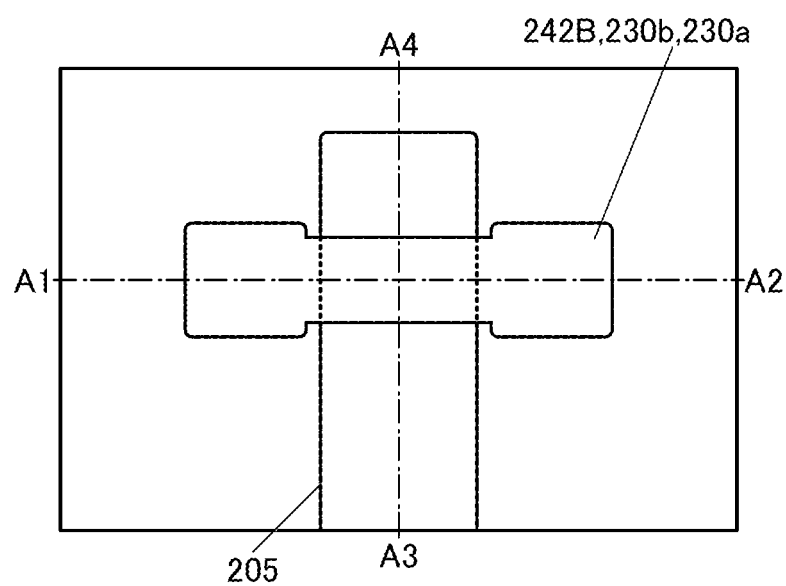
FIG. 5A is a top view illustrating a method for manufacturing a semiconductor device according to one embodiment of the present invention.
Figure 5C:
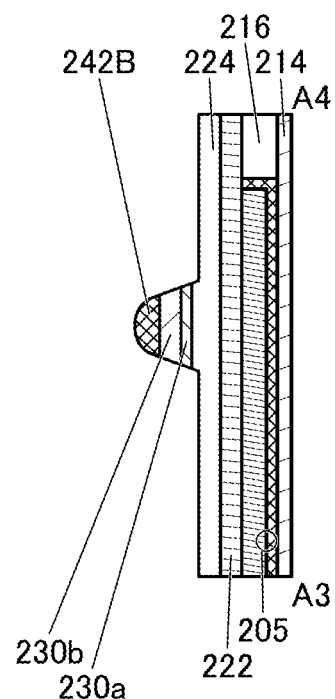
FIGS. 5B and 5C are cross-sectional views illustrating the method for manufacturing a semiconductor device according to one embodiment of the present invention.
Figure 5B:
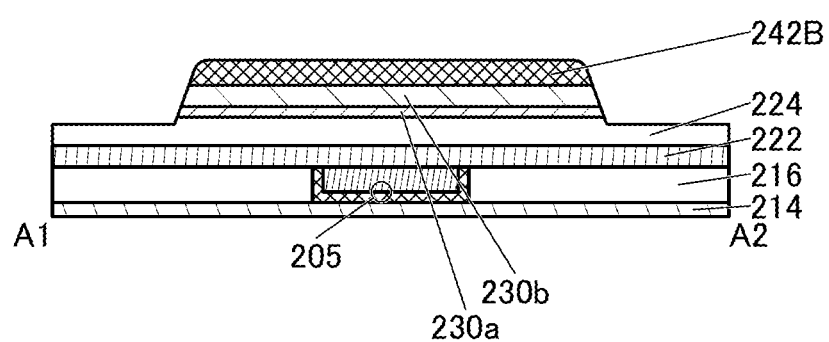

Next, an oxide film 230A and an oxide film 230B are formed in this order over the insulator 224 (see FIGS. 4B and 4C). It is preferable to form the oxide film 230A and the oxide film 230B successively without exposure to the air. When the oxide films 230A and 230B are formed without exposure to the air, impurities or moisture from the air can be prevented from being attached to the oxide films 230A and 230B, so that the interface between the oxide films 230A and 230B and the vicinity of the interface can be kept clean.

The oxide films 230A and 230B can be formed by a sputtering method, a CVD method, an MBE method, a PLD method, an ALD method, or the like.

When the oxide films 230A and 230B are formed by a sputtering method, for example, oxygen or a mixed gas of oxygen and a rare gas is used as a sputtering gas. An increase in the proportion of oxygen in the sputtering gas can increase the amount of excess oxygen contained in the oxide film to be formed. Moreover, when the oxide films are formed by a sputtering method, a target of In-M-Zn oxide mentioned above can be used, for example.

In particular, in the formation of the oxide film 230A, part of oxygen contained in the sputtering gas is supplied to the insulator 224 in some cases. Therefore, the proportion of oxygen in the sputtering gas is preferably 70% or higher, further preferably 80% or higher, still further preferably 100%.

When the oxide film 230B is formed by a sputtering method and the proportion of oxygen in the sputtering gas is higher than 30% and lower than or equal to 100%, preferably higher than or equal to 70% and lower than or equal to 100%, an oxygen-excess oxide semiconductor is formed. A transistor including an oxygen-excess oxide semiconductor in a channel formation region can have relatively high reliability.

However, one embodiment of the present invention is not limited thereto. When the oxide film 230B is formed by a sputtering method and the proportion of oxygen in the sputtering gas is higher than or equal to 1% and lower than or equal to 30%, preferably higher than or equal to 5% and lower than or equal to 20%, an oxygen-deficient oxide semiconductor is formed. A transistor including an oxygen-deficient oxide semiconductor in a channel formation region can have relatively high field-effect mobility. In addition, when the oxide film is formed while the substrate is being heated, the crystallinity of the oxide film can be improved.

In this embodiment, the oxide film 230A is formed by a sputtering method using an In—Ga—Zn oxide target with an atomic ratio of In:Ga:Zn=1:3:4. The oxide film 230B is formed by a sputtering method using an In—Ga—Zn oxide target with an atomic ratio of In:Ga:Zn=4:2:4.1. Note that each of the oxide films is preferably formed by appropriate selection of film formation conditions and the atomic ratio to have characteristics required for the oxide 230.

Note that the insulator 222, the insulator 224, the oxide film 230A, and the oxide film 230B are preferably formed without exposure to the air. For example, a multi-chamber film formation apparatus is used.

Next, heat treatment may be performed. For the heat treatment, the above-described heat treatment conditions can be employed. By the heat treatment, impurities such as water and hydrogen in the oxide films 230A and 230B can be removed, for example. In this embodiment, treatment is performed at 400° C. in a nitrogen atmosphere for one hour, and another treatment is successively performed at 400° C. in an oxygen atmosphere for one hour.

Then, a conductive film 242A is formed over the oxide film 230B. The conductive film 242A can be formed by a sputtering method, a CVD method, an MBE method, a PLD method, an ALD method, or the like (see FIGS. 4B and 4C). Note that heat treatment may be performed before the formation of the conductive film 242A. The heat treatment may be performed under a reduced pressure, and the conductive film 242A may be successively formed without exposure to the air. By such treatment, moisture and hydrogen adsorbed on the surface of the oxide film 230B and the like can be removed, and the moisture concentration and the hydrogen concentration in the oxide films 230A and 230B can be reduced. The temperature of the heat treatment is preferably higher than or equal to 100° C. and lower than or equal to 400° C. In this embodiment, the temperature of the heat treatment is 200° C.

Next, the oxide film 230A, the oxide film 230B, and the conductive film 242A are processed into an island shape, whereby the oxide 230a, the oxide 230b, and a conductive layer 242B are formed. Note that in this step, the thickness of the insulator 224 in a region that is not overlapped by the oxide 230a is reduced in some cases (see FIGS. 5A to 5C).

The oxide 230a, the oxide 230b, and the conductive layer 242B are formed to overlap the conductor 205 at least partly. It is preferred that the side surfaces of the oxides 230a and 230b and the conductive layer 242B be substantially perpendicular to the top surface of the insulator 224, in which case a plurality of transistors 200 can be provided in a smaller area and at a higher density. Note that the angle formed between the side surfaces of the oxides 230a and 230b and the conductive layer 242B and the top surface of the insulator 224 may be an acute angle. In that case, the angle formed between the side surfaces of the oxides 230a and 230b and the conductive layer 242B and the top surface of the insulator 224 is preferably larger than or equal to 60° and smaller than 70°. With such a shape, the coverage with the insulator 254 and the like can be improved in a later step, so that defects such as a void can be reduced.

There is a curved surface between the side surface and the top surface of the conductive layer 242B. That is, an end portion of the side surface and an end portion of the top surface are preferably curved. The radius of curvature of the curved surface at the end portion of the conductive layer 242B is greater than or equal to 3 nm and less than or equal to 10 nm, preferably greater than or equal to 5 nm and less than or equal to 6 nm. When the end portion is not angular, the coverage with films formed in the following film formation steps is improved.

Note that the oxide films 230A and 230B and the conductive film 242A are processed by a lithography method. The processing can be performed by a dry etching method or a wet etching method. A dry etching method is suitable for microfabrication. Alternatively, the oxide films 230A and 230B and the conductive film 242A may be processed under different conditions.

Figure 6A:
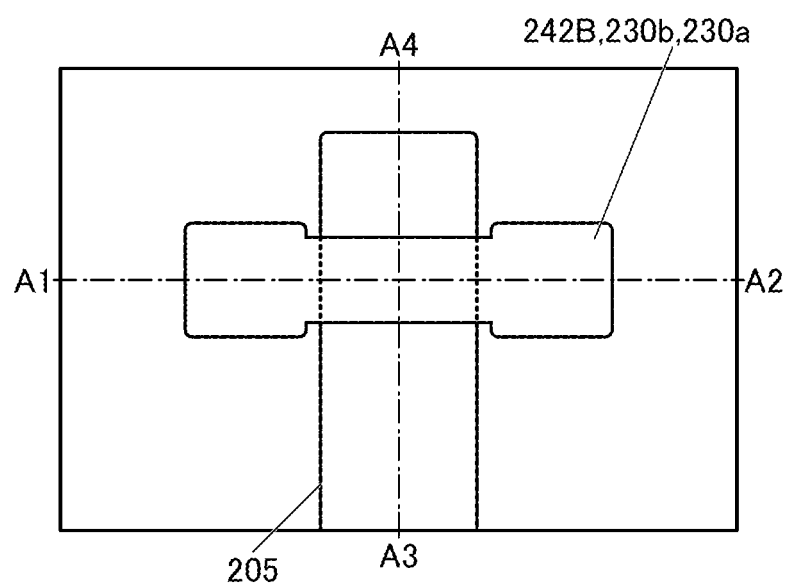
FIG. 6A is a top view illustrating a method for manufacturing a semiconductor device according to one embodiment of the present invention.
Figure 6C:
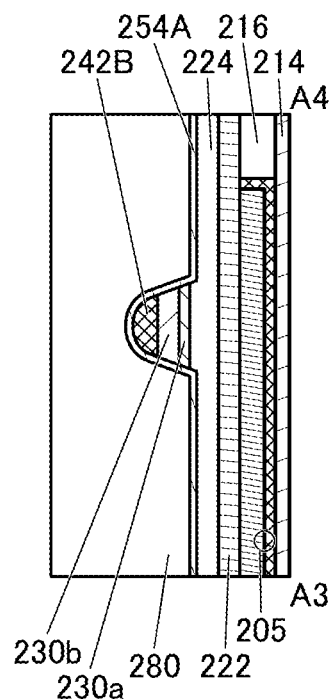
FIGS. 6B and 6C are cross-sectional views illustrating the method for manufacturing a semiconductor device according to one embodiment of the present invention.
Figure 6B:
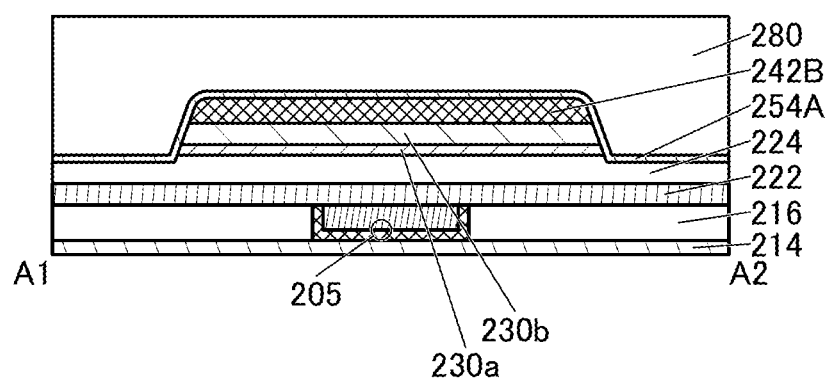
Figure 7A:
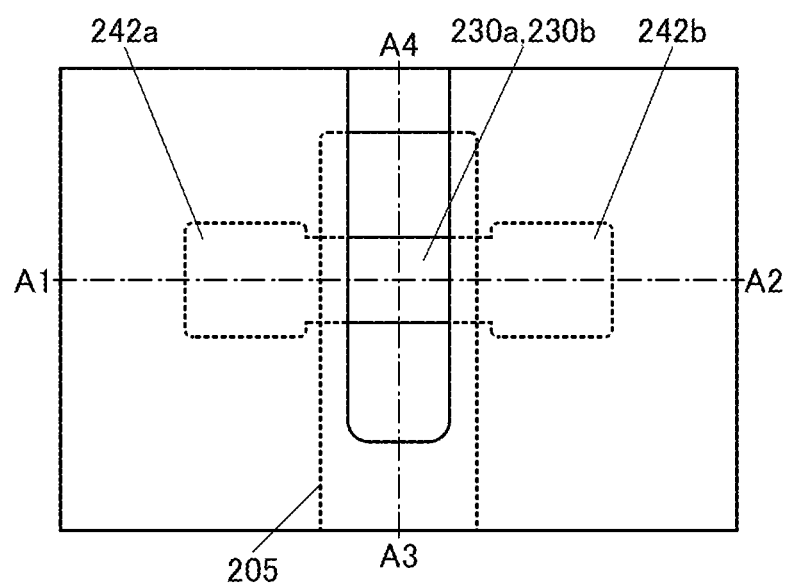
FIG. 7A is a top view illustrating a method for manufacturing a semiconductor device according to one embodiment of the present invention.
Figure 7C:
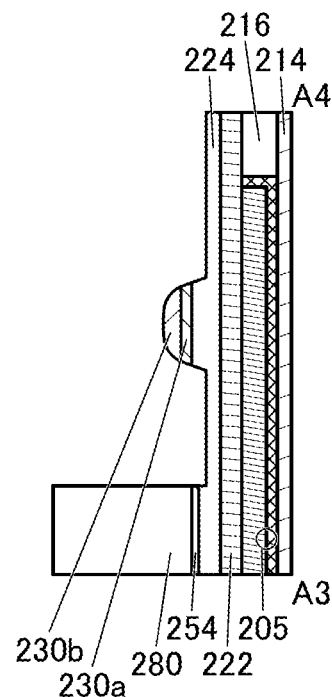
FIGS. 7B and 7C are cross-sectional views illustrating the method for manufacturing a semiconductor device according to one embodiment of the present invention.
Figure 7B:
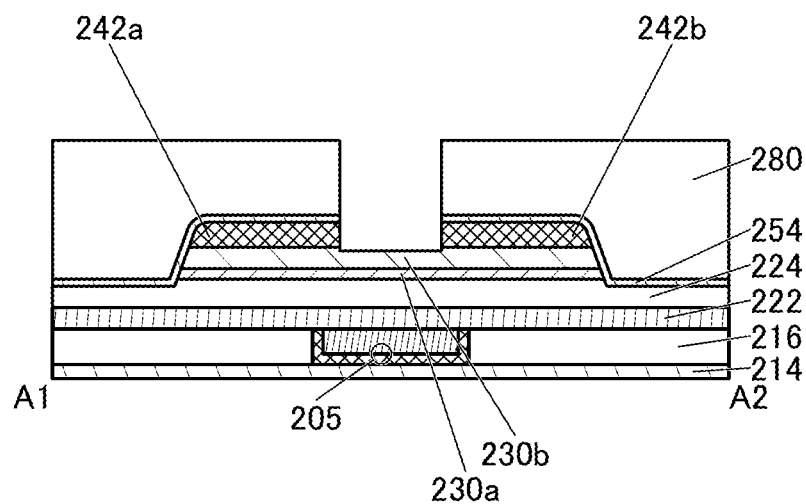
Figure 8A:
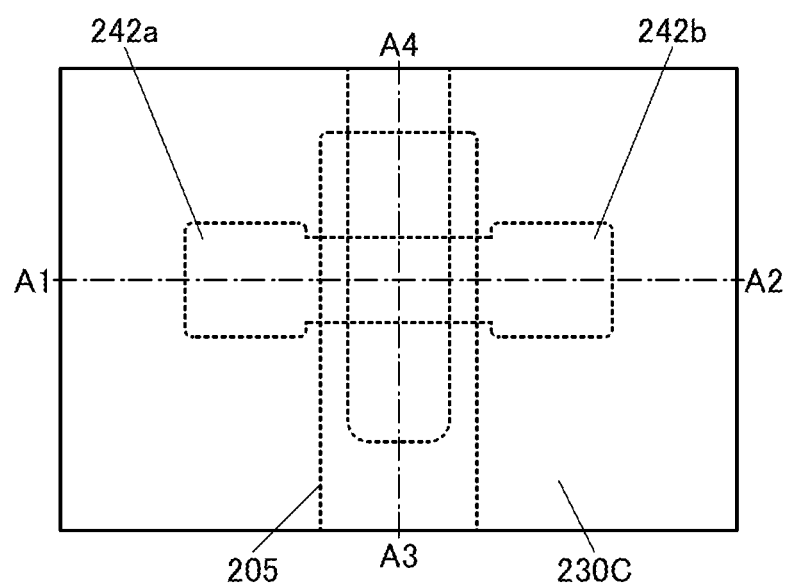
FIG. 8A is a top view illustrating a method for manufacturing a semiconductor device according to one embodiment of the present invention.
Figure 8C:
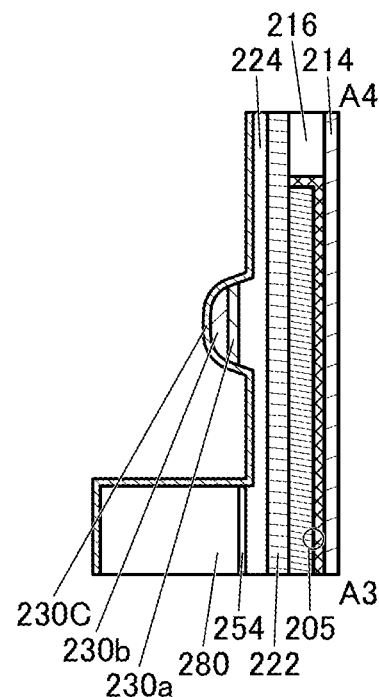
FIGS. 8B and 8C are cross-sectional views illustrating the method for manufacturing a semiconductor device according to one embodiment of the present invention.
Figure 8B:
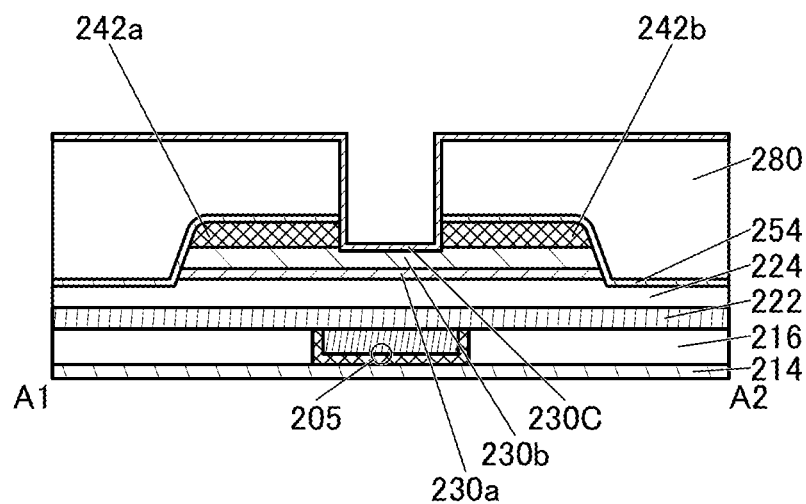
Figure 9A:
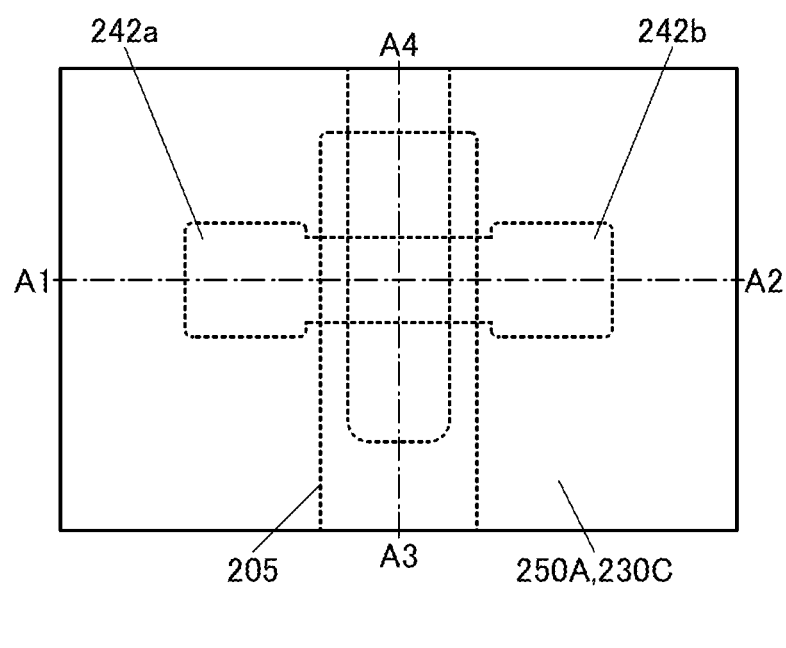
FIG. 9A is a top view illustrating a method for manufacturing a semiconductor device according to one embodiment of the present invention.
Figure 9C:
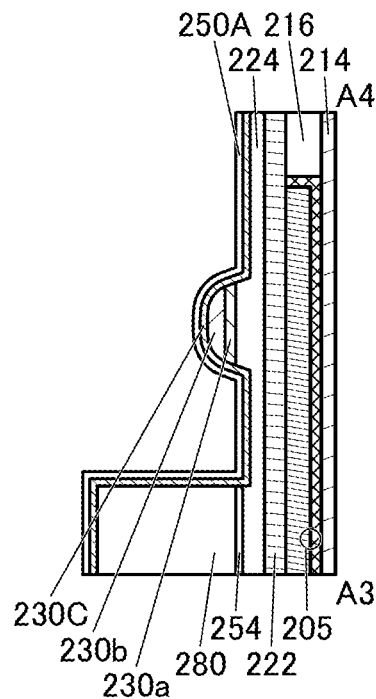
FIGS. 9B and 9C are cross-sectional views illustrating the method for manufacturing a semiconductor device according to one embodiment of the present invention.
Figure 9B:
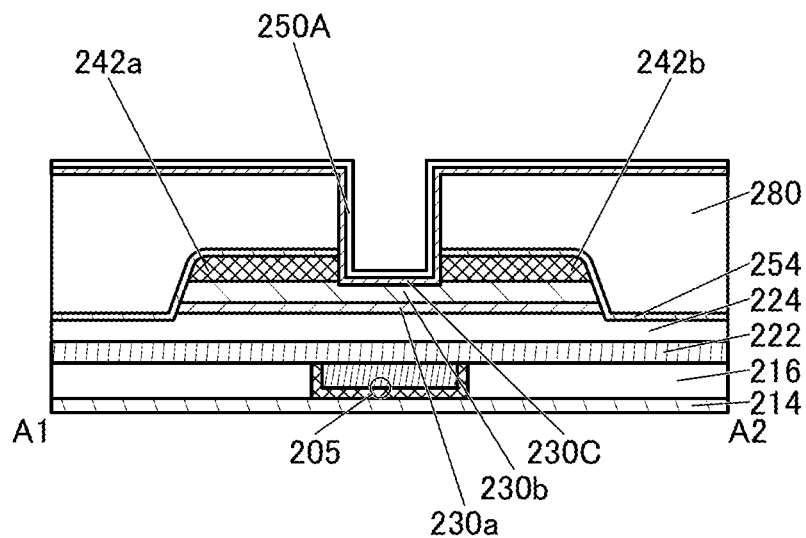
Figure 10A:
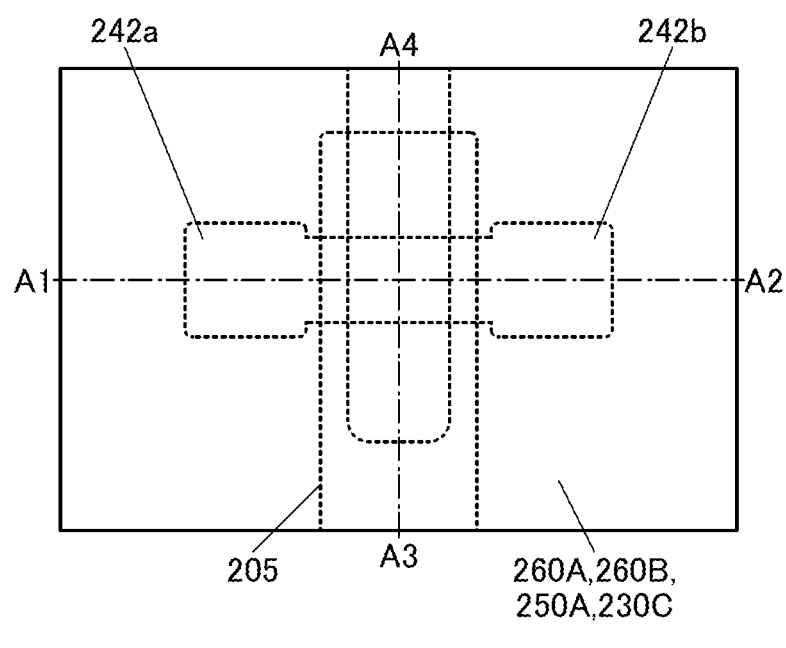
FIG. 10A is a top view illustrating a method for manufacturing a semiconductor device according to one embodiment of the present invention.
Figure 10C:
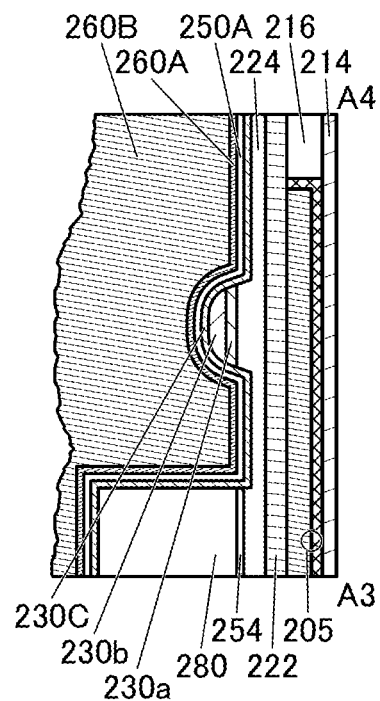
FIGS. 10B and 10C are cross-sectional views illustrating the method for manufacturing a semiconductor device according to one embodiment of the present invention.
Figure 10B:
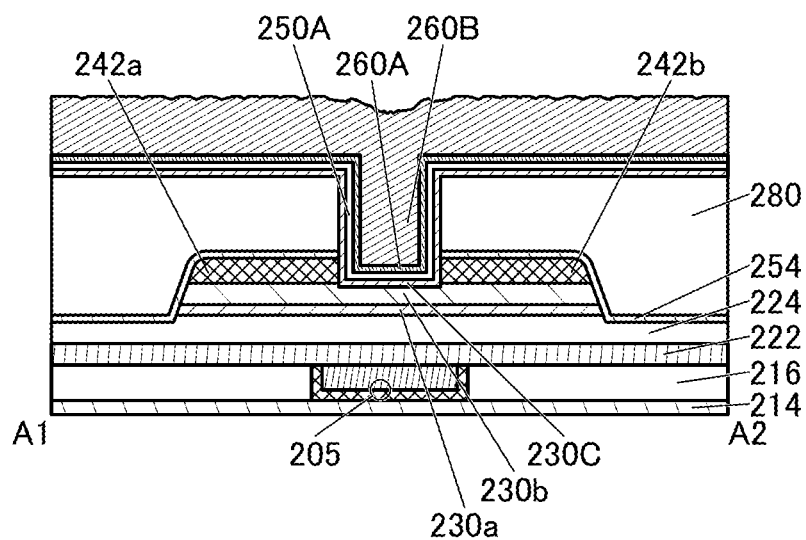

Then, an insulating film 254A is formed over the insulator 224, the oxide 230a, the oxide 230b, and the conductive layer 242B (see FIGS. 6B and 6C).

The insulating film 254A can be formed by a sputtering method, a CVD method, an MBE method, a PLD method, an ALD method, or the like. The insulating film 254A is preferably an insulating film having a function of inhibiting the passage of oxygen. For example, silicon nitride, silicon oxide, or aluminum oxide is deposited by a sputtering method.

Then, an insulating film to be the insulator 280 is formed over the insulating film 254A. The insulating film can be formed by a sputtering method, a CVD method, an MBE method, a PLD method, an ALD method, or the like. In this embodiment, as the insulating film, a silicon oxide film is formed by a CVD method or a sputtering method. Note that heat treatment may be performed before the formation of the insulating film. The heat treatment may be performed under a reduced pressure, and the insulating film may be successively formed without exposure to the air. By such treatment, moisture and hydrogen adsorbed on the surface of the insulating film 254A and the like can be removed, and the moisture concentration and the hydrogen concentration in the oxide 230a, the oxide 230b, and the insulating film 254A can be reduced. The above-described heat treatment conditions can be employed.

The insulating film to be the insulator 280 may have a multilayer structure, for example, a structure in which a silicon oxide film is formed by a sputtering method and another silicon oxide film is formed thereover by a CVD method.

Next, the insulating film to be the insulator 280 is subjected to CMP treatment, whereby the insulator 280 having a flat top surface is formed (see FIGS. 6B and 6C).

Subsequently, the insulator 280, the insulating film 254A, and the conductive layer 242B are partly processed to form an opening reaching the oxide 230b. The opening is preferably formed to overlap the conductor 205. The conductor 242a, the conductor 242b, and the insulator 254 are formed by the formation of the opening. At this time, the thickness of the oxide 230b in a region overlapped by the opening may be reduced (see FIGS. 7A to 7C).

Alternatively, part of the insulator 280, part of the insulating film 254A, and part of the conductive layer 242B may be processed under different conditions. For example, part of the insulator 280 may be processed by a dry etching method, part of the insulating film 254A may be processed by a wet etching method, and part of the conductive layer 242B may be processed by a dry etching method.

Here, it is preferable to remove impurities that are attached onto the surfaces of the oxides 230a and 230b or diffused into the oxides 230a and 230b, for example. The impurities result from components contained in the insulator 280, the insulating film 254A, and the conductive layer 242B; components contained in a member of an apparatus used to form the opening; and components contained in a gas or a liquid used for etching, for instance. Examples of the impurities include aluminum, silicon, tantalum, fluorine, and chlorine.

To remove the impurities or the like, cleaning may be performed. As the cleaning, any of wet cleaning using a cleaning solution or the like, plasma treatment using plasma, cleaning by heat treatment, and the like can be performed by itself or in appropriate combination.

The wet cleaning may be performed using an aqueous solution in which ammonia water, oxalic acid, phosphoric acid, hydrofluoric acid, or the like is diluted with carbonated water or pure water; pure water; or carbonated water, for example. Alternatively, ultrasonic cleaning using such an aqueous solution, pure water, or carbonated water may be performed. Further alternatively, such cleaning methods may be performed in combination as appropriate.

Then, heat treatment may be performed. The heat treatment is preferably performed in an oxygen-containing atmosphere. The heat treatment may be performed under a reduced pressure, and an oxide film 230C may be successively formed without exposure to the air (see FIGS. 8A to 8C). By such treatment, moisture and hydrogen adsorbed on the surface of the oxide 230b and the like can be removed, and the moisture concentration and the hydrogen concentration in the oxide 230a and the oxide 230b can be reduced. The temperature of the heat treatment ranges preferably from 100° C. to 400° C. In this embodiment, the temperature of the heat treatment is 200° C.

The oxide film 230C can be formed by a sputtering method, a CVD method, an MBE method, a PLD method, an ALD method, or the like. The oxide film 230C is formed by a method similar to that for the oxide film 230A or the oxide film 230B in accordance with the characteristics required for the oxide 230c. In this embodiment, the oxide film 230C is formed by a sputtering method using an In—Ga—Zn oxide target having an atomic ratio of In:Ga:Zn=1:3:4 or 4:2:4.1. Alternatively, the oxide film 230C is formed by a sputtering method in the following manner: a film is formed using an In—Ga—Zn oxide target having an atomic ratio of In:Ga:Zn=4:2:4.1, and another film is formed thereover using an In—Ga—Zn oxide target having an atomic ratio of In:Ga:Zn=1:3:4.

Part of oxygen contained in the sputtering gas is sometimes supplied to the oxides 230a and 230b during the formation of the oxide film 230C. Therefore, the proportion of oxygen in the sputtering gas for the oxide film 230C is preferably 70% or higher, further preferably 80% or higher, still further preferably 100%.

Next, heat treatment may be performed. The heat treatment may be performed under a reduced pressure, and an insulating film 250A may be successively formed without exposure to the air. By such treatment, moisture and hydrogen adsorbed on the surface of the oxide film 230C and the like can be removed, and the moisture concentration and the hydrogen concentration in the oxides 230a and 230b and the oxide film 230C can be reduced. The temperature of the heat treatment ranges preferably from 100° C. to 400° C. (see FIGS. 9A to 9C).

The insulating film 250A can be formed by a sputtering method, a CVD method, an MBE method, a PLD method, an ALD method, or the like. In this embodiment, silicon oxynitride is deposited as the insulating film 250A by a CVD method. The formation temperature of the insulating film 250A is preferably higher than or equal to 350° C. and lower than 450° C., particularly preferably approximately 400° C. When the insulating film 250A is formed at 400° C., an insulating film having few impurities can be formed.

Next, a conductive film 260A and a conductive film 260B are formed in this order. The conductive film 260A and the conductive film 260B can be formed by a sputtering method, a CVD method, an MBE method, a PLD method, an ALD method, or the like. In this embodiment, the conductive film 260A is formed by an ALD method, and the conductive film 260B is formed by a CVD method (see FIGS. 10A to 10C).

Figure 11A:
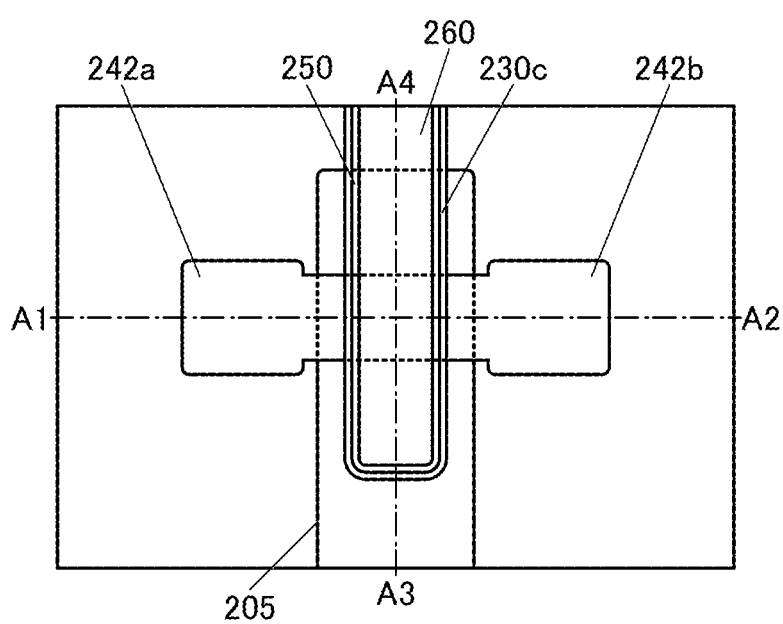
FIG. 11A is a top view illustrating a method for manufacturing a semiconductor device according to one embodiment of the present invention.
Figure 11C:
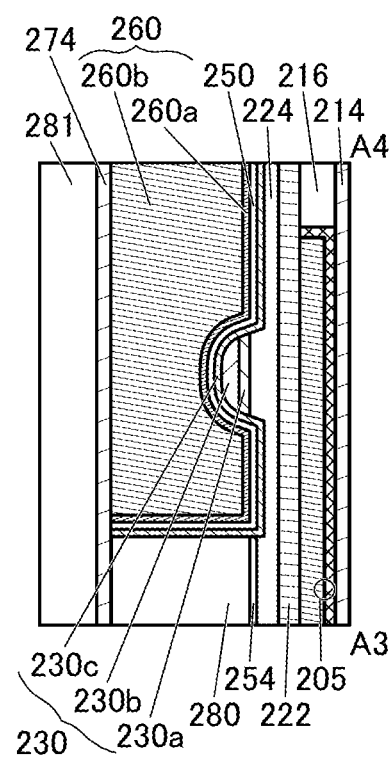
FIGS. 11B and 11C are cross-sectional views illustrating the method for manufacturing a semiconductor device according to one embodiment of the present invention.
Figure 11B:
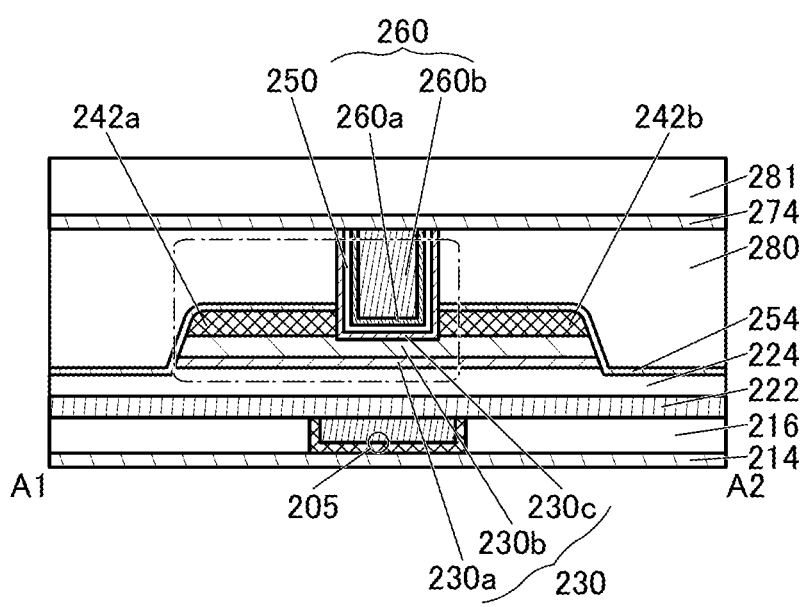

Then, the oxide film 230C, the insulating film 250A, the conductive film 260A, and the conductive film 260B are polished by CMP treatment until the insulator 280 is exposed, whereby the oxide 230c, the insulator 250, and the conductor 260 (the conductor 260a and the conductor 260b) are formed (see FIGS. 11A to 11C). Accordingly, the oxide 230c is positioned to cover the inner wall (the sidewall and the bottom surface) of the opening that reaches the oxide 230b. The insulator 250 is positioned to cover the inner wall of the opening with the oxide 230c placed therebetween. The conductor 260 is positioned to fill the opening with the oxide 230c and the insulator 250 placed therebetween.

Subsequently, heat treatment may be performed. In this embodiment, the heat treatment is performed at 400° C. in a nitrogen atmosphere for one hour. The heat treatment can reduce the moisture concentration and the hydrogen concentration in the insulator 250 and the insulator 280.

Next, the insulator 274 is formed over the oxide 230c, the insulator 250, the conductor 260, and the insulator 280. The insulator 274 can be formed by a sputtering method, a CVD method, an MBE method, a PLD method, an ALD method, or the like. As the insulator 274, an aluminum oxide film or a silicon nitride film is preferably formed by a sputtering method, for example. With an aluminum oxide film or a silicon nitride film formed by a sputtering method, hydrogen contained in the insulator 281 can be prevented from diffusing into the oxide 230. The insulator 274 formed in contact with the conductor 260 can inhibit oxidation of the conductor 260.

When an aluminum oxide film is formed as the insulator 274 by a sputtering method, oxygen can be supplied to the insulator 280. Oxygen supplied to the insulator 280 is sometimes supplied to the channel formation region in the oxide 230b through the oxide 230c. Furthermore, when oxygen is supplied to the insulator 280, oxygen contained in the insulator 280 before the formation of the insulator 274 may be supplied to the channel formation region in the oxide 230b through the oxide 230c.

The insulator 274 may have a multilayer structure, for example, a structure in which an aluminum oxide film is formed by a sputtering method and a silicon nitride film is formed over the aluminum oxide film by a sputtering method.

Then, heat treatment may be performed. For the heat treatment, the above-described heat treatment conditions can be employed. The heat treatment can reduce the moisture concentration and the hydrogen concentration in the insulator 280. Moreover, oxygen contained in the insulator 274 can be injected into the insulator 280.

Before the insulator 274 is formed, the following steps may be performed: first, an aluminum oxide film is formed over the insulator 280 and the like by a sputtering method, heat treatment is performed under the above heat treatment conditions, and then the aluminum oxide film is removed by CMP treatment. Through these steps, a larger number of excess-oxygen regions can be formed in the insulator 280. Note that in these steps, the insulator 280, the conductor 260, the insulator 250, and the oxide 230c are partly removed in some cases.

An insulator may be provided between the insulator 280 and the insulator 274. As the insulator, silicon oxide deposited by a sputtering method can be used, for example. Providing the insulator can form an excess-oxygen region in the insulator 280.

Next, the insulator 281 may be formed over the insulator 274. The insulator 281 can be formed by a sputtering method, a CVD method, an MBE method, a PLD method, an ALD method, or the like (see FIGS. 11B and 11C).

Subsequently, openings reaching the conductors 242a and 242b are formed in the insulators 254, 280, 274, and 281. The openings are formed by a lithography method.

Then, an insulating film to be the insulator 241a and the insulator 241b is formed and subjected to anisotropic etching, so that the insulator 241a and the insulator 241b are formed. The insulating film can be formed by a sputtering method, a CVD method, an MBE method, a PLD method, an ALD method, or the like. The insulating film preferably has a function of inhibiting the passage of oxygen. For example, an aluminum oxide film is preferably formed by an ALD method. Alternatively, a silicon nitride film may be formed by an ALD method or a CVD method. For the anisotropic etching, a dry etching method may be employed, for example. The sidewall portions of the openings having such a structure can prevent transmission of oxygen from the outside and oxidation of the conductor 240a and the conductor 240b to be formed in the next step. Moreover, impurities such as water and hydrogen can be prevented from diffusing from the conductors 240a and 240b to the outside.

Next, a conductive film to be the conductor 240a and the conductor 240b is formed. The conductive film preferably has a stacked-layer structure including a conductor with a function of inhibiting diffusion of impurities such as water and hydrogen. For example, a stacked-layer structure of tantalum nitride, titanium nitride, or the like and tungsten, molybdenum, copper, or the like can be employed. The conductive film can be formed by a sputtering method, a CVD method, an MBE method, a PLD method, an ALD method, or the like.

Then, the conductive film to be the conductors 240a and 240b is partly removed by CMP treatment to expose the insulator 281. As a result, the conductive film remains only in the openings, whereby the conductors 240a and 240b having flat top surfaces can be formed (see FIGS. 1A to 1C). Note that the insulator 281 is partly removed by the CMP treatment in some cases.

Through the above process, the semiconductor device including the transistor 200 illustrated in FIGS. 1A to 1C can be manufactured.

One embodiment of the present invention can provide a highly reliable semiconductor device. One embodiment of the present invention can provide a semiconductor device with favorable electrical characteristics. One embodiment of the present invention can provide a semiconductor device with a high on-state current. One embodiment of the present invention can provide a miniaturized or highly integrated semiconductor device. One embodiment of the present invention can provide a semiconductor device with low power consumption.

The structures, the methods, and the like described in this embodiment can be combined as appropriate with any of the structures, the methods, and the like described in the other embodiments and examples.

Embodiment 2

In this embodiment, one embodiment of a semiconductor device (a memory device) will be described with reference to FIG. 12 and FIG. 13.

[Memory device 1]

Figure 12:
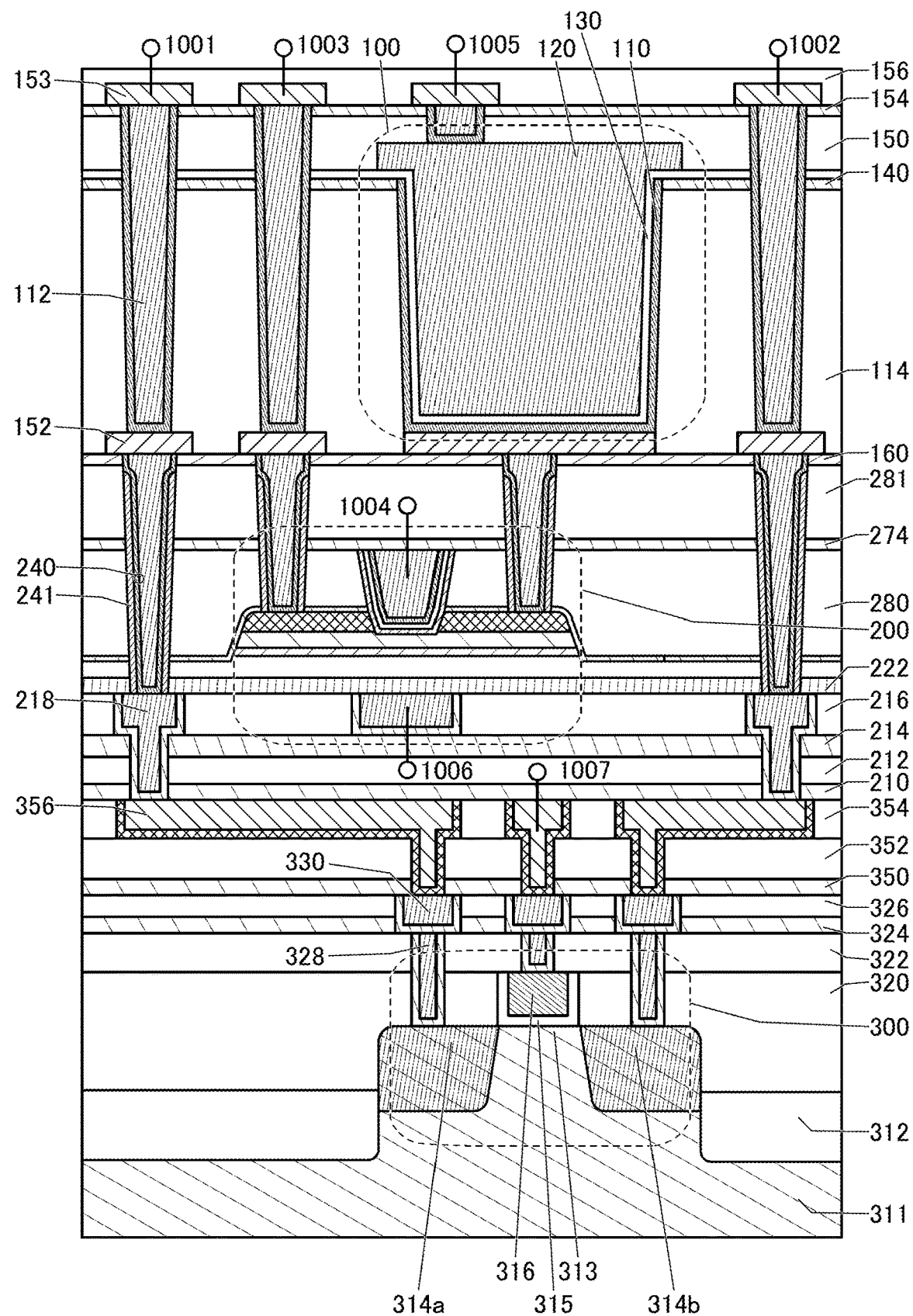
FIG. 12 is a cross-sectional view illustrating a structure of a memory device of one embodiment of the present invention.

FIG. 12 illustrates an example of a memory device using the semiconductor device of one embodiment of the present invention. In the memory device in this embodiment, the transistor 200 is provided above a transistor 300, and a capacitor 100 is provided above the transistor 200. Preferably, at least part of the capacitor 100 or the transistor 300 overlaps with the transistor 200. In such cases, the area occupied by the capacitor 100, the transistor 200, and the transistor 300 in the top view can be reduced, whereby the memory device in this embodiment can be miniaturized or highly integrated. The memory device in this embodiment can be applied to logic circuits typified by a central processing unit (CPU) and a graphics processing unit (GPU) and memory circuits typified by dynamic random access memory (DRAM) and nonvolatile memory (NVM), for example.

The transistor 200 can be the transistor 200 described in Embodiment 1. Therefore, the description in Embodiment 1 can be referred to for the transistor 200 and the layer including the transistor 200.

The transistor 200 is a transistor whose channel is formed in a semiconductor layer containing an oxide semiconductor. Since the transistor 200 has a low off-state current, a memory device including the transistor 200 can retain stored data for a long time. In other words, such a memory device does not require refresh operation or has an extremely low frequency of refresh operation, leading to a sufficient reduction in power consumption of the memory device. The transistor 200 exhibits favorable electrical characteristics at high temperatures, in comparison with a transistor including silicon in a semiconductor layer. For example, the transistor 200 has favorable electrical characteristics even in the temperature range of 125° C. to 150° C. Moreover, the transistor 200 has an on/off ratio of $10^{10}$ or larger in the temperature range of 125° C. to 150° C. In other words, in comparison with a transistor including silicon in a semiconductor layer, the transistor 200 excels in characteristics such as on-state current and frequency characteristics at higher temperatures.

In the semiconductor device illustrated in FIG. 12, a wiring 1001 is electrically connected to a source of the transistor 300. A wiring 1002 is electrically connected to a drain of the transistor 300. A wiring 1007 is electrically connected to a gate of the transistor 300. A wiring 1003 is electrically connected to one of the source and the drain of the transistor 200. A wiring 1004 is electrically connected to the first gate of the transistor 200. A wiring 1006 is electrically connected to the second gate of the transistor 200. The other of the source and the drain of the transistor 200 is electrically connected to one electrode of the capacitor 100. A wiring 1005 is electrically connected to the other electrode of the capacitor 100.

The semiconductor device in FIG. 12 is capable of retaining charge stored in the one electrode of the capacitor 100 by switching of the transistor 200; thus, data writing, retention, and reading can be performed. The transistor 200 is an element having the source, the gate (top gate), the drain, and the back gate. That is, the transistor 200 is a four-terminal element; hence, its input and output can be controlled independently of each other in a simpler manner than that in two-terminal elements typified by magnetoresistive random access memory (MRAM) utilizing magnetic tunnel junction (MTJ) properties, resistive random access memory (ReRAM), and phase-change memory. In addition, the structure of MRAM, ReRAM, and phase-change memory may change at the atomic level when data is rewritten. In contrast, in the semiconductor device in FIG. 12, data rewriting is performed by charging or discharging of electrons with the transistor and the capacitor; thus, the semiconductor device features in high write endurance and a few structure changes.

A memory cell array can be formed by arranging the semiconductor devices in FIG. 12 in a matrix. In this case, the transistor 300 can be used for a read circuit, a driver circuit, or the like that is connected to the memory cell array. When the semiconductor device in FIG. 12 is used as a memory element, for example, an operating frequency of 200 MHz or higher is achieved at a driving voltage of 2.5 V and an evaluation environment temperature ranging from −40° C. to 85° C.

<Transistor 300>

The transistor 300 is provided on a substrate 311 and includes a conductor 316 functioning as a gate electrode, an insulator 315 functioning as a gate insulator, a semiconductor region 313 that is part of the substrate 311, and a low-resistance region 314a and a low-resistance region 314b functioning as a source region and a drain region.

Here, the insulator 315 is positioned over the semiconductor region 313, and the conductor 316 is positioned over the insulator 315. The transistors 300 formed in one layer are electrically isolated from each other by an insulator 312 functioning as an element isolation insulating layer. The insulator 312 can be formed using an insulator similar to that used for an insulator 326 described later, for example. The transistor 300 can be a p-channel transistor or an n-channel transistor.

The substrate 311 preferably contains a semiconductor such as a silicon-based semiconductor, particularly single crystal silicon, in and around a region where a channel is formed in the semiconductor region 313, in the low-resistance regions 314a and 314b functioning as the source and drain regions, and the like. Alternatively, the substrate 311 may be formed using a material including germanium (Ge), silicon germanium (SiGe), gallium arsenide (GaAs), gallium aluminum arsenide (GaAlAs), or the like. The substrate 311 may be formed using silicon whose effective mass is adjusted by applying stress to crystal lattices and thereby changing the lattice spacing. Alternatively, the transistor 300 may be a high-electron-mobility transistor (HEMT) with the use of GaAs and GaAlAs, for example.

The low-resistance regions 314a and 314b contain an element that imparts n-type conductivity (e.g., arsenic or phosphorus) or an element that imparts p-type conductivity (e.g., boron), in addition to a semiconductor material used for the semiconductor region 313.

The conductor 316 functioning as a gate electrode can be formed using a semiconductor material such as silicon containing an element that imparts n-type conductivity (e.g., arsenic or phosphorus) or an element that imparts p-type conductivity (e.g., boron), or a conductive material such as a metal material, an alloy material, or a metal oxide material.

Note that the work function depends on a material used for the conductor; therefore, changing the material for the conductor can adjust the threshold voltage of the transistor. Specifically, titanium nitride, tantalum nitride, or the like is preferably used for the conductor. Furthermore, in order to ensure the conductivity and embeddability of the conductor, stacked layers of metal materials such as tungsten and aluminum are preferably used for the conductor. In particular, tungsten is preferable in terms of heat resistance.

In the transistor 300 illustrated in FIG. 12, the semiconductor region 313 (part of the substrate 311) in which a channel is formed has a projecting portion. Moreover, the conductor 316 is provided to cover the side and top surfaces of the semiconductor region 313 with the insulator 315 positioned therebetween. The transistor 300 having such a structure is also referred to as a FIN transistor because the projecting portion of a semiconductor substrate is utilized. An insulator functioning as a mask for forming the projecting portion may be provided in contact with the top surface of the projecting portion. Although the case where the projecting portion is formed by processing part of the semiconductor substrate is described here, a semiconductor film having a projecting shape may be formed by processing an SOI substrate.

Note that the transistor 300 illustrated in FIG. 12 is only an example and is not limited to having the structure shown therein; an appropriate transistor can be used in accordance with a circuit configuration or a driving method.

As illustrated in FIG. 12, the semiconductor device includes a stack of the transistor 300 and the transistor 200. For example, the transistor 300 can be formed using a silicon-based semiconductor material, and the transistor 200 can be formed using an oxide semiconductor. That is, in the semiconductor device in FIG. 12, a silicon-based semiconductor material and an oxide semiconductor can be used in different layers. The semiconductor device in FIG. 12 can be manufactured in a process similar to that employing an apparatus for manufacturing a semiconductor device containing a silicon-based semiconductor material, and can be highly integrated.

<Capacitor>

The capacitor 100 includes an insulator 114 over an insulator 160, an insulator 140 over the insulator 114, a conductor 110 in an opening formed in the insulators 114 and 140, an insulator 130 over the conductor 110 and the insulator 140, a conductor 120 over the insulator 130, and an insulator 150 over the conductor 120 and the insulator 130. Here, at least part of the conductor 110, the insulator 130, and the conductor 120 is provided in the opening in the insulators 114 and 140.

The conductor 110 functions as a lower electrode of the capacitor 100, the conductor 120 functions as an upper electrode of the capacitor 100, and the insulator 130 functions as a dielectric of the capacitor 100. The upper electrode and the lower electrode of the capacitor 100 face each other with the dielectric positioned therebetween, along the side surface as well as the bottom surface of the opening in the insulators 114 and 140; thus, the capacitance per unit area can be increased. Accordingly, the deeper the opening is, the larger the capacitance of the capacitor 100 can be. Increasing the capacitance per unit area of the capacitor 100 in this manner enhances miniaturization and integration of the semiconductor device.

The insulator 114 and the insulator 150 are formed using an insulator that can be used as the insulator 280. The insulator 140 preferably functions as an etching stopper at the time of forming the opening in the insulator 114 and is formed using an insulator that can be used as the insulator 214.

The shape of the opening formed in the insulators 114 and 140 when seen from above may be a quadrangular shape, a polygonal shape other than a quadrangular shape, a polygonal shape with rounded corners, or a circular shape such as an elliptical shape. Here, the area where the opening and the transistor 200 overlap each other is preferably larger in the top view. Such a structure can reduce the area occupied by the semiconductor device including the capacitor 100 and the transistor 200.

The conductor 110 is provided in contact with the opening formed in the insulators 140 and 114. Preferably, the top surface of the conductor 110 is substantially aligned with the top surface of the insulator 140. A conductor 152 provided over the insulator 160 is in contact with the bottom surface of the conductor 110. The conductor 110 is preferably formed by an ALD method, a CVD method, or the like and is formed using a conductor that can be used as the conductor 205, for example.

The insulator 130 is positioned to cover the conductor 110 and the insulator 140. The insulator 130 is preferably formed by an ALD method or a CVD method, for example. The insulator 130 can be formed to have a stacked-layer structure or a single-layer structure using, for example, silicon oxide, silicon oxynitride, silicon nitride oxide, silicon nitride, zirconium oxide, aluminum oxide, aluminum oxynitride, aluminum nitride oxide, aluminum nitride, hafnium oxide, hafnium oxynitride, hafnium nitride oxide, or hafnium nitride. As the insulator 130, an insulating film in which zirconium oxide, aluminum oxide, and zirconium oxide are stacked in order can be used, for instance.

The insulator 130 is preferably formed using a material with high dielectric strength, such as silicon oxynitride, or a high dielectric constant (high-k) material. The insulator 130 may have a stacked-layer structure using a material with high dielectric strength and a high dielectric (high-k) material.

Examples of a high dielectric constant (high-k) material (a material having a high dielectric constant) include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium. The use of such a high-k material enables sufficient capacitance of the capacitor 100 to be ensured even if the insulator 130 has a large thickness. The insulator 130 having a large thickness can inhibit leakage current generated between the conductor 110 and the conductor 120.

Examples of a material with high dielectric strength include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin. For example, it is possible to use an insulating film in which a silicon nitride film formed by an ALD method, a silicon oxide film formed by a PEALD method, and a silicon nitride film formed by an ALD method are stacked in this order. The use of such an insulator having high dielectric strength can increase the dielectric strength of the capacitor 100 and inhibit electrostatic breakdown of the capacitor 100.

The conductor 120 is provided to fill the opening formed in the insulators 140 and 114. The conductor 120 is electrically connected to the wiring 1005 through a conductor 112 and a conductor 153. The conductor 120 is preferably formed by an ALD method, a CVD method, or the like and is formed using a conductor that can be used as the conductor 205, for example.

Since the transistor 200 contains an oxide semiconductor, the transistor 200 is highly compatible with the capacitor 100. Specifically, since the transistor 200 containing an oxide semiconductor has a low off-state current, a combination of the transistor 200 and the capacitor 100 enables stored data to be retained for a long time.

<Wiring layer>

A wiring layer provided with an interlayer film, a wiring, a plug, and the like may be provided between the components. A plurality of wiring layers can be provided in accordance with the design. Here, a plurality of conductors functioning as plugs or wirings are collectively denoted by the same reference numeral in some cases. Furthermore, in this specification and the like, a wiring and a plug electrically connected to the wiring may be a single component. That is, part of a conductor functions as a wiring in some cases, and part of a conductor functions as a plug in other cases.

For example, over the transistor 300, an insulator 320, an insulator 322, an insulator 324, and an insulator 326 are stacked in this order as interlayer films. A conductor 328, a conductor 330, and the like that are electrically connected to the conductor 153 functioning as a terminal are embedded in the insulators 320, 322, 324, and 326. Note that the conductor 328 and the conductor 330 each function as a plug or a wiring.

The insulator functioning as an interlayer film may function as a planarization film that covers a roughness thereunder. For example, the top surface of the insulator 322 may be planarized by planarization treatment using a chemical mechanical polishing (CMP) method or the like to improve the planarity.

A wiring layer may be provided over the insulator 326 and the conductor 330. For example, an insulator 350, an insulator 352, and an insulator 354 are stacked in this order in FIG. 12. A conductor 356 is formed in the insulators 350, 352, and 354. The conductor 356 functions as a plug or a wiring.

An insulator 210, an insulator 212, the insulator 214, and the insulator 216 are stacked in this order over the insulator 354 and the conductor 356. A conductor 218, the conductor included in the transistor 200 (the conductor 205), and the like are embedded in the insulators 210, 212, 214, and 216. The conductor 218 functions as a plug or a wiring that is electrically connected to the transistor 300.

The conductor 112, the conductors included in the capacitor 100 (the conductors 120 and 110), and the like are embedded in the insulators 114, 140, 130, 150, and 154. The conductor 112 functions as a plug or a wiring that electrically connects the capacitor 100, the transistor 200, or the transistor 300 to the conductor 153 functioning as a terminal.

The conductor 153 is provided over the insulator 154 and is covered with an insulator 156. Here, the conductor 153 is in contact with the top surface of the conductor 112 and functions as a terminal of the capacitor 100, the transistor 200, or a transistor 300.

Examples of an insulator that can be used for an interlayer film include an insulating oxide, an insulating nitride, an insulating oxynitride, an insulating nitride oxide, an insulating metal oxide, an insulating metal oxynitride, and an insulating metal nitride oxide. For example, when a material having a low dielectric constant is used for the insulator functioning as an interlayer film, the parasitic capacitance between wirings can be reduced. Accordingly, a material is preferably selected depending on the function of an insulator.

For example, the insulators 320, 322, 326, 352, 354, 212, 114, 150, 156, and the like preferably include an insulator with a low dielectric constant. These insulators preferably include, for example, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or a resin. Alternatively, the insulators preferably have a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. Silicon oxide and silicon oxynitride have thermal stability; hence, a combination of silicon oxide or silicon oxynitride with a resin allows the stacked-layer structure to be thermally stable and have a low dielectric constant. Examples of the resin include polyester, polyolefin, polyamide (e.g., nylon and aramid), polyimide, polycarbonate, and acrylic.

It is preferred that the insulator provided over or under the conductor 152 or the conductor 153 have a resistivity of higher than or equal to $1.0 \times 10^{12}$ Ωcm and lower than or equal to $1.0 \times 10^{15}$ Ωcm, preferably higher than or equal to $5.0 \times 10^{12}$ Ωcm and lower than or equal to $1.0 \times 10^{14}$ Ωcm, further preferably higher than or equal to $1.0 \times 10^{13}$ Ωcm and lower than or equal to $5.0 \times 10^{13}$ Ωcm. The insulator provided over or under the conductor 152 or the conductor 153 preferably has a resistivity in the above range, in which case the insulator can disperse charge accumulated between the transistor 200, the transistor 300, the capacitor 100, and wirings such as the conductor 152 and prevent defective characteristics and electrostatic discharge of the transistor and the semiconductor device including the transistor due to the charge, while maintaining the insulating property. Silicon nitride or silicon nitride oxide can be used as such an insulator. For example, the resistivity of the insulator 160 or the insulator 154 is set within the above range.

When the transistor including an oxide semiconductor is surrounded by an insulator with a function of inhibiting the passage of oxygen and impurities such as hydrogen, the electrical characteristics of the transistor can be stable. Thus, the insulator with a function of inhibiting the passage of oxygen and impurities such as hydrogen is preferably used for the insulator 324, the insulator 350, the insulator 210, and the like.

The insulator having a function of inhibiting the passage of oxygen and impurities such as hydrogen can have, for example, a single-layer structure or a stacked-layer structure of an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. Specifically, as the insulator having a function of inhibiting the passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; silicon nitride; or the like can be used.

The conductors that can be used for wirings or plugs can be formed using a material containing one or more metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like. Alternatively, a semiconductor having high electric conductivity, typified by polycrystalline silicon containing an impurity element such as phosphorus, or silicide such as nickel silicide may be used.

For example, the conductors 328, 330, 356, 218, 112, 152, 153, and the like can have a single-layer structure or a stacked-layer structure using a conductive material such as a metal material, an alloy material, a metal nitride material, or a metal oxide material each of which contains any of the above materials. It is preferable to use a high-melting-point material that has both heat resistance and conductivity, such as tungsten or molybdenum, and it is particularly preferable to use tungsten. Alternatively, it is preferable to use a low-resistance conductive material such as aluminum or copper. The use of a low-resistance conductive material can reduce wiring resistance.

<Wiring or Plug In Layer Including Oxide Semiconductor>

When an oxide semiconductor is used in the transistor 200, an insulator including an excess-oxygen region is sometimes provided around the oxide semiconductor. In that case, an insulator having a barrier property is preferably provided between the insulator including the excess-oxygen region and a conductor provided in the insulator including the excess-oxygen region.

For example, in FIG. 12, the insulator 241 is preferably provided between the insulator 280 including excess oxygen and the conductor 240. When the insulator 241 and the insulator 274 are in contact with each other, the conductor 240 and the transistor 200 can be sealed by the insulators having a barrier property.

That is, the insulator 241 can prevent excess oxygen contained in the insulator 280 from being absorbed by the conductor 240. In addition, the insulator 241 can inhibit diffusion of hydrogen, which is an impurity, into the transistor 200 through the conductor 240.

Here, the conductor 240 functions as a plug or a wiring electrically connected to the transistor 200 or the transistor 300.

The above is the description of the structure example. With the use of this structure, the semiconductor device using the transistor including an oxide semiconductor can be miniaturized or highly integrated. In the semiconductor device using the transistor including an oxide semiconductor, a change in electrical characteristics can be inhibited and the reliability can be improved. In addition, a transistor that includes an oxide semiconductor and has a high on-state current can be provided. A transistor that includes an oxide semiconductor and has a low off-state current can be provided. A semiconductor device with low power consumption can be provided.

[Memory device 2]

Figure 13:
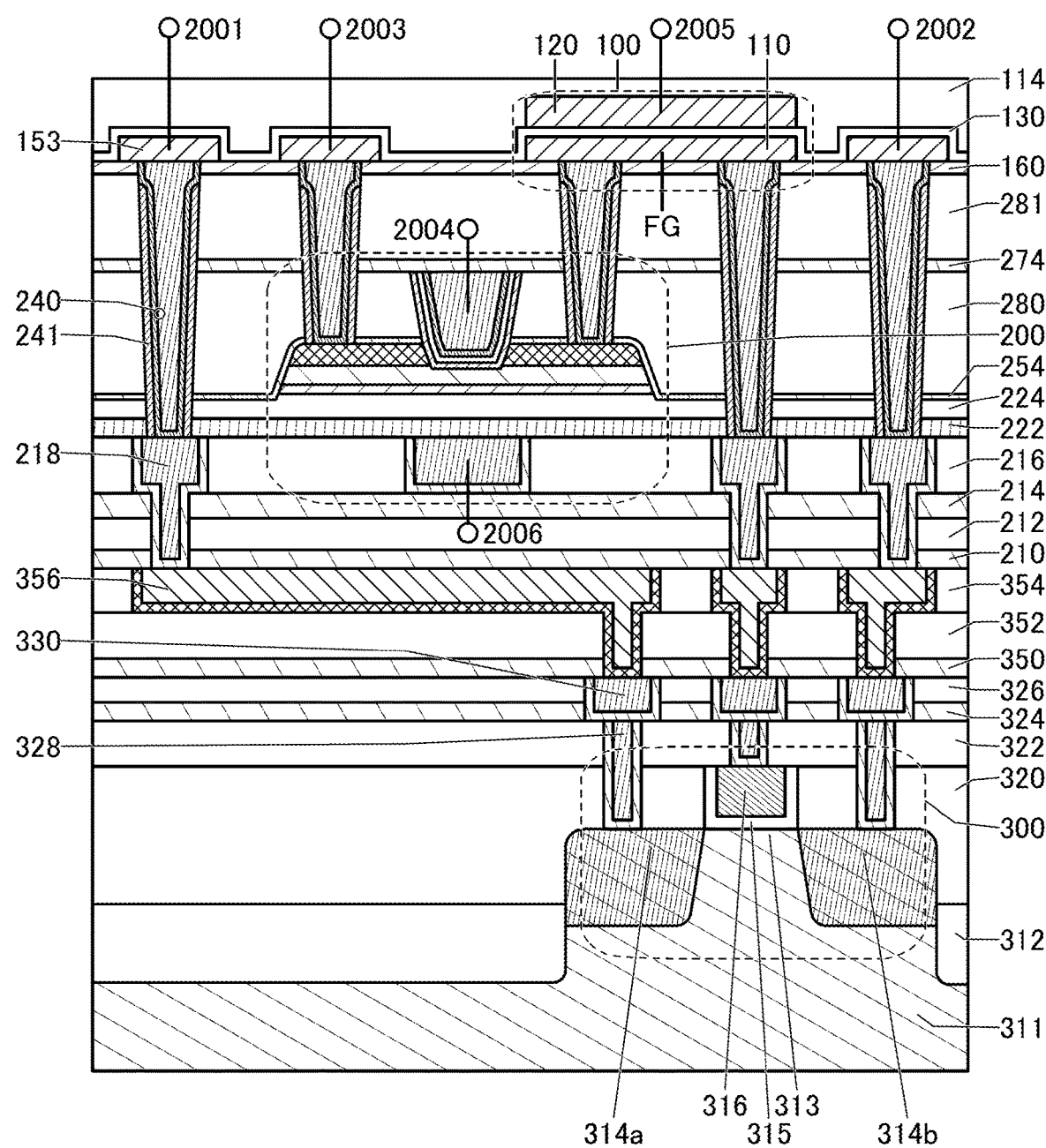
FIG. 13 is a cross-sectional view illustrating a structure of a memory device of one embodiment of the present invention.

FIG. 13 illustrates another example of a semiconductor device (a memory device) using the semiconductor device of one embodiment of the present invention. Like the semiconductor device in FIG. 12, the semiconductor device in FIG. 13 includes the transistor 200, the transistor 300, and the capacitor 100. Note that the semiconductor device in FIG. 13 differs from the semiconductor device in FIG. 12 in that the capacitor 100 is a planar capacitor and that the transistor 200 is electrically connected to the transistor 300.

In the semiconductor device of one embodiment of the present invention, the transistor 200 is provided above the transistor 300, and the capacitor 100 is provided above the transistor 300 and the transistor 200. Preferably, at least part of the capacitor 100 or the transistor 300 overlaps with the transistor 200. In such cases, the area occupied by the capacitor 100, the transistor 200, and the transistor 300 in the top view can be reduced, whereby the semiconductor device in this embodiment can be miniaturized or highly integrated.

Note that the transistor 200 and the transistor 300 can be the above-described transistor 200 and transistor 300. Therefore, the above description can be referred to for the transistors 200 and 300 and the layers including these transistors.

In the semiconductor device illustrated in FIG. 13, a wiring 2001 is electrically connected to the source of the transistor 300, and a wiring 2002 is electrically connected to the drain of the transistor 300. A wiring 2003 is electrically connected to one of the source and the drain of the transistor 200. A wiring 2004 is electrically connected to the first gate of the transistor 200. A wiring 2006 is electrically connected to the second gate of the transistor 200. The gate of the transistor 300 and the other of the source and the drain of the transistor 200 are electrically connected to one electrode of the capacitor 100. A wiring 2005 is electrically connected to the other electrode of the capacitor 100. Note that a node where the gate of the transistor 300, the other of the source and the drain of the transistor 200, and the one electrode of the capacitor 100 are connected to each other is hereinafter referred to as a node FG in some cases.

The semiconductor device in FIG. 13 is capable of retaining the potential of the gate of the transistor 300 (the node FG) by switching of the transistor 200; thus, data writing, retention, and reading can be performed.

By arranging the semiconductor devices in FIG. 13 in a matrix, a memory cell array can be formed.

The layer including the transistor 300 has the same structure as that in the semiconductor device in FIG. 12, and therefore the above description can be referred to for the structure below the insulator 354.

The insulator 210, the insulator 212, the insulator 214, and the insulator 216 are provided over the insulator 354. Here, like the insulator 350 and the like, the insulator 210 is preferably an insulator having a function of inhibiting the passage of oxygen and impurities such as hydrogen.

The conductor 218 is embedded in the insulators 210, 212, 214, and 216. The conductor 218 functions as a plug or a wiring that is electrically connected to the capacitor 100, the transistor 200, or the transistor 300. For example, the conductor 218 is electrically connected to the conductor 316 functioning as the gate electrode of the transistor 300.

The conductor 240 functions as a plug or a wiring that is electrically connected to the transistor 200 or the transistor 300. For example, the conductor 240 electrically connects the conductor 242b functioning as the other of the source and the drain of the transistor 200 and the conductor 110 functioning as the one electrode of the capacitor 100 through the conductor 240.

The planar capacitor 100 is provided above the transistor 200. The capacitor 100 includes the conductor 110 functioning as a first electrode, the conductor 120 functioning as a second electrode, and the insulator 130 functioning as a dielectric. Note that the conductor 110, the conductor 120, and the insulator 130 can be those described above in Memory device 1.

The conductor 153 and the conductor 110 are provided in contact with the top surface of the conductor 240. The conductor 153 is in contact with the top surface of the conductor 240 and functions as a terminal of the transistor 200 or the transistor 300.

The conductor 153 and the conductor 110 are covered with the insulator 130, and the conductor 120 is provided to overlap the conductor 110 with the insulator 130 placed therebetween. In addition, the insulator 114 is provided over the conductor 120 and the insulator 130.

Although FIG. 13 illustrates an example where a planar capacitor is used as the capacitor 100, the semiconductor device of this embodiment is not limited thereto. For example, the capacitor 100 may be a cylinder capacitor 100 as illustrated in FIG. 12.

This embodiment can be combined with any of the structures described in the other embodiments, examples and the like as appropriate.

Embodiment 3

In this embodiment, a memory device of one embodiment of the present invention including a transistor in which an oxide is used for a semiconductor (hereinafter sometimes referred to as an OS transistor) and a capacitor (hereinafter such a memory device is sometimes referred to as an OS memory device) will be described with reference to FIGS. 14A and 14B and FIGS. 15A to 15H. An OS memory device includes at least a capacitor and an OS transistor that controls the charging and discharging of the capacitor. Since the OS transistor has an extremely low off-state current, the OS memory device has excellent retention characteristics and can function as a nonvolatile memory.

<Structure Example of Memory Device>

Figure 14A:
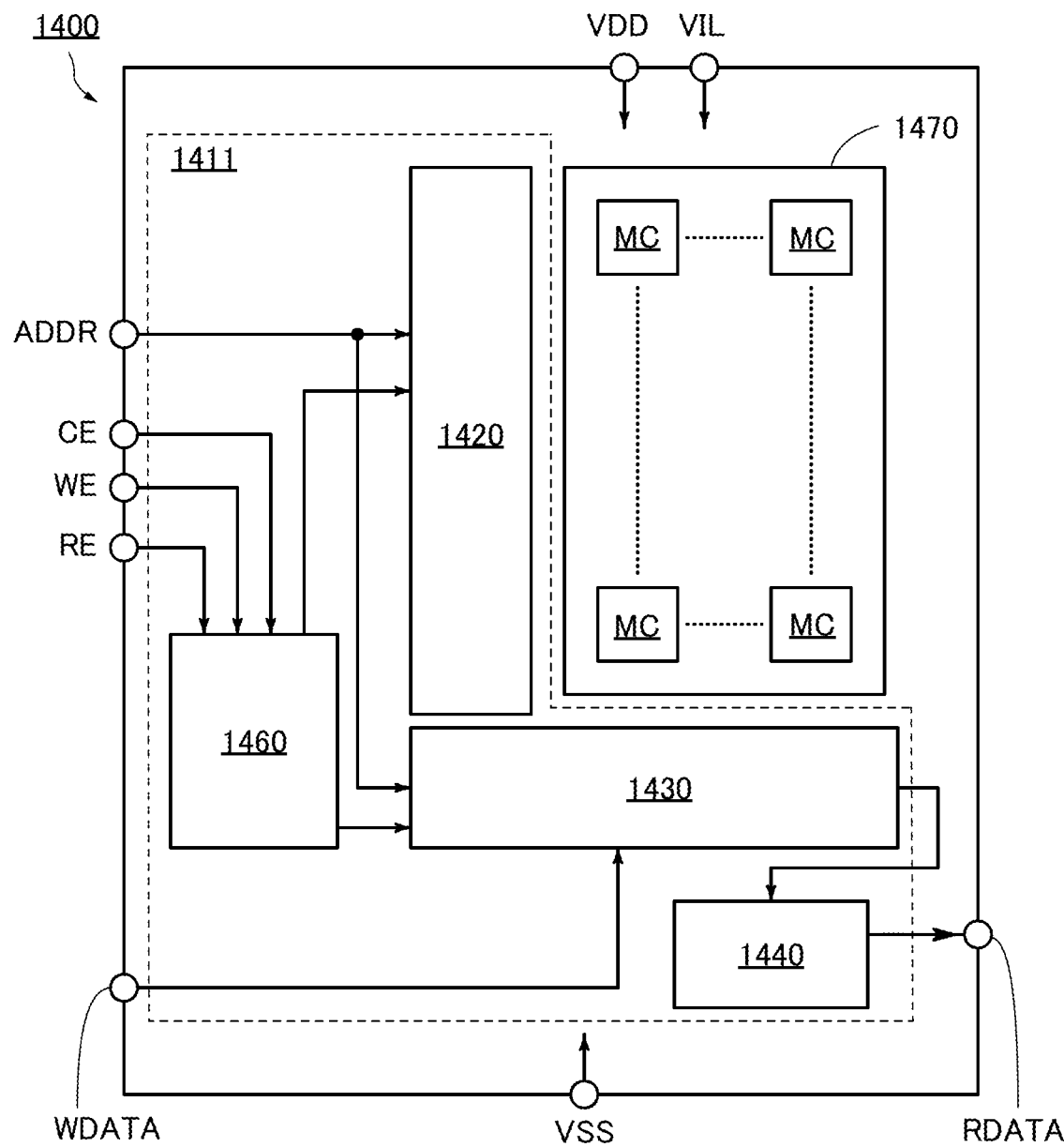
FIGS. 14A and 14B are block diagrams illustrating a structure example of a memory device of one embodiment of the present invention.

FIG. 14A illustrates a structure example of an OS memory device. A memory device 1400 includes a peripheral circuit 1411 and a memory cell array 1470. The peripheral circuit 1411 includes a row circuit 1420, a column circuit 1430, an output circuit 1440, and a control logic circuit 1460.

The column circuit 1430 includes a column decoder, a precharge circuit, a sense amplifier, and a write circuit, for example. The precharge circuit has a function of precharging wirings. The sense amplifier has a function of amplifying a data signal read from a memory cell. Note that the wirings mentioned above are connected to memory cells included in the memory cell array 1470 and will be described later in detail. The amplified data signal is output as a data signal RDATA to the outside of the memory device 1400 through the output circuit 1440. The row circuit 1420 includes a row decoder and a word line driver circuit, for example, and can select a row to be accessed.

As power supply voltages from the outside, a low power supply voltage (VSS), a high power supply voltage (VDD) for the peripheral circuit 1411, and a high power supply voltage (VIL) for the memory cell array 1470 are supplied to the memory device 1400. Control signals (CE, WE, and RE), an address signal ADDR, and a data signal WDATA are also input to the memory device 1400 from the outside. The address signal ADDR is input to the row decoder and the column decoder, and the data signal WDATA is input to the write circuit.

The control logic circuit 1460 processes the control signals (CE, WE, and RE) input from the outside, and generates control signals for the row decoder and the column decoder. The control signal CE is a chip enable signal, the control signal WE is a write enable signal, and the control signal RE is a read enable signal. Signals processed by the control logic circuit 1460 are not limited to the above, and other control signals may be input as necessary.

The memory cell array 1470 includes a plurality of memory cells MC arranged in a matrix and a plurality of wirings. Note that the number of wirings that connect the memory cell array 1470 and the row circuit 1420 depends on the configuration of the memory cell MC, the number of memory cells MC in one column, and the like. The number of wirings that connect the memory cell array 1470 and the column circuit 1430 depends on the configuration of the memory cell MC, the number of memory cells MC in one row, and the like.

Figure 14B:
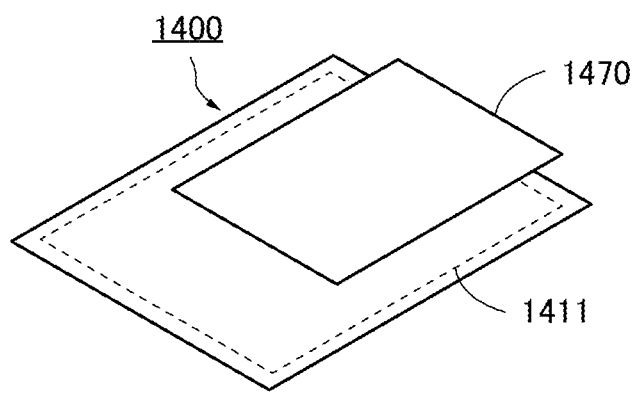

Note that FIG. 14A illustrates an example in which the peripheral circuit 1411 and the memory cell array 1470 are formed on the same plane; however, this embodiment is not limited thereto. For example, as illustrated in FIG. 14B, the memory cell array 1470 may be provided to partly overlap the peripheral circuit 1411. For example, the sense amplifier may be provided below the memory cell array 1470 so that they overlap each other.

FIGS. 15A to 15H illustrate configuration examples of memory cells that can be used as the memory cell MC.

[DOSRAM]

Figure 15A:
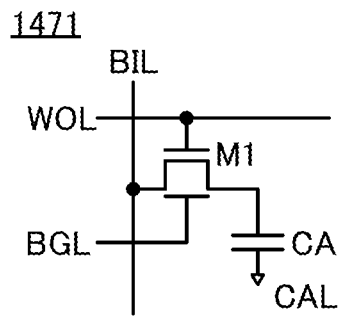
FIGS. 15A to 15H are circuit diagrams each illustrating a structure example of a memory device of one embodiment of the present invention.
Figure 15B:
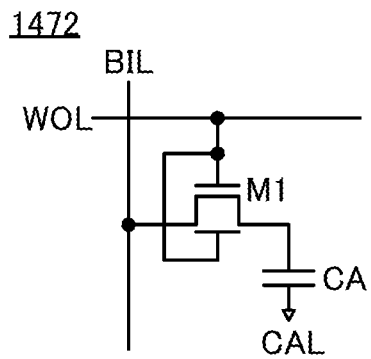
Figure 15C:
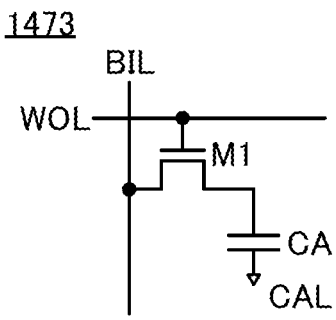

FIGS. 15A to 15C illustrate circuit configuration examples of a DRAM cell. In this specification and the like, a DRAM using a memory cell including one OS transistor and one capacitor is sometimes referred to as a dynamic oxide semiconductor random access memory (DOSRAM). A memory cell 1471 illustrated in FIG. 15A includes a transistor M1 and a capacitor CA. The transistor M1 includes a gate (also sometimes referred to as a top gate) and a back gate.

A first terminal of the transistor M1 is connected to a first terminal of the capacitor CA. A second terminal of the transistor M1 is connected to a wiring BIL. The gate of the transistor M1 is connected to a wiring WOL. The back gate of the transistor M1 is connected to a wiring BGL. A second terminal of the capacitor CA is connected to a wiring CAL.

The wiring BIL functions as a bit line, and the wiring WOL functions as a word line. The wiring CAL functions as a wiring for applying a predetermined potential to the second terminal of the capacitor CA. A low-level potential is preferably applied to the wiring CAL at the time of data writing and data reading. The wiring BGL functions as a wiring for applying a potential to the back gate of the transistor M1. The threshold voltage of the transistor M1 can be increased or decreased by supply of a given potential to the wiring BGL.

Here, the memory cell 1471 in FIG. 15A corresponds to the memory device in FIG. 12. That is, the transistor Ml, the capacitor CA, the wiring BIL, the wiring WOL, the wiring BGL, and the wiring CAL correspond to the transistor 200, the capacitor 100, the wiring 1003, the wiring 1004, the wiring 1006, and the wiring 1005, respectively. Note that the transistor 300 in FIG. 12 corresponds to a transistor provided in the peripheral circuit 1411 of the memory device 1400 in FIGS. 14A and 14B.

The memory cell MC is not limited to the memory cell 1471 and can have a different circuit configuration. For example, in the memory cell MC, the back gate of the transistor M1 may be connected to the wiring WOL instead of the wiring BGL as in a memory cell 1472 illustrated in FIG. 15B. As another example of the memory cell MC, the transistor M1 may be a single-gate transistor, that is, a transistor without a back gate as in a memory cell 1473 illustrated in FIG. 15C.

When the semiconductor device shown in the foregoing embodiment is used in the memory cell 1471 and the like, the transistor 200 can be used as the transistor M1 and the capacitor 100 can be used as the capacitor CA. When an OS transistor is used as the transistor Ml, the leakage current of the transistor M1 can be extremely low. That is, with the use of the transistor Ml, written data can be retained for a long time, and thus the frequency of refresh operation for the memory cell can be decreased. Alternatively, refresh operation for the memory cell can be omitted. In addition, since the transistor M1 has an extremely low leakage current, multi-level data or analog data can be retained in the memory cells 1471, 1472, and 1473.

In the DOSRAM, when the sense amplifier is provided below the memory cell array 1470 so that they overlap each other as described above, the bit line can be shortened. A shorter bit line results in a smaller bit line capacitance, which allows the storage capacitance of the memory cell to be reduced.

[NOSRAM]

FIGS. 15D to 15G illustrate circuit configuration examples of a gain memory cell including two transistors and one capacitor. A memory cell 1474 illustrated in FIG. 15D includes a transistor M2, a transistor M3, and a capacitor CB. The transistor M2 includes a top gate (simply referred to as a gate in some cases) and a back gate. In this specification and the like, a memory device including a gain memory cell using an OS transistor as the transistor M2 is sometimes referred to as a nonvolatile oxide semiconductor RAM (NOSRAM).

A first terminal of the transistor M2 is connected to a first terminal of the capacitor CB. A second terminal of the transistor M2 is connected to a wiring WBL. The gate of the transistor M2 is connected to the wiring WOL. The back gate of the transistor M2 is connected to the wiring BGL. A second terminal of the capacitor CB is connected to the wiring CAL. A first terminal of the transistor M3 is connected to a wiring RBL. A second terminal of the transistor M3 is connected to a wiring SL. A gate of the transistor M3 is connected to the first terminal of the capacitor CB.

The wiring WBL functions as a write bit line, the wiring RBL functions as a read bit line, and the wiring WOL functions as a word line. The wiring CAL functions as a wiring for applying a predetermined potential to the second terminal of the capacitor CB. A low-level potential is preferably applied to the wiring CAL at the time of data writing and reading and during data retention. The wiring BGL functions as a wiring for applying a predetermined potential to the back gate of the transistor M2. The threshold voltage of the transistor M2 can be increased or decreased by supply of a given potential to the wiring BGL.

Figure 15D:
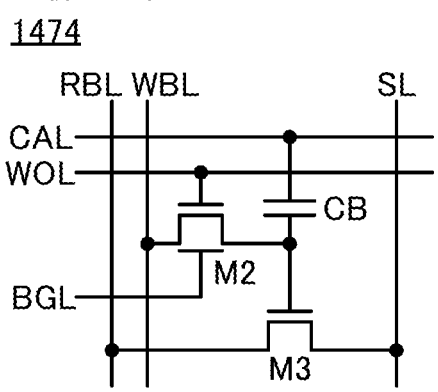
Figure 15E:
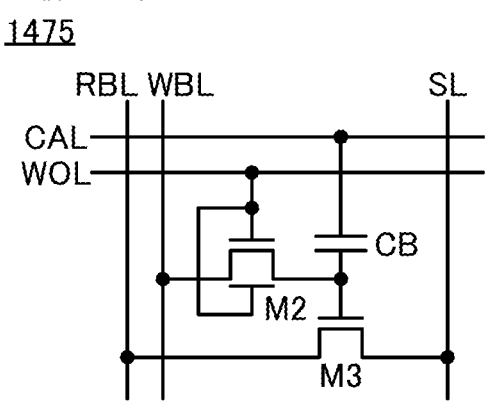
Figure 15F:
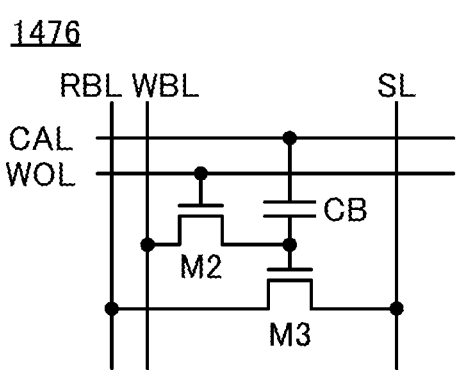
Figure 15G:
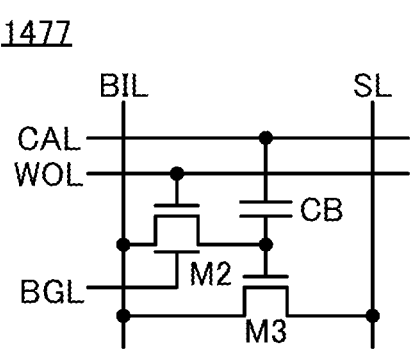

Here, the memory cell 1474 in FIG. 15D corresponds to the memory device in FIG. 13. That is, the transistor M2, the capacitor CB, the transistor M3, the wiring WBL, the wiring WOL, the wiring BGL, the wiring CAL, the wiring RBL, and the wiring SL correspond to the transistor 200, the capacitor 100, the transistor 300, the wiring 2003, the wiring 2004, the wiring 2006, the wiring 2005, the wiring 2002, and the wiring 2001, respectively.

The circuit configuration of the memory cell MC is not limited to that of the memory cell 1474, and the circuit configuration can be changed as appropriate. For example, in the memory cell MC, the back gate of the transistor M2 may be connected to the wiring WOL instead of the wiring BGL as in a memory cell 1475 illustrated in FIG. 15E. As another example of the memory cell MC, the transistor M2 may be a single-gate transistor, that is, a transistor without a back gate as in a memory cell 1476 illustrated in FIG. 15F. As another example of the memory cell MC, one wiring BIL may be provided instead of the wiring WBL and the wiring RBL as in a memory cell 1477 illustrated in FIG. 15G.

When the semiconductor device described in the foregoing embodiment is used in the memory cell 1474 and the like, the transistor 200 can be used as the transistor M2, the transistor 300 can be used as the transistor M3, and the capacitor 100 can be used as the capacitor CB. When an OS transistor is used as the transistor M2, the leakage current of the transistor M2 can be extremely low. That is, with the use of the transistor M2, written data can be retained for a long time, and thus the frequency of refresh operation for the memory cell can be decreased. Alternatively, refresh operation for the memory cell can be omitted. In addition, since the transistor M2 has an extremely low leakage current, multi-level data and analog data can be retained in the memory cell 1474. The same applies to the memory cells 1475 to 1477.

Note that the transistor M3 may be a transistor containing silicon in a channel formation region (hereinafter sometimes referred to as a Si transistor). A Si transistor may be either an n-channel transistor or a p-channel transistor. A Si transistor has higher field-effect mobility than an OS transistor in some cases. For that reason, a Si transistor may be used as the transistor M3 functioning as a read transistor. Furthermore, when a Si transistor is used as the transistor M3, the transistor M2 can be formed over the transistor M3, in which case the area of the memory cell can be reduced, leading to high integration of the memory device.

Alternatively, the transistor M3 may be an OS transistor. When an OS transistor is used as each of the transistors M2 and M3, the memory cell array 1470 can be formed using only n-channel transistors.

Figure 15H:
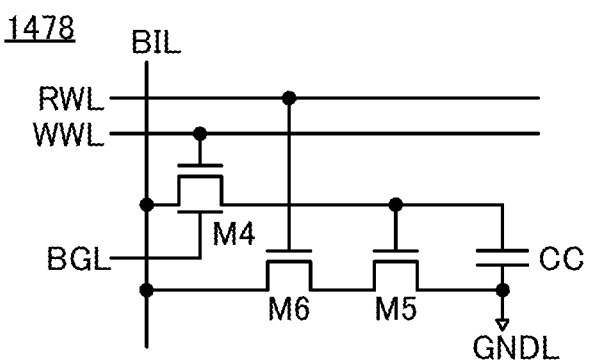

FIG. 15H illustrates an example of a gain memory cell including three transistors and one capacitor. A memory cell 1478 illustrated in FIG. 15H includes transistors M4 to M6 and a capacitor CC. The capacitor CC is provided as appropriate. The memory cell 1478 is electrically connected to the wiring BIL, a wiring RWL, a wiring WWL, the wiring BGL, and a wiring GNDL. The wiring GNDL is a wiring for supplying a low-level potential. Note that the memory cell 1478 may be electrically connected to the wiring RBL and the wiring WBL instead of the wiring BIL.

The transistor M4 is an OS transistor with a back gate that is electrically connected to the wiring BGL. Note that the back gate and the gate of the transistor M4 may be electrically connected to each other. Alternatively, the transistor M4 may not include the back gate.

Note that each of the transistors M5 and M6 may be an n-channel Si transistor or a p-channel Si transistor. Alternatively, the transistors M4 to M6 may be OS transistors, in which case the memory cell array 1470 can be formed using only n-channel transistors.

When the semiconductor device described in the foregoing embodiment is used in the memory cell 1478, the transistor 200 can be used as the transistor M4, the transistor 300 can be used as the transistors M5 and M6, and the capacitor 100 can be used as the capacitor CC. When an OS transistor is used as the transistor M4, the leakage current of the transistor M4 can be extremely low.

Note that the configurations of the peripheral circuit 1411, the memory cell array 1470, and the like shown in this embodiment are not limited to those described above. The arrangement and functions of these circuits and the wirings, circuit components, and the like connected to the circuits can be changed, removed, or added as needed.

The structures described in this embodiment can be used in appropriate combination with any of the structures described in the other embodiments, example, and the like.

Embodiment 4

In this embodiment, an example of a chip 1200 on which the semiconductor device of the present invention is mounted will be described with reference to FIGS. 16A and 16B. A plurality of circuits (systems) are mounted on the chip 1200. The technique for integrating a plurality of circuits (systems) on one chip is sometimes referred to as system on chip (SoC).

Figure 16A:
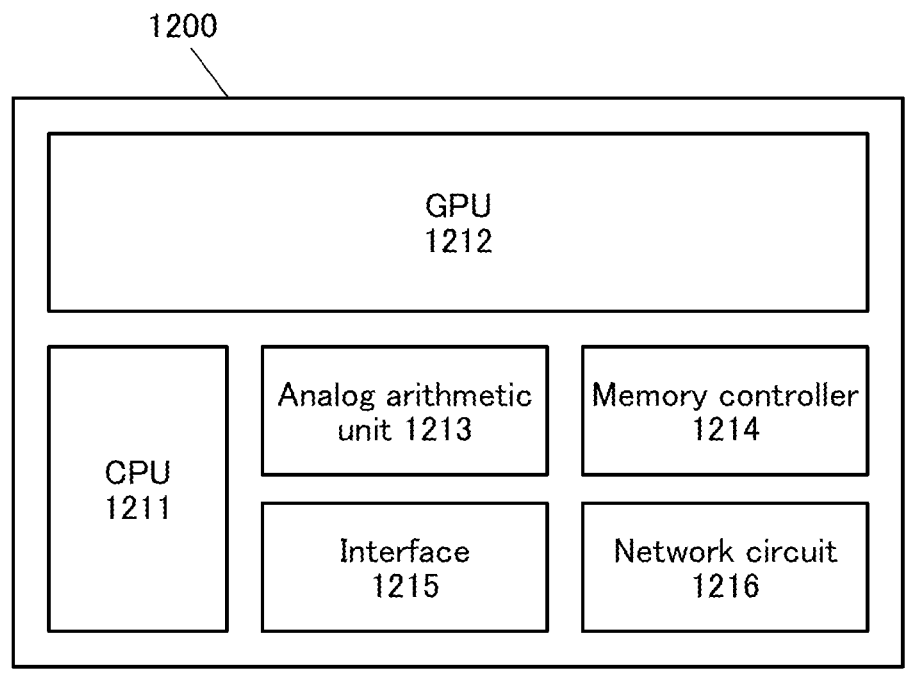
FIGS. 16A and 16B are schematic diagrams of a semiconductor device of one embodiment of the present invention.

As illustrated in FIG. 16A, the chip 1200 includes a CPU 1211, a GPU 1212, at least one analog arithmetic unit 1213, at least one memory controller 1214, at least one interface 1215, at least one network circuit 1216, and the like.

Figure 16B:
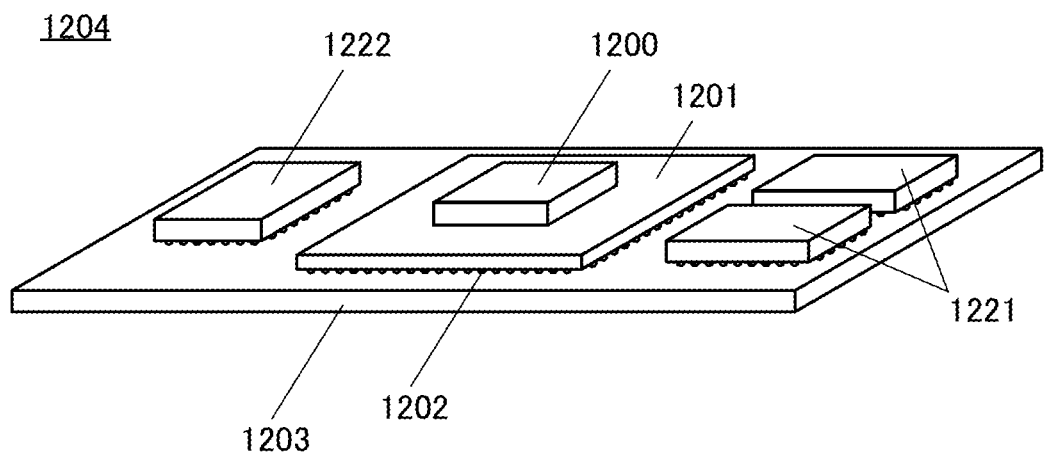

A bump (not illustrated) is provided on the chip 1200, and as illustrated in FIG. 16B, the chip 1200 is connected to a first surface of a printed circuit board (PCB) 1201. A plurality of bumps 1202 are provided on the rear side of the first surface of the PCB 1201, and the PCB 1201 is connected to a motherboard 1203.

Memory devices such as a DRAM 1221 and a flash memory 1222 may be provided on the motherboard 1203. For example, the DOSRAM described in the above embodiment can be used as the DRAM 1221. For example, the NOSRAM described in the above embodiment can be used as the flash memory 1222.

The CPU 1211 preferably includes a plurality of CPU cores. Furthermore, the GPU 1212 preferably includes a plurality of GPU cores. The CPU 1211 and the GPU 1212 may each include a memory for storing data temporarily. Alternatively, a common memory for the CPU 1211 and the GPU 1212 may be provided in the chip 1200. The NOSRAM or the DOSRAM described above can be used as the common memory. The GPU 1212 is suitable for parallel computation of a large quantity of data and thus can be used for image processing and product-sum operation. When an image processing circuit and a product-sum operation circuit that include an oxide semiconductor of the present invention are provided in the GPU 1212, image processing and product-sum operation can be performed with low power consumption.

Since the CPU 1211 and the GPU 1212 are provided in the same chip, a wiring between the CPU 1211 and the GPU 1212 can be shortened. Accordingly, data transfer from the CPU 1211 to the GPU 1212, data transfer between the memories included in the CPU 1211 and the GPU 1212, and transfer of arithmetic operation results from the GPU 1212 to the CPU 1211 after the arithmetic operation in the GPU 1212 can be performed at high speed.

The analog arithmetic unit 1213 includes one or both of an analog/digital (A/D) converter circuit and a digital/analog (D/A) converter circuit. Moreover, the analog arithmetic unit 1213 may include the above product-sum operation circuit.

The memory controller 1214 includes a circuit functioning as a controller of the DRAM 1221 and a circuit functioning as the interface of the flash memory 1222.

The interface 1215 includes an interface circuit to be connected to an external device such as a display device, a speaker, a microphone, a camera, or a controller. Examples of the controller include a mouse, a keyboard, and a game controller. As such an interface, a universal serial bus (USB), a high-definition multimedia interface (HDMI) (registered trademark), or the like can be used.

The network circuit 1216 includes a circuit for a network such as a local-area network (LAN). The network circuit 1216 may also include a circuit for network security.

In the chip 1200, the circuits (systems) can be formed in the same manufacturing process. Consequently, even when the number of circuits needed for the chip 1200 is increased, there is no need to increase the number of steps in the manufacturing process; thus, the chip 1200 can be manufactured at low cost.

The motherboard 1203 provided with the PCB 1201 on which the chip 1200 including the GPU 1212 is mounted, the DRAM 1221, and the flash memory 1222 can be referred to as a GPU module 1204.

The GPU module 1204 includes the chip 1200 formed using the SoC technology and thus can be small in size. Moreover, the GPU module 1204 is excellent in image processing, and thus is suitably used in a portable electronic device such as a smartphone, a tablet terminal, a laptop PC, or a portable (mobile) game console. Furthermore, the product-sum operation circuit using the GPU 1212 can implement techniques such as a deep neural network (DNN), a convolutional neural network (CNN), a recurrent neural network (RNN), an autoencoder, a deep Boltzmann machine (DBM), or a deep belief network (DBN); hence, the chip 1200 can be used as an AI chip or the GPU module 1204 can be used as an AI system module.

The structures described in this embodiment can be used in appropriate combination with any of the structures described in the other embodiments, example, and the like.

Embodiment 5

In this embodiment, application examples of a memory device using the semiconductor device described in the above embodiment will be described. The semiconductor device described in the above embodiment can be applied to, for example, memory devices of a variety of electronic devices (e.g., information terminals, computers, smartphones, e-book readers, digital cameras (including video cameras), video recording/reproducing devices, and navigation systems). Here, computers refer not only to tablet computers, notebook computers, and desktop computers, but also to large computers such as server systems. Alternatively, the semiconductor device described in the above embodiment is applied to removable memory devices such as memory cards (e.g., SD cards), USB memories, and solid state drives (SSD). FIGS. 17A to 17E schematically illustrate some structure examples of removable memory devices. For example, the semiconductor device described in the above embodiment is processed into a packaged memory chip and used in a variety of memory devices and removable memories.

Figure 17A:
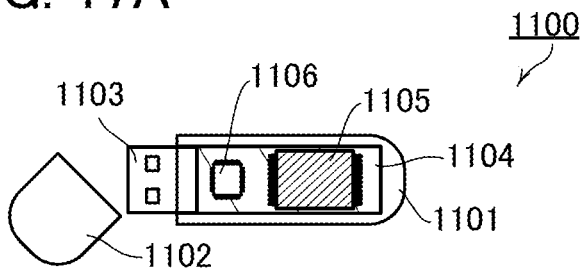
FIGS. 17A to 17E are schematic diagrams of memory devices of one embodiment of the present invention.

FIG. 17A is a schematic diagram of a USB memory. A USB memory 1100 includes a housing 1101, a cap 1102, a USB connector 1103, and a substrate 1104. The substrate 1104 is held in the housing 1101. A memory chip 1105 and a controller chip 1106 are attached to the substrate 1104, for example. The semiconductor device described in the above embodiment can be incorporated in the memory chip 1105 or the like.

Figure 17B:
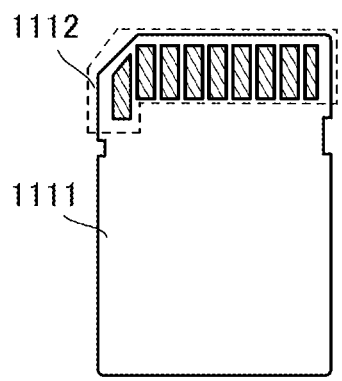
Figure 17C:
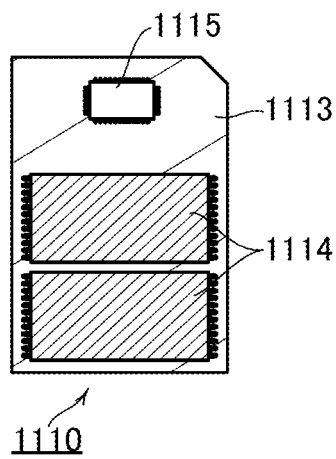

FIG. 17B is a schematic external diagram of an SD card, and FIG. 17C is a schematic diagram illustrating the internal structure of the SD card. An SD card 1110 includes a housing 1111, a connector 1112, and a substrate 1113. The substrate 1113 is held in the housing 1111. A memory chip 1114 and a controller chip 1115 are attached to the substrate 1113, for example. When the memory chip 1114 is also provided on the rear side of the substrate 1113, the capacity of the SD card 1110 can be increased. In addition, a wireless chip with a radio communication function may be provided on the substrate 1113, in which case data can be read from and written in the memory chip 1114 by radio communication between the host device and the SD card 1110. The semiconductor device described in the above embodiment can be incorporated in the memory chip 1114 or the like.

Figure 17D:
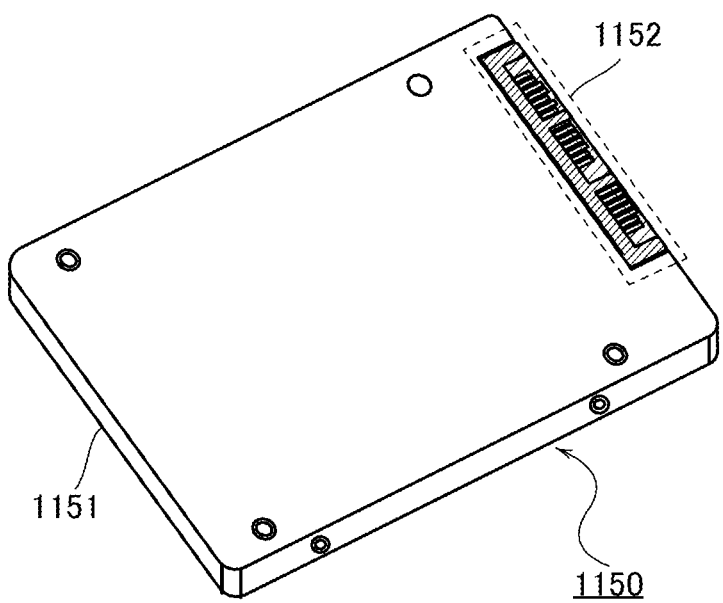
Figure 17E:
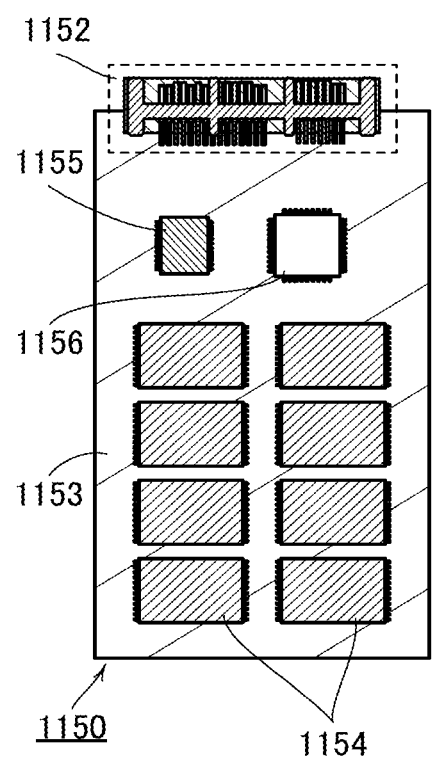

FIG. 17D is a schematic external diagram of an SSD, and FIG. 17E is a schematic diagram illustrating the internal structure of the SSD. An SSD 1150 includes a housing 1151, a connector 1152, and a substrate 1153. The substrate 1153 is held in the housing 1151. A memory chip 1154, a memory chip 1155, and a controller chip 1156 are attached to the substrate 1153, for example. The memory chip 1155 is a work memory for the controller chip 1156, and a DOSRAM chip can be used, for example. When the memory chip 1154 is also provided on the rear side of the substrate 1153, the capacity of the SSD 1150 can be increased. The semiconductor device described in the above embodiment can be incorporated in the memory chip 1154 or the like o.

This embodiment can be implemented in appropriate combination with any of the structures described in the other embodiments, examples, and the like.

Embodiment 6

The semiconductor device of one embodiment of the present invention can be used for processors (e.g., a CPU and a GPU) and chips. FIGS. 18A to 18H illustrate specific examples of electronic devices including a processor (e.g., a CPU or a GPU) or a chip of one embodiment of the present invention.
<Electronic Devices and Systems>
The GPU or the chip of one embodiment of the present invention can be mounted on a variety of electronic devices. Examples of electronic devices include electronic devices with relatively large screens (e.g., television devices, monitors for desktop or laptop information terminals and the like, digital signage, and large game machines such as pachinko machines), cameras such as digital cameras and digital video cameras, digital photo frames, e-book readers, mobile phones, portable game machines, portable information terminals, and audio reproducing devices. When the GPU or the chip of one embodiment of the present invention is provided in an electronic device, the electronic device can include artificial intelligence.

The electronic device of one embodiment of the present invention may include an antenna. With the antenna receiving signal, the electronic device can display an image, data, or the like on a display portion. When the electronic device includes an antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, chemical substance, sound, time, hardness, electric field, electric current, voltage, electric power, radiation, flow rate, humidity, gradient, oscillation, odor, or infrared rays).

Figure 18A:
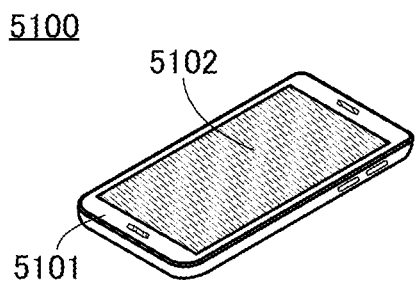
FIGS. 18A to 18H illustrate electronic devices of one embodiment of the present invention.

The electronic device of one embodiment of the present invention can have a variety of functions such as a function of displaying a variety of information (e.g., a still image, a moving image, and a text image) on the display portion, a touch panel function, a function of displaying a calendar, date, time, and the like, a function of executing a variety of software (programs), a wireless communication function, and a function of reading out a program or data stored in a recording medium. FIGS. 18A to 18H illustrate examples of electronic devices.
[Information Terminals]
FIG. 18A illustrates a mobile phone (smartphone), which is a type of an information terminal. The information terminal 5100 includes a housing 5101 and a display portion 5102. As input interfaces, a touch panel and a button are provided in the display portion 5102 and the housing 5101, respectively.

With the use of the chip of one embodiment of the present invention, the information terminal 5100 can execute an application utilizing artificial intelligence. Examples of the application utilizing artificial intelligence include an application for interpreting a conversation and displaying its content on the display portion 5102; an application for recognizing letters, figures, and the like input to the touch panel of the display portion 5102 by a user and displaying them on the display portion 5102; and an application for biometric authentication using fingerprints, voice prints, or the like.

Figure 18B:
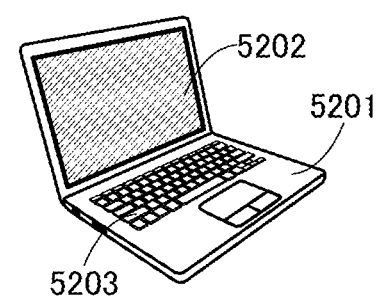

FIG. 18B illustrates a notebook information terminal 5200. The notebook information terminal 5200 includes a main body 5201 of the information terminal, a display portion 5202, and a keyboard 5203.

Like the information terminal 5100 described above, the notebook information terminal 5200 can execute an application utilizing artificial intelligence with the use of the chip of one embodiment of the present invention. Examples of the application utilizing artificial intelligence include design-support software, text correction software, and software for automatic menu generation. Moreover, novel artificial intelligence can be developed with the use of the notebook information terminal 5200.

Note that although FIGS. 18A and 18B illustrate a smartphone and a notebook information terminal as examples of electronic devices, one embodiment of the present invention can also be applied to an information terminal other than a smartphone and a notebook information terminal. Examples of information terminals other than a smartphone and a notebook information terminal include a personal digital assistant (PDA), a desktop information terminal, and a workstation.

[Game Machines]

Figure 18C:
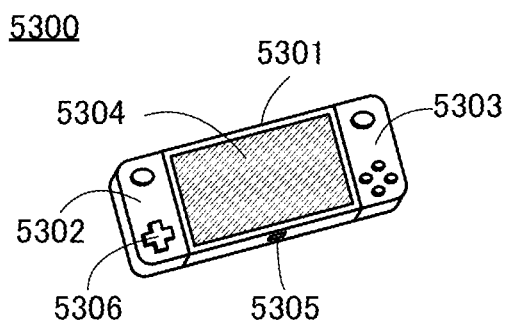

FIG. 18C illustrates a portable game machine 5300 as an example of a game machine. The portable game machine 5300 includes a housing 5301, a housing 5302, a housing 5303, a display portion 5304, a connection portion 5305, an operation key 5306, and the like. The housing 5302 and the housing 5303 can be detached from the housing 5301. When the connection portion 5305 provided in the housing 5301 is attached to another housing (not shown), an image to be output to the display portion 5304 can be output to a different display device (not shown). In that case, the housing 5302 and the housing 5303 can each function as an operating unit. In this manner, a plurality of players can perform a game at the same time. The chip described in the foregoing embodiment can be incorporated in a chip provided on a substrate in the housing 5301, the housing 5302, and the housing 5303, for example.

Figure 18D:
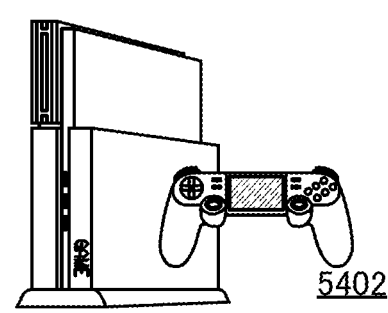

FIG. 18D illustrates a stationary game machine 5400 as another example of a game machine. A controller 5402 is wired or connected wirelessly to the stationary game machine 5400.

Using the GPU or the chip of one embodiment of the present invention in a game machine such as the portable game machine 5300 and the stationary game machine 5400 achieves a low-power-consumption game machine. Moreover, heat generation from a circuit can be reduced owing to low power consumption; thus, the influence of heat generation on the circuit, the peripheral circuit, and the module can be reduced.

Furthermore, when the GPU or the chip of one embodiment of the present invention is used in the portable game machine 5300, the portable game machine 5300 including artificial intelligence can be obtained.

In general, progress of a game, the actions and words of game characters, and expressions of a phenomenon in the game are programed in the game; however, the use of artificial intelligence in the portable game machine 5300 enables expressions not limited by the game program. For example, questions posed by the player, progress of the game, time, and actions and words of game characters can be changed for various expressions.

The artificial intelligence can construct a virtual game player; thus, a game that needs a plurality of players can be played with the portable game machine 5300 by only one human game player, with the use of a virtual game player constructed by the artificial intelligence as an opponent.

Although the portable game machine and the stationary game machine are shown as examples of game machines in FIGS. 18C and 18D, a game machine using the GPU or the chip of one embodiment of the present invention is not limited thereto. Other examples of game machines in which the GPU or the chip of one embodiment of the present invention is usable include an arcade game machine installed in an entertainment facility (e.g., a game center and an amusement park) and a throwing machine for batting practice installed in sports facilities.

[Large Computer]

The GPU or the chip of one embodiment of the present invention can be used in a large computer.

Figure 18E:
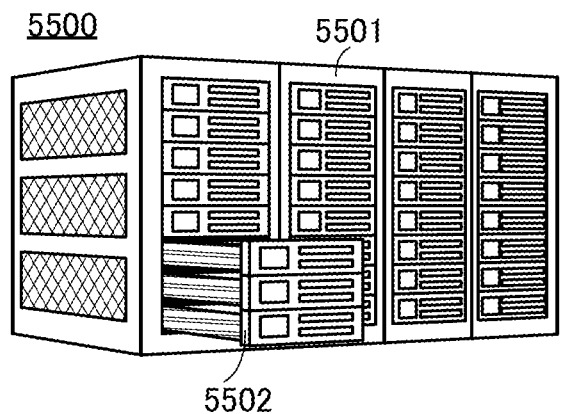
Figure 18F:
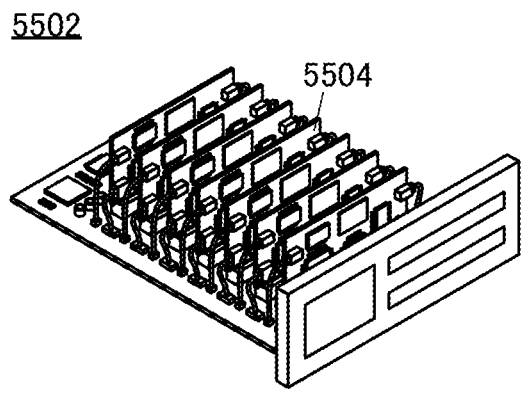

FIG. 18E illustrates a supercomputer 5500 as an example of a large computer. FIG. 18F illustrates a rack-mount computer 5502 included in the supercomputer 5500.

The supercomputer 5500 includes a rack 5501 and a plurality of rack-mount computers 5502. The plurality of computers 5502 are stored in the rack 5501. The computer 5502 includes a plurality of substrates 5504 on which the GPU or the chip shown in the above embodiment can be mounted.

The supercomputer 5500 is a large computer mainly used for scientific computation. In scientific computation, an enormous amount of arithmetic operation needs to be processed at a high speed; hence, power consumption is large and chips generate a large amount of heat. Using the GPU or the chip of one embodiment of the present invention in the supercomputer 5500 achieves a low-power-consumption supercomputer. Furthermore, heat generation from a circuit can be reduced owing to low power consumption; thus, the influence of heat generation on the circuit, the peripheral circuit, and the module can be reduced.

Although a supercomputer is shown as an example of a large computer in FIGS. 18E and 18F, a large computer using the GPU or the chip of one embodiment of the present invention is not limited thereto. Other examples of large computers in which the GPU or the chip of one embodiment of the present invention is usable include a computer that provides service (a server) and a large general-purpose computer (a mainframe).

[Moving Vehicle]

The GPU or the chip of one embodiment of the present invention can be used in an automobile, which is a moving vehicle, and around the driver's seat of the automobile.

Figure 18G:
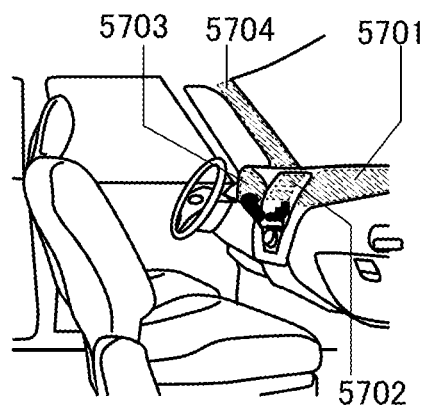

FIG. 18G illustrates an area around a windshield inside an automobile, which is an example of a moving vehicle. FIG. 18G shows a display panel 5701, a display panel 5702, and a display panel 5703 that are attached to a dashboard and a display panel 5704 that is attached to a pillar.

The display panels 5701 to 5703 can provide various kinds of information by displaying a speedometer, a tachometer, a mileage, a fuel meter, a gearshift indicator, air-conditioning settings, and the like. Items displayed on the display panel, their layout, and the like can be changed as appropriate to suit the user's preferences, resulting in more sophisticated design. The display panels 5701 to 5703 can also be used as lighting devices.

The display panel 5704 can compensate for the view obstructed by the pillar (blind areas) by displaying an image taken by an imaging device (not illustrated) provided on the exterior of the automobile. That is, displaying an image taken by the imaging device provided on the exterior of the automobile eliminates blind areas and enhances safety. Moreover, displaying an image to compensate for the area that a driver cannot see makes it possible for the driver to confirm safety more easily and comfortably. The display panel 5704 can also be used as a lighting device.

Since the GPU or the chip of one embodiment of the present invention can be used as a component of artificial intelligence, the chip can be used for an automatic driving system of the automobile, for example. The chip can also be used for a system for navigation, risk prediction, or the like. The display panels 5701 to 5704 may display information regarding navigation information, risk prediction, and the like.

Although an automobile is described above as an example of a moving vehicle, moving vehicles are not limited to an automobile. Examples of moving vehicles include a train, a monorail train, a ship, and a flying object (a helicopter, an unmanned aircraft (a drone), an airplane, and a rocket), and these moving vehicles can include a system utilizing artificial intelligence when equipped with the chip of one embodiment of the present invention.

[Household Appliance]

Figure 18H:
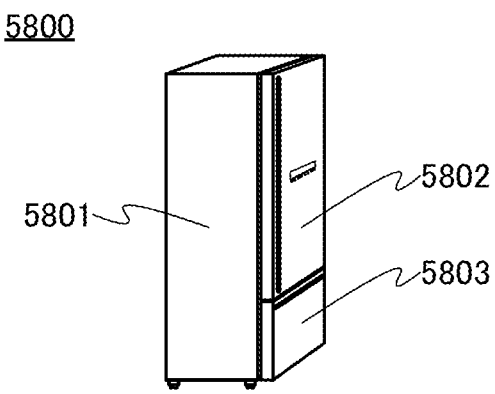

FIG. 18H illustrates an electric refrigerator-freezer 5800 as an example of a household appliance. The electric refrigerator-freezer 5800 includes a housing 5801, a refrigerator door 5802, a freezer door 5803, and the like.

When the chip of one embodiment of the present invention is used in the electric refrigerator-freezer 5800, the electric refrigerator-freezer 5800 including artificial intelligence can be obtained. Utilizing the artificial intelligence enables the electric refrigerator-freezer 5800 to have a function of automatically making a menu on the basis of food stored in the electric refrigerator-freezer 5800 and food expiration dates, for example, a function of controlling the temperature to be appropriate for the food stored in the electric refrigerator-freezer 5800, and the like.

Although the electric refrigerator-freezer is described here as an example of a household appliance, other examples of household appliances include a vacuum cleaner, a microwave oven, an electric oven, a rice cooker, a water heater, an IH cooker, a water server, a heating-cooling combination appliance such as an air conditioner, a washing machine, a drying machine, and an audio visual appliance.

The electronic device and its functions, an application example of the artificial intelligence and its effects, and the like described in this embodiment can be combined as appropriate with the description of another electronic device.

This embodiment can be implemented in appropriate combination with any of the structures described in the other embodiments, examples, and the like.

EXAMPLE 1

In this example, the ease of diffusion of hydrogen and oxygen from a metal oxide to TaNxOy in a stacked-layer structure of the metal oxide and TaNxOy was evaluated.

Specifically, SIMS analysis was performed on samples that included a TaNxOy film over a metal oxide film and were subjected to heat treatment (Samples 1A to 4A and Samples 1B to 4B).

A method for manufacturing Samples 1A to 4A is described below.

A surface of a substrate containing silicon was subjected to heat treatment in a hydrogen chloride (HCl) atmosphere, and a 100-nm-thick silicon oxide film was formed over the substrate. Next, a 50-nm-thick metal oxide film was formed over the silicon oxide film by a sputtering method. The deposition conditions for the metal oxide film were as follows: an In—Ga—Zn oxide target having an atomic ratio of In:Ga:Zn=4:2:4.1 was used; a 30-sccm argon gas with a deuterium ($D_2$) content of 5% and a 15-sccm oxygen gas were used as deposition gases; the deposition pressure was 0.4 Pa; the deposition power was 200 W; and the substrate temperature was room temperature (R.T.). Thus, a metal oxide film containing deuterium (D) was formed.

Next, a 100-nm-thick TaNxOy film was formed over the metal oxide film by a sputtering method. The deposition conditions for the TaNxOy film were as follows: a tantalum target was used; an argon gas at 50 sccm and a nitrogen gas at 10 sccm were used as deposition gases; the deposition pressure was 0.6 Pa; the deposition power was 1 kW; the substrate temperature was room temperature (R.T.); and the distance between the target and the substrate was 60 mm.

Subsequently, heat treatment was performed. Note that the temperature of the heat treatment varied between Samples 1A to 4A. Specifically, Sample 1A was not subjected to heat treatment. Sample 2A was subjected to heat treatment at 300° C. in a nitrogen atmosphere for one hour. Sample 3A was subjected to heat treatment at 350° C. in a nitrogen atmosphere for one hour. Sample 4A was subjected to heat treatment at 400° C. in a nitrogen atmosphere for one hour.

Through the above steps, Samples 1A to 4A were fabricated.

Next, a method for manufacturing Samples 1B to 4B is described.

A surface of a substrate containing silicon was subjected to heat treatment in a hydrogen chloride (HCl) atmosphere, and a 100-nm-thick silicon oxide film was formed over the substrate. Next, a 300-nm-thick silicon oxynitride film was formed over the silicon oxide film by a CVD method. The deposition conditions for the silicon oxynitride film were as follows: a silane ($SiH_4$) gas at 2.3 sccm and a nitrous oxide ($N_2O$) gas at 800 sccm were used as deposition gases; the deposition pressure was 40 Pa; the deposition power was 50 W (27.12 MHz); the substrate temperature was 400° C.; and the distance between the electrodes was 15 mm.

Next, an oxygen ion ($^{16}O^+$) was implanted into the silicon oxynitride film by an ion implantation method. The conditions for the oxygen ion implantation were as follows: the acceleration voltage was 60 key; the dosage was $2.0 \times 10^{16}$ ions/cm$^2$; the tilt angle was 0°; and the twist angle was 0°.

Then, a 20-nm-thick metal oxide film was formed over the silicon oxynitride film by a sputtering method. The deposition conditions for the metal oxide film were as follows: an In—Ga—Zn oxide target having an atomic ratio of In:Ga:Zn=4:2:4.1 was used; an oxygen ($^{18}O_2$) gas at 45 sccm was used as the deposition gas; the deposition pressure was 0.7 Pa; the deposition power was 500 W; the substrate temperature was 200° C.; and the distance between the target and the substrate was 60 mm. Thus, a metal oxide film containing $^{18}O$ was formed.

Next, first heat treatment was performed. The first heat treatment was performed in such a manner that treatment was performed at 400° C. in a nitrogen atmosphere for one hour and then another treatment was successively performed at 400° C. in an oxygen atmosphere for one hour.

Then, a 50-nm-thick TaNxOy film was formed over the metal oxide film by a sputtering method. The deposition conditions for the TaNxOy film were as follows: a tantalum target was used; an argon gas at 50 sccm and a nitrogen gas at 10 sccm were used as deposition gases; the deposition pressure was 0.6 Pa; the deposition power was 1 kW; the substrate temperature was room temperature (R.T.); and the distance between the target and the substrate was 60 mm.

Subsequently, second heat treatment was performed. Note that the temperature of the second heat treatment varied between Samples 1B to 4B. Specifically, Sample 1B was not subjected to the second heat treatment. Sample 2B was subjected to heat treatment at 300° C. in a nitrogen atmosphere for one hour. Sample 3B was subjected to heat treatment at 350° C. in a nitrogen atmosphere for one hour. Sample 4B was subjected to heat treatment at 400° C. in a nitrogen atmosphere for one hour.

Through the above steps, Samples 1B to 4B were fabricated.

The deuterium (D) concentration in TaNxOy of Samples 1A to 4A was evaluated by a SIMS analysis apparatus; SIMS analysis was performed on the surface of each sample. In addition, the oxygen ($^{18}O$) concentration in TaNxOy of Samples 1B to 4B was evaluated by a SIMS analysis apparatus; SIMS analysis was performed on the surface of each sample.

Figure 19A:
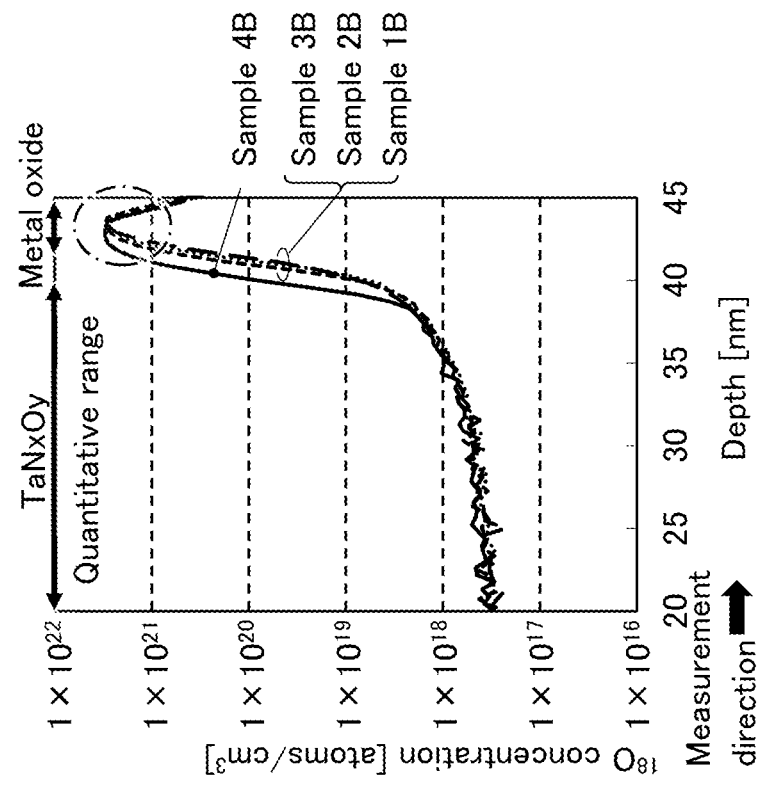
FIGS. 19A and 19B show profiles of the deuterium (D) concentration and the oxygen ($^{18}O$) concentration, respectively, of TaNxOy in Example.
Figure 19B:
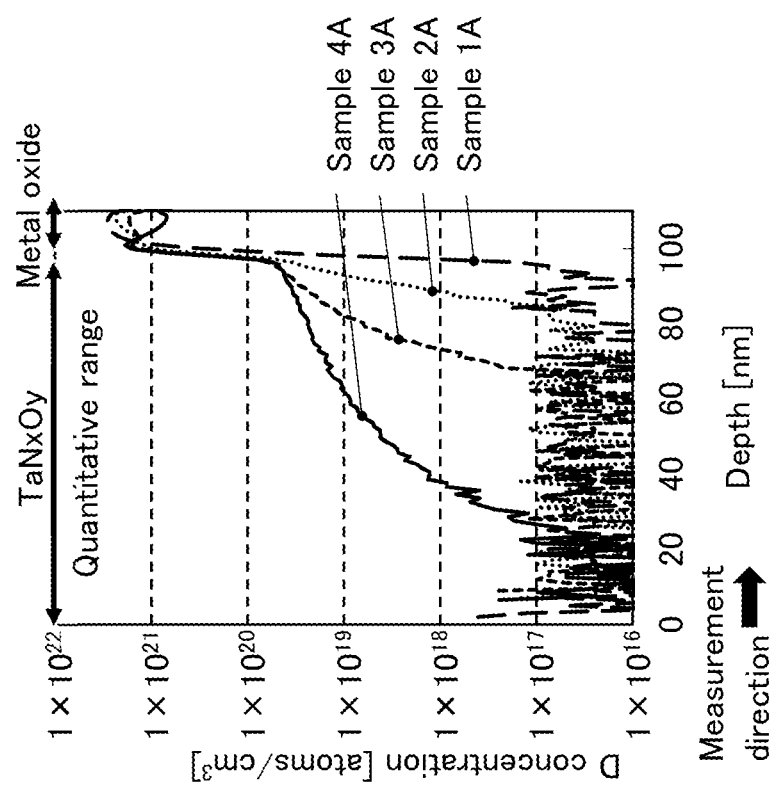

FIGS. 19A and 19B show profiles of the deuterium (D) concentration and the oxygen ($^{18}$O) concentration, respectively, in TaNxOy of each sample, which were obtained by SIMS analysis.

FIG. 19A shows the profiles of the deuterium (D) concentration in the TaNxOy films of Samples 1A to 4A. In FIG. 19A, the horizontal axis represents a depth [nm] in the direction perpendicular to the film surface of the sample, and the vertical axis represents the deuterium (D) concentration [atoms/cm$^3$] in TaNxOy. In FIG. 19A, a long dashed line shows the profile of the deuterium (D) concentration in the TaNxOy film of Sample 1A; a dotted line shows that of Sample 2A; a short dashed line shows that of Sample 3A; and a solid line shows that of Sample 4A.

According to FIG. 19A, the diffusion (length) of deuterium (D) from the metal oxide film to the TaNxOy film was the largest in Sample 4A, followed by Sample 3A and Sample 2A. In particular, in Sample 4A, deuterium (D) in the metal oxide film diffused into the TaNxOy film within a range of approximately several tens of nanometers. These results reveal that as the temperature of the heat treatment became higher, a larger amount of deuterium (D) diffused into the TaNxOy film. That is, hydrogen in the metal oxide is likely to diffuse into TaNxOy.

FIG. 19B shows the profiles of the oxygen ($^{18}$O) concentration in the TaNxOy films of Samples 1B to 4B. In FIG. 19B, the horizontal axis represents a depth [nm] in the direction perpendicular to the film surface of the sample, and the vertical axis represents the oxygen ($^{18}$O) concentration [atoms/cm$^3$] in TaNxOy. In FIG. 19B, a long dashed line shows the profile of the oxygen ($^{18}$O) concentration in the TaNxOy film of Sample 1B; a dotted line shows that of Sample 2B; a short dashed line shows that of Sample 3B; and a solid line shows that of Sample 4B. In a region (depth) surrounded by a dashed-dotted line in FIG. 19B, the amount of detected $^{18}$O is saturated.

According to FIG. 19B, in Sample 4B, oxygen ($^{18}$O) in the metal oxide film was diffused into the TaNxOy film within a range of approximately several nanometers by the second heat treatment, in comparison with Sample 1B. In Sample 2B and Sample 3B, not much oxygen ($^{18}$O) in the metal oxide film was diffused into the TaNxOy film by the second heat treatment, in comparison with Sample 1B. The profiles of the oxygen ($^{18}$O) concentration in the TaNxOy film were substantially the same among Samples 1B to 3B.

The above results demonstrate that, when heat treatment at low temperatures (e.g., 350° C. or lower) is performed on the stacked-layer structure including a metal oxide and TaNxOy, hydrogen in the metal oxide diffuses into TaNxOy, oxygen in the metal oxide is less likely to diffuse into TaNxOy, and oxidation of TaNxOy or formation of a layer between the metal oxide and TaNxOy is less likely to progress. Furthermore, when heat treatment is performed at high temperatures (e.g., 400° C. or higher), it is probable that hydrogen in the metal oxide first diffuses into TaNxOy and then oxygen in the metal oxide diffuses into TaNxOy, and oxidation of TaNxOy or formation of a layer between the metal oxide and TaNxOy progresses.

At least part of the structure, method, and the like described in this example can be implemented in appropriate combination with any of the embodiments and the other example in this specification.

EXAMPLE 2

In this example, the ease of diffusion of hydrogen from a metal oxide to TaNxOy in a stacked-layer structure of the metal oxide and TaNxOy was evaluated. Specifically, SIMS analysis was performed on samples that included a TaNxOy film over a metal oxide film (Samples 1C to 5C) and samples that included a TaNxOy film over a metal oxide film and were subjected to heat treatment (Samples 1D to 5D).

A method for manufacturing Samples 1C to 5C is described below.

A surface of a substrate containing silicon was subjected to heat treatment in a hydrogen chloride (HCl) atmosphere, and a 100-nm-thick silicon oxide film was formed over the substrate. Next, a 50-nm-thick metal oxide film was formed over the silicon oxide film by a sputtering method. The deposition conditions for the metal oxide film were as follows: an In—Ga—Zn oxide target having an atomic ratio of In:Ga:Zn=4:2:4.1 was used; a 30-sccm argon gas with a deuterium (D$_2$) content of 5% and a 15-sccm oxygen gas were used as deposition gases; the deposition pressure was 0.4 Pa; the deposition power was 200 W; and the substrate temperature was room temperature (R.T.). Thus, a metal oxide film containing deuterium (D) was formed.

Next, a 100-nm-thick TaNxOy film was formed over the metal oxide film by a sputtering method. The deposition conditions for the TaNxOy film were as follows: a tantalum target was used; the deposition pressure was 0.6 Pa; the deposition power was 1 kW; the substrate temperature was room temperature (R.T.); and the distance between the target and the substrate was 60 mm.

The flow rates of deposition gases used to deposit the TaNxOy film were different between Samples 1C to 5C. Specifically, for Sample 1C, an argon gas at 55 sccm and a nitrogen gas at 5 sccm were used. For Sample 2C, an argon gas at 50 sccm and a nitrogen gas at 10 sccm were used. For Sample 3C, an argon gas at 40 sccm and a nitrogen gas at 20 sccm were used. For Sample 4C, an argon gas at 30 sccm and a nitrogen gas at 30 sccm were used. For Sample 5C, an argon gas at 10 sccm and a nitrogen gas at 50 sccm were used.

Through the above steps, Samples 1C to 5C were fabricated.

The higher the flow rate ratio of the nitrogen gas in the deposition gases is, the higher the atomic ratio of nitrogen to tantalum in the TaNxOy film is. Accordingly, the atomic ratio of nitrogen to tantalum in the TaNxOy film is the highest in Sample 5C, followed by Sample 4C, Sample 3C, Sample 2C, and Sample 1C.

A method for manufacturing Samples 1D to 5D is described below. Note that the steps up to and including the step of forming the TaNxOy film in the method for manufacturing Samples 1D to 5D are the same as those in the method for manufacturing Samples 1C to 5C.

After the formation of the TaNxOy film, heat treatment was performed at 400° C. in a nitrogen atmosphere for one hour. Sample 1D had the same structure as Sample 1C and was subjected to the heat treatment. Sample 2D had the same structure as Sample 2C and was subjected to the heat treatment. Sample 3D had the same structure as Sample 3C and was subjected to the heat treatment. Sample 4D had the same structure as Sample 4C and was subjected to the heat treatment. Sample 5D had the same structure as Sample 5C and was subjected to the heat treatment.

Through the above steps, Samples 1D to 5D were fabricated.

The atomic ratio of nitrogen to tantalum in the TaNxOy film is the highest in Sample 5D, followed by Sample 4D, Sample 3D, Sample 2D, and Sample 1D.

The deuterium (D) concentration in TaNxOy of Samples 1C to 5C and Samples 1D to 5D was evaluated by a SIMS analysis apparatus. SIMS analysis was performed on the surface of each sample.

Figure 20A:
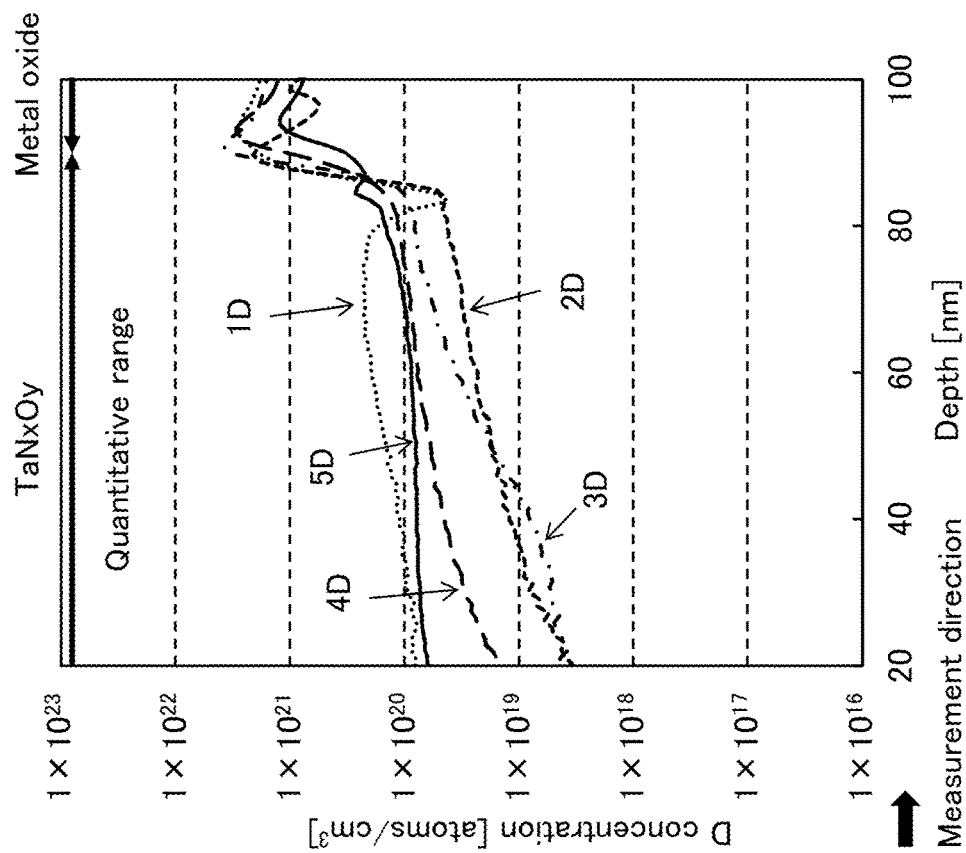
FIGS. 20A and 20B show profiles of the deuterium (D) concentration of TaNxOy in Example.
Figure 20B:
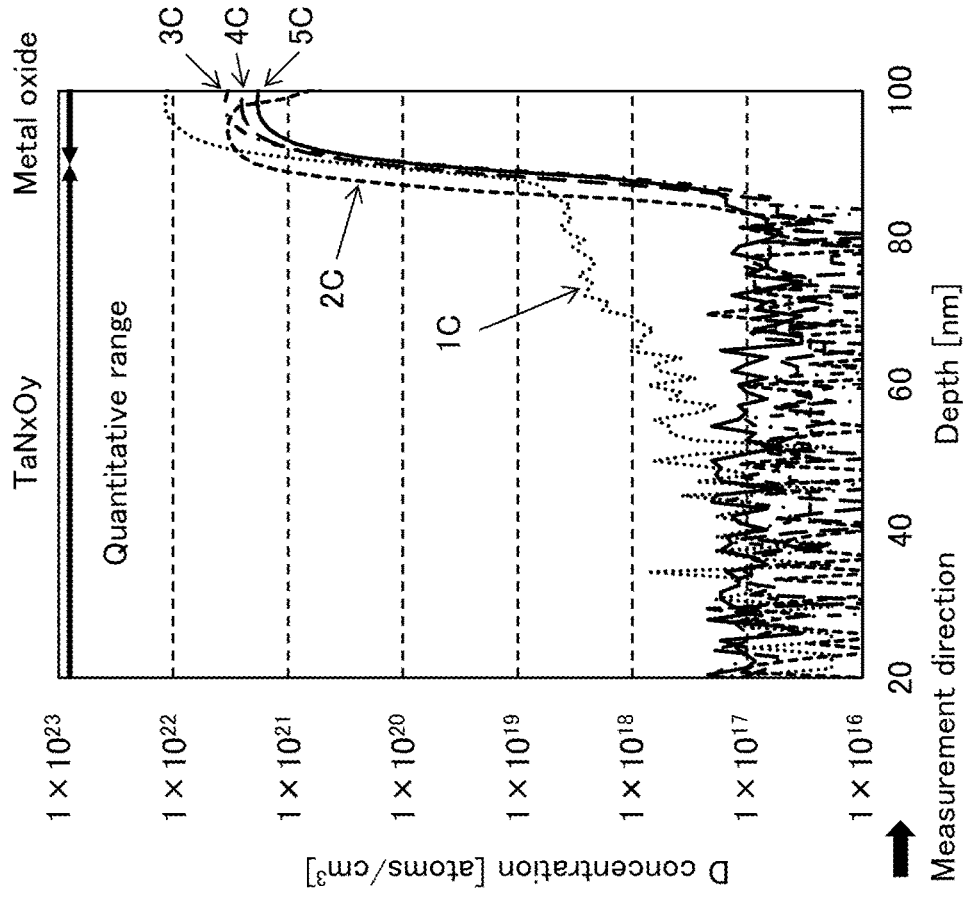

FIGS. 20A and 20B show profiles of the deuterium (D) concentration in TaNxOy of each sample, which were obtained by SIMS analysis.

FIGS. 20A and 20B show the profiles of the deuterium (D) concentration in the TaNxOy films of Samples 1C to 5C and Samples 1D to 5D. In FIGS. 20A and 20B, the horizontal axis represents a depth [nm] in the direction perpendicular to the film surface of the sample, given that the level of the surface of the sample is 0 nm, and the vertical axis represents the deuterium (D) concentration [atoms/cm$^3$] in TaNxOy.

In FIG. 20A, a dotted line shows the profile of the deuterium (D) concentration in the TaNxOy film of Sample 1C; a short dashed line shows that of Sample 2C; a dashed-dotted line shows that of Sample 3C; a long dashed line shows that of Sample 4C; and a solid line shows that of Sample 5C.

According to FIG. 20A, in Sample 1C, part of deuterium (D) in the metal oxide film entered the TaNxOy film. In Sample 1C, part of deuterium (D) in the metal oxide film was probably taken in the TaNxOy film at the time of forming the TaNxOy film. In Samples 2C to 5C, not much deuterium (D) in the metal oxide film entered the TaNxOy film; hence, the profiles of the deuterium (D) concentration in the TaNxOy film were substantially the same among Samples 2C to 5C.

In FIG. 20B, a dotted line shows the profile of the deuterium (D) concentration in the TaNxOy film of Sample 1D; a short dashed line shows that of Sample 2D; a dashed-dotted line shows that of Sample 3D; a long dashed line shows that of Sample 4D; and a solid line shows that of Sample 5D.

FIGS. 20A and 20B reveal that deuterium (D) in the metal oxide film was diffused into the TaNxOy film by heat treatment. That is, hydrogen in the metal oxide is likely to diffuse into TaNxOy.

At least part of the structure, method, and the like described in this example can be implemented in appropriate combination with any of the embodiments and the other example in this specification.

This application is based on Japanese Patent Application Serial No. 2018-163324 filed with Japan Patent Office on Aug. 31, 2018, and Japanese Patent Application Serial No. 2018-176181 filed with Japan Patent Office on Sep. 20, 2018, the entire contents of which are hereby incorporated by reference.

What is claimed is:

1. A semiconductor device comprising:
a first oxide;
a second oxide, a first layer, and a second layer over the first oxide;
an insulator over the second oxide;
a first conductor over the insulator;
a second conductor over the first layer; and
a third conductor over the second layer,
wherein each of the first layer and the second layer comprises a region with a thickness greater than or equal to 0.5 nm and less than or equal to 3 nm,
wherein each of the second conductor and the third conductor comprises a conductive material capable of extracting hydrogen,
wherein a part of the first layer is sandwiched between a first side surface of the second oxide and the second conductor, and
wherein a part of the second layer is sandwiched between a second side surface of the second oxide and the third conductor.

2. The semiconductor device according to claim 1,
wherein the first oxide comprises indium, an element M, and zinc, where the element M is one of aluminum, gallium, yttrium, and tin,
wherein each of the second conductor and the third conductor comprises tantalum and nitrogen, and
wherein each of the first layer and the second layer comprises tantalum and oxygen.

3. A semiconductor device comprising:
a first oxide;
a second oxide, a third oxide, and a fourth oxide over the first oxide;
a first insulator over the second oxide;
a first conductor over the first insulator;
a second conductor over the third oxide;
a third conductor over the fourth oxide; and
a second insulator over the second conductor and the third conductor,
wherein each of the second conductor and the third conductor comprises a conductive material resistant to oxidation and capable of extracting hydrogen, and
wherein the second insulator is in contact with a top surface and a side surface of the second conductor, a top surface and a side surface of the third conductor, a side surface of the third oxide, a side surface of the fourth oxide, and a side surface of the first oxide.

4. The semiconductor device according to claim 3,
wherein each of the first oxide, the third oxide, and the fourth oxide comprises indium, an element M, and zinc, where the element M is one of aluminum, gallium, yttrium, and tin,
wherein an atomic ratio of the element M to indium in the third oxide is higher than an atomic ratio of the element M to indium in the first oxide,
wherein an atomic ratio of the element M to indium in the fourth oxide is higher than the atomic ratio of the element M to indium in the first oxide, and
wherein each of the third oxide and the fourth oxide comprises a region with a thickness greater than or equal to 1 nm and less than or equal to 2 nm.

5. The semiconductor device according to claim 3, wherein each of the second conductor and the third conductor comprises tantalum and nitrogen.

* * * * *